United States Patent
Narasimha et al.

(10) Patent No.: US 9,582,417 B2
(45) Date of Patent: Feb. 28, 2017

(54) MEMORY APPARATUS AND METHODS THEREOF FOR PREVENTING READ ERRORS ON WEAK PAGES IN A NON-VOLATILE MEMORY SYSTEM

(71) Applicant: Virident Systems, LLC, San Jose, CA (US)

(72) Inventors: Ashwin Narasimha, Sunnyvale, CA (US); Vibhor Patel, Bangalore (IN); Sandeep Sharma, Jammu (IN); Ajith Kumar, Bangalore (IN)

(73) Assignee: Virident Systems, LLC, San Jose, CA (US)

( * ) Notice: Subject to any disclaimer, the term of this patent is extended or adjusted under 35 U.S.C. 154(b) by 501 days.

(21) Appl. No.: 14/177,216

(22) Filed: Feb. 10, 2014

(65) Prior Publication Data

US 2014/0304456 A1    Oct. 9, 2014

Related U.S. Application Data

(60) Continuation-in-part of application No. 13/163,461, filed on Jun. 17, 2011, now Pat. No. 8,677,037, which is a continuation-in-part of application No. 12/369,725, filed on Feb. 11, 2009, now Pat. No. 8,806,116, and a continuation-in-part of application No. 12/831,233, filed on Jul. 6, 2010, now Pat. No. 8,370,547, which is a division of application No. 11/847,986, filed on Aug. 30, 2007, now Pat. No. 7,761,623, which is a division of application No. 12/831,233, filed on Jun. 17, 2011.

(60) Provisional application No. 61/356,651, filed on Jun. 20, 2010, provisional application No. 61/356,640, (Continued)

(51) Int. Cl.
| | |
|---|---|
| *G06F 11/00* | (2006.01) |
| *G06F 12/02* | (2006.01) |
| *G11C 16/26* | (2006.01) |
| *G06F 13/16* | (2006.01) |
| *G06F 11/07* | (2006.01) |

(52) U.S. Cl.
CPC ...... *G06F 12/0246* (2013.01); *G06F 13/1657* (2013.01); *G06F 13/1694* (2013.01); *G11C 16/26* (2013.01); *G06F 11/076* (2013.01); *G06F 2212/7201* (2013.01); *Y02B 60/1225* (2013.01); *Y02B 60/1228* (2013.01)

(58) Field of Classification Search
CPC ................ G06F 11/076; G06F 2212/7201
See application file for complete search history.

(56) References Cited

U.S. PATENT DOCUMENTS

| | | | | |
|---|---|---|---|---|
| 2004/0202034 A1* | 10/2004 | Lee | ........ | G06F 11/1068 365/202 |
| 2005/0146959 A1* | 7/2005 | Shiga | ........ | G06F 11/1068 365/205 |

* cited by examiner

*Primary Examiner* — Zachary K Huson
(74) *Attorney, Agent, or Firm* — Alford Law Group, Inc.; Tobi C. Clinton

(57) ABSTRACT

A memory apparatus and methods are provided for preventing read errors on weak pages in a non-volatile memory system. In one example, a method includes identifying a weak page in a non-volatile memory device along a word line, wherein the weak page is partially written with at least some data; buffering data associated with the weak page to a weak page buffer that is coupled in communication with the non-volatile memory device; determining that an amount of data in the weak page buffer has reached a predetermined data level; and writing the data from the weak page buffer into the weak page along the word line in the non-volatile memory device.

25 Claims, 29 Drawing Sheets

Related U.S. Application Data filed on Jun. 20, 2010, provisional application No. 61/356,406, filed on Jun. 18, 2010.

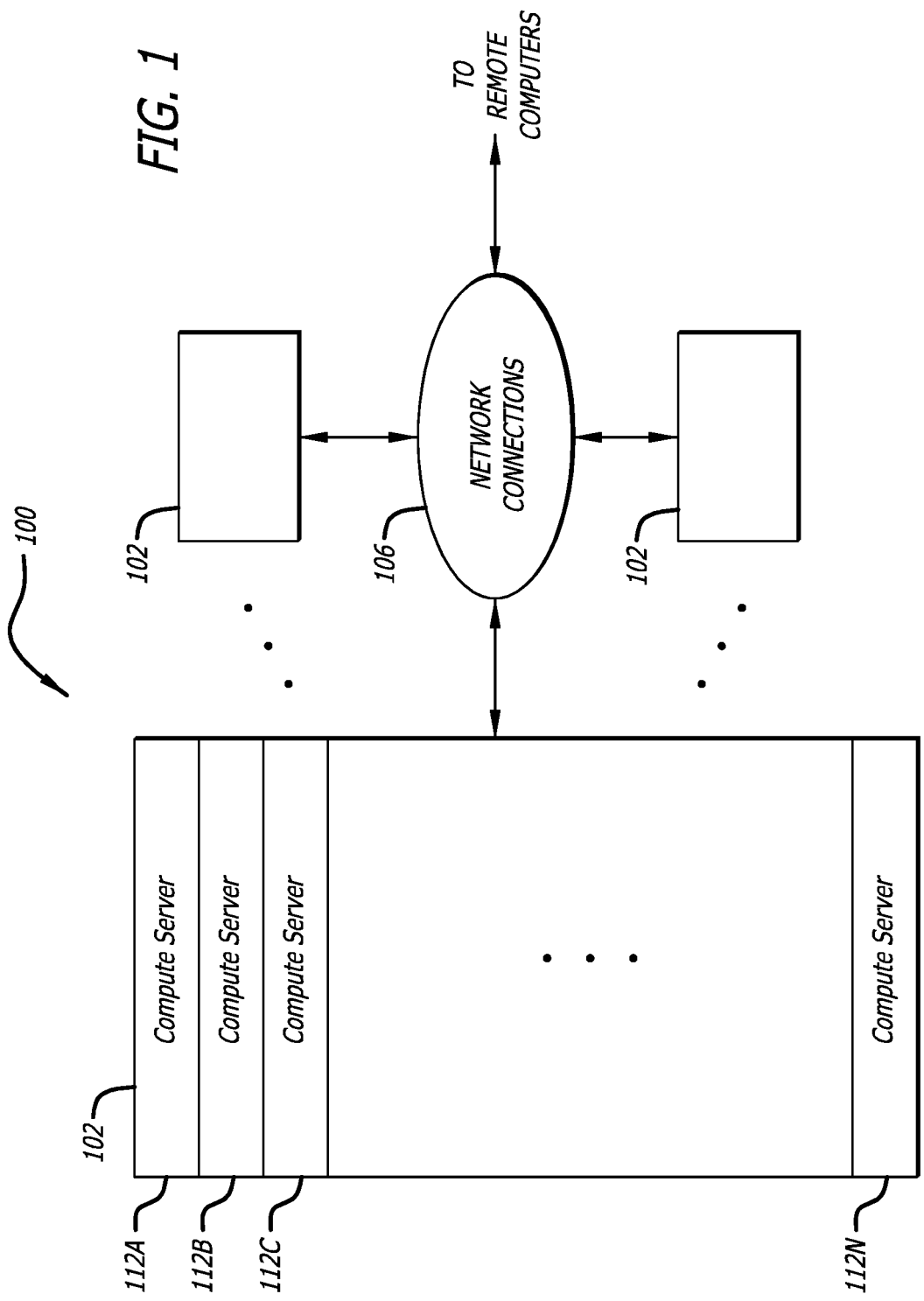

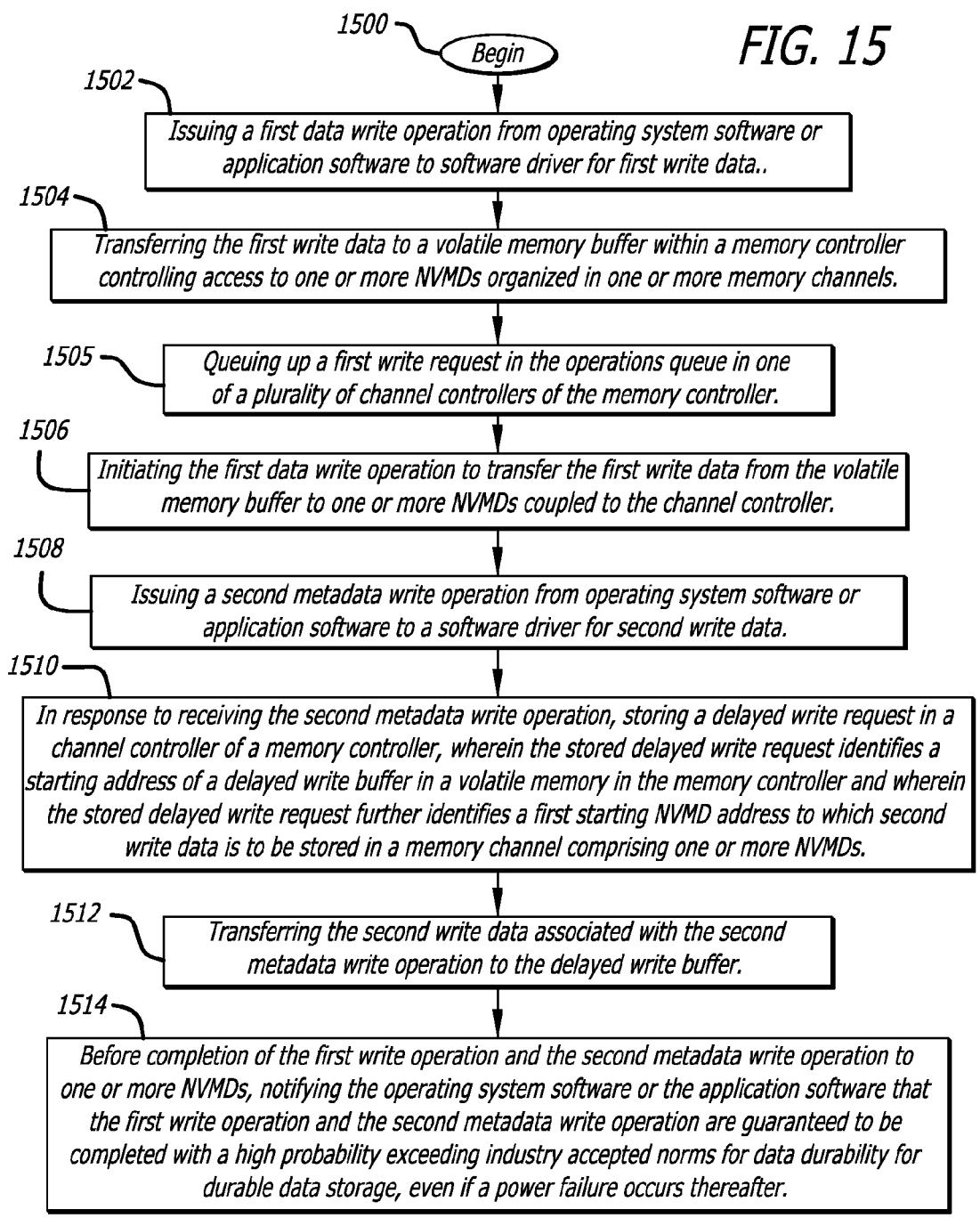
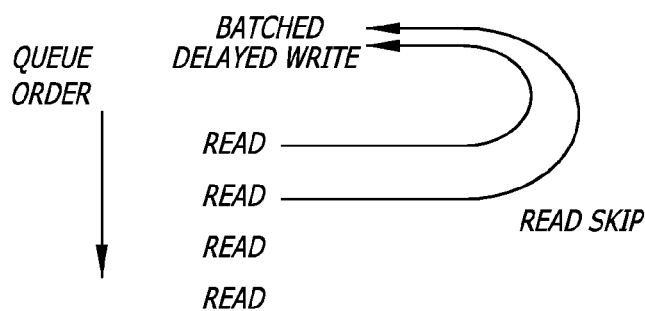

MEMORY APPARATUS AND METHODS THEREOF FOR PREVENTING READ ERRORS ON WEAK PAGES IN A NON-VOLATILE MEMORY SYSTEM

CROSS-REFERENCE TO RELATED APPLICATIONS

This United States (U.S.) patent application a continuation in part claiming the benefit of U.S. patent application Ser. No. 13/163,461 entitled MEMORY APPARATUS FOR EARLY WRITE TERMINATION AND POWER FAILURE filed on Jun. 17, 2010 by inventors Vijay Karamcheti et al.

U.S. patent application Ser. No. 13/163,461 claims the benefit of U.S. Patent Application No. 61/356,640 entitled MEMORY APPARATUS AND METHODS THEREOF FOR EARLY WRITE TERMINATION AND POWER FAILURE filed on Jun. 20, 2010 by inventors Vijay Karamcheti et al., U.S. Patent Application No. 61/356,406 entitled METHODS AND MEMORY APPARATUS FOR REPLACEABLE NON-VOLATILE MEMORY filed on Jun. 18, 2010 by inventors Ruban Kanapathippillai et al., and U.S. Patent Application No. 61/356,651 entitled SUSTAINED READ AND WRITE PERFORMANCE FOR NON-VOLATILE MEMORY filed on Jun. 20, 2010 by inventors Vijay Karamcheti et al.; U.S. patent application Ser. No. 13/163,461 is a continuation in part claiming the benefit of U.S. patent application Ser. No. 12/831,233 entitled SYSTEM AND APPARATUS WITH A MEMORY CONTROLLER CONFIGURED TO CONTROL ACCESS TO RANDOMLY ACCESSIBLE NON-VOLATILE MEMORY filed on Jul. 6, 2010 by inventors Vijay Karamcheti et al., and is a continuation in part claiming the benefit of U.S. patent application Ser. No. 12/369,725 entitled METHODS AND APPARATUS FOR TWO-DIMENSIONAL MAIN MEMORY filed on Feb. 11, 2009 by inventors Vijay Karamcheti et al., all of which are incorporated herein by reference in their entirety.

U.S. patent application Ser. No. 12/831,233 is a divisional of U.S. patent application Ser. No. 11/847,986 entitled MAIN MEMORY IN A SYSTEM WITH A MEMORY CONTROLLER CONFIGURED TO CONTROL ACCESS TO NON-VOLATILE MEMORY, AND RELATED TECHNOLOGIES filed on Aug. 30, 2007 by inventors Vijay Karamcheti et al., now issued as U.S. Pat. No. 7,761,623.

FIELD

The embodiments of the invention relate generally to programming data into and reading data from non-volatile memory in a non-volatile memory system.

BACKGROUND

A non-volatile memory device (e.g., flash memory integrated circuit device or chip) is organized as sets of read-writable pages along a plurality of word lines. Each page in a non-volatile memory device includes a plurality of electrically erasable programmable read only memory cells, also referred to as read-writeable non-volatile memory. There are multiple read-writeable pages of non-volatile memory grouped into each word line of a non-volatile memory device.

After pages along a word line have been erased or initialized, blocks of data may be written or programmed into pages along each word line. However, not every page may be written or programmed along each a line. A word line is referred to being partially written if only a subset of all the pages in the word line have been programmed or written to with data.

Reliability is important in a non-volatile memory device. Important user data is often written into non-volatile memory devices. Users have expectations that data previously written into a non-volatile memory device can be reliably read out, even after a planned or unplanned loss of power.

If something causes a non-volatile memory device to become unreliable, it is desirable to provide a system, method, and apparatus to improve reliability in the non-volatile memory device.

BRIEF SUMMARY

Aspects of embodiments of the invention are summarized by the claims that follow below. The embodiments of the invention generally prevent read errors of data in weak pages in a non-volatile memory system.

BRIEF DESCRIPTIONS OF THE DRAWINGS

FIG. 1 is a block diagram of a server center.

FIG. 15 is a flow chart illustrating a process of writing data into non-volatile memory of an expansion memory card.

FIG. 16 is a diagram illustrating an order in a queue/scheduler with a delayed write operation.

DETAILED DESCRIPTION

Figure 2A:
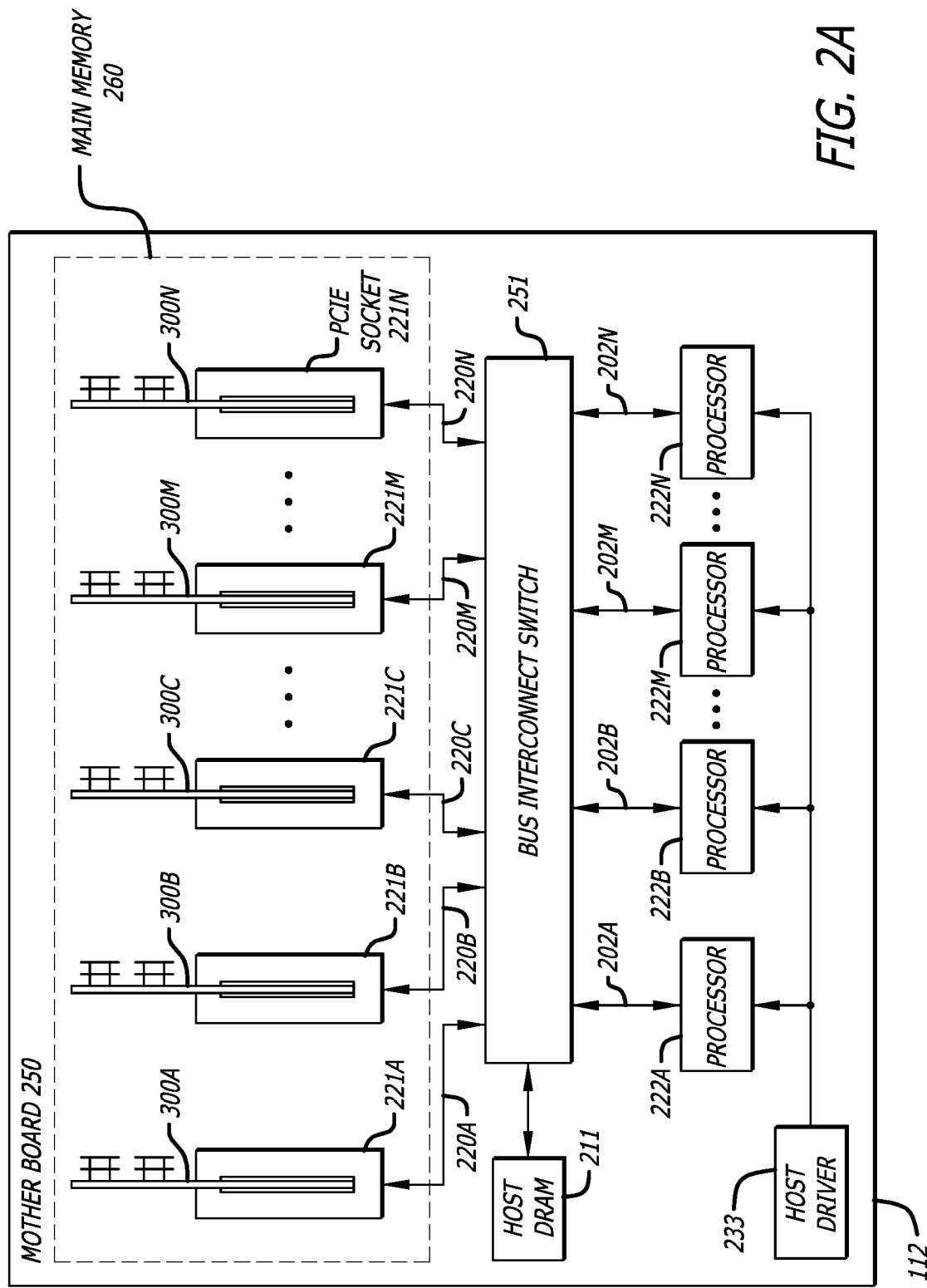
FIG. 2A is a block diagram of a server system.

In the following detailed description of the embodiments of the invention, numerous specific details are set forth in order to provide a thorough understanding of the embodiments of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The technologies used by non-volatile memory integrated circuits differ from dynamic random access memory (DRAM) integrated circuits (ICs) in the structure of their memory cell and in how they store information within the cell. These differences may help a computer system achieve relatively low power consumption characteristics. For example, non-volatile memory integrated circuits typically do not require refresh cycles and thus conserve power. Non-volatile memory integrated circuits, because of their increased density and high read and write performance, may help expand the capacity of main memory in the system. Alternately or in addition, non-volatile memory integrated circuits, by virtue of their ability to persist information across power cycling of the computer system, may help improve the I/O performance of disk-based storage systems.

Non-volatile memory integrated circuits possess characteristics that allow them to augment, and in some cases replace DRAM and storage disks in a storage subsystem of a computer system. Some types of non-volatile memory circuits, such as NAND Flash integrated circuits, can be configured as storage devices that offer disk-like non-volatility and capacity, with DRAM-like read and write access performance. Delivering the same performance, some types of non-volatile memory circuits may utilize less space and consume less power.

Typically, read and write accesses to non-volatile memory integrated circuits may take more time than corresponding accesses to DRAM integrated circuits. In order to address differences between read and write performance and the access characteristics, a data communication protocol may be used that accesses the non-volatile memory modules in a different manner than DRAM memory modules. Data may be first loaded into a DRAM staging area before being written into some types of non-volatile memory and accessed by application software running on the processing unit of the computer system. Some types of non-volatile memory may also have data stored into the DRAM staging area before being written in block form into the non-volatile memory integrated circuits.

Low Power Server System

Referring now to FIG. 1, a block diagram of a server system 100 is illustrated including one or more low power server racks 102 coupled to a wide area network (e.g., internet) or local area network through network connections 106. The server system 100 may couple to remote computers through the network connections. The low power server rack 102 includes one or more low power compute servers 112A-112N each of which can store and process data in a low power main memory incorporating non-volatile memory devices.

With additional servers being made available on the internet to provide web based applications and web based storage and searches, a lower power server rack incorporating non-volatile memory devices may lower power consumption and reduce operating costs of a server system.

Figure 2B:
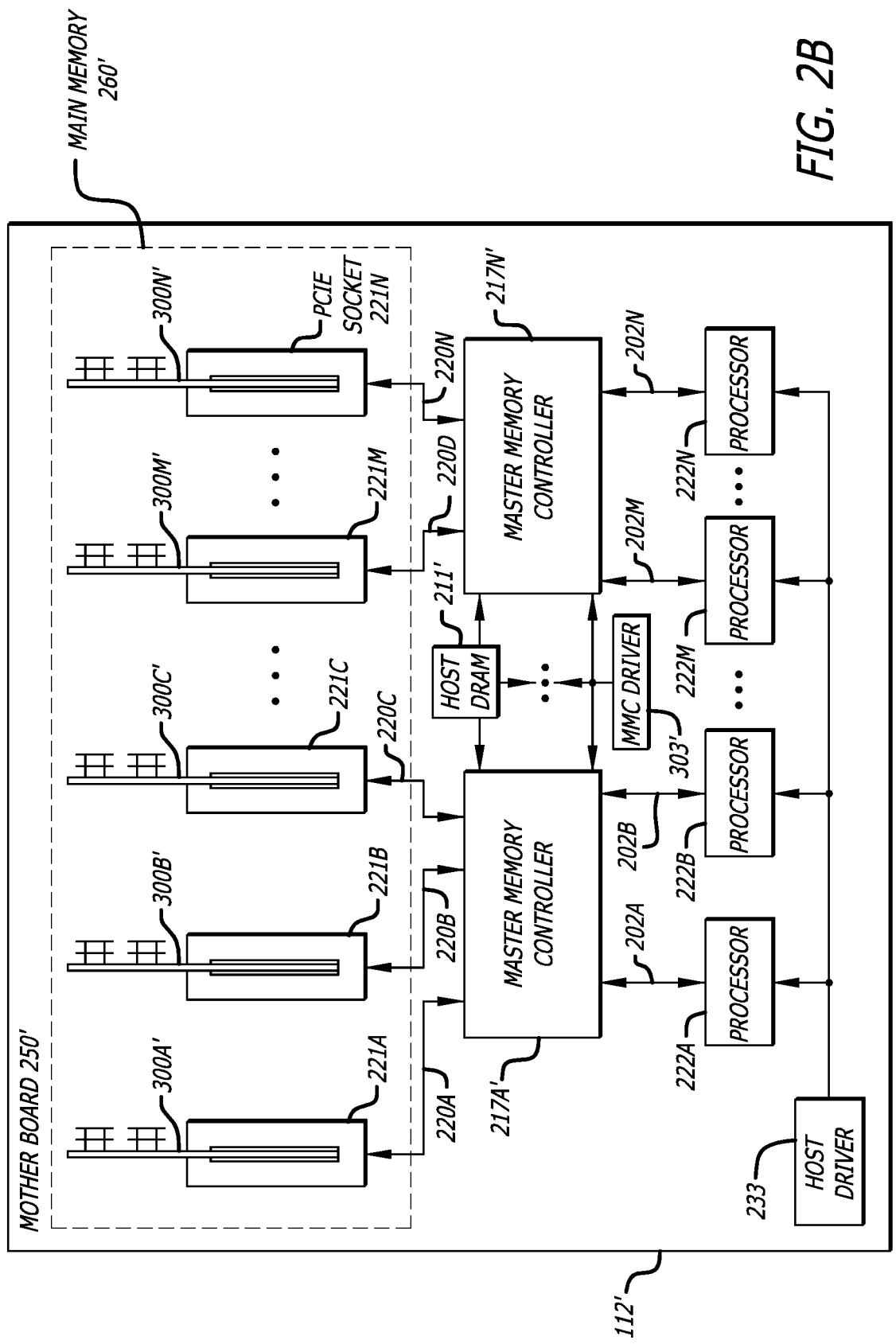
FIG. 2B is a block diagram of an alternate server system.

Referring now to FIG. 2A, a block diagram of a low power compute server 112 is illustrated as an instance of one of the low power compute servers 112A-112N of the server rack. FIG. 2B, illustrates a block diagram of an alternate low power compute server 112' as an instance of one of the low power compute servers 112A-112N of the server rack.

The compute server 112,112' includes a main memory 260,260' with one or more replaceable low power server memory cards (SMC) 300A-300N, 300A'-300N' each having non-volatile random access memory (NVRAM). A server memory card (SMC) may also be referred to as a slot card memory (SCM). NVRAM that is randomly accessible and can be re-written and erased, in contrast to read only memory (ROM) that can only be read and not re-written, may generally be referred to herein as non-volatile memory. When implemented with NAND flash memory, the NVRAM is block accessible using a block based flash memory interface.

The compute server 112,112' includes a multilayer mother printed circuit board 250,250' (also referred to as a "mother board") with one or more layers of wire interconnect or traces, such as traces 202A-202N and 220A-220N, to connect components of the server in communication with each other as shown. The traces of the motherboard connect the various processors, memory, and I/O together on the motherboard. To receive an edge connector of each of the one or more replaceable low power server memory cards (SMC)

300A-300N,300A'-300N', the motherboard 250,250' includes one or more expansion connectors or sockets 221A-221N. In one embodiment of the invention, the edge connector of the server memory cards (SMC) 300A-300N, 300A'-300N' is a peripheral component interconnect express (PCIe) edge connector and each of the sockets 221A-221N is a PCIe socket.

The compute server 112,112' may be a multiprocessor server with a plurality of processors 222A-222N mounted to the mother board 250 each of which may be in communication with a host software driver that may be stored in a storage device 233. In the compute server 112 illustrated in FIG. 2A, memory controllers (master memory controllers 217,217' and slave memory controllers 402A-402B shown in FIG. 4) are included as part of the server memory cards 300A-300N. However, the compute server 112' illustrated in FIG. 2B may include one or more master memory controllers 217A'-217N' mounted to the mother board and coupled to the plurality of processors 222A-222N by traces 202A-202N and a host dynamic random access memory (DRAM) 211' by additional printed circuit board traces. The memory controllers 217A'-217N' couple to the sockets 221A-221N by the traces 220A-220N that may be referred to as primary or master memory channels 220A-220N. The memory controllers 217A'-217N' are primary or master memory controllers to respectively control one or more of the primary or master memory channels 220A-220N. Alternatively, one or more master memory controllers 217,217' may be located on each of the one or more replaceable low power server memory cards (SMC) 300A-300N. A bus interconnect switch 251 illustrated in FIG. 2A may be mounted to the motherboard and coupled to printed circuit board (PCB) traces 220A-220N,202A-202N between the one or more processors 222A-222N and each of the sockets 221A-221N. The host dynamic random access memory (DRAM) 211 may be coupled to the PCB traces that are further coupled to the bus interconnect switch 251. Secondary memory controllers or slave memory controllers may couple to the master memory controllers and control each memory channel.

The master memory controllers and/or the slave memory controllers may be software programmable memory controllers that can adapt on the fly, prior to memory access, to different types and capacities of memory. A master memory controller driver 303 (see MMC driver 303' in FIG. 2B) in communication with each of the master memory controllers 217A'-217N' may be used to initialize the memory controllers and execute a number of program instructions to provide support services to each of the server memory cards (SMC) 300A'-300N'. Alternatively, the master memory controller driver 303 may be stored in a read only memory (see ROM 423 in FIG. 4) and communicated to each of the one or more master memory controllers 217,217' to initialize the memory controllers and execute a number of program instructions to provide support services to each of the server memory cards (SMC) 300A-300N shown in FIG. 2A.

Low Power Server Memory Card (SMC)

Figure 3A:
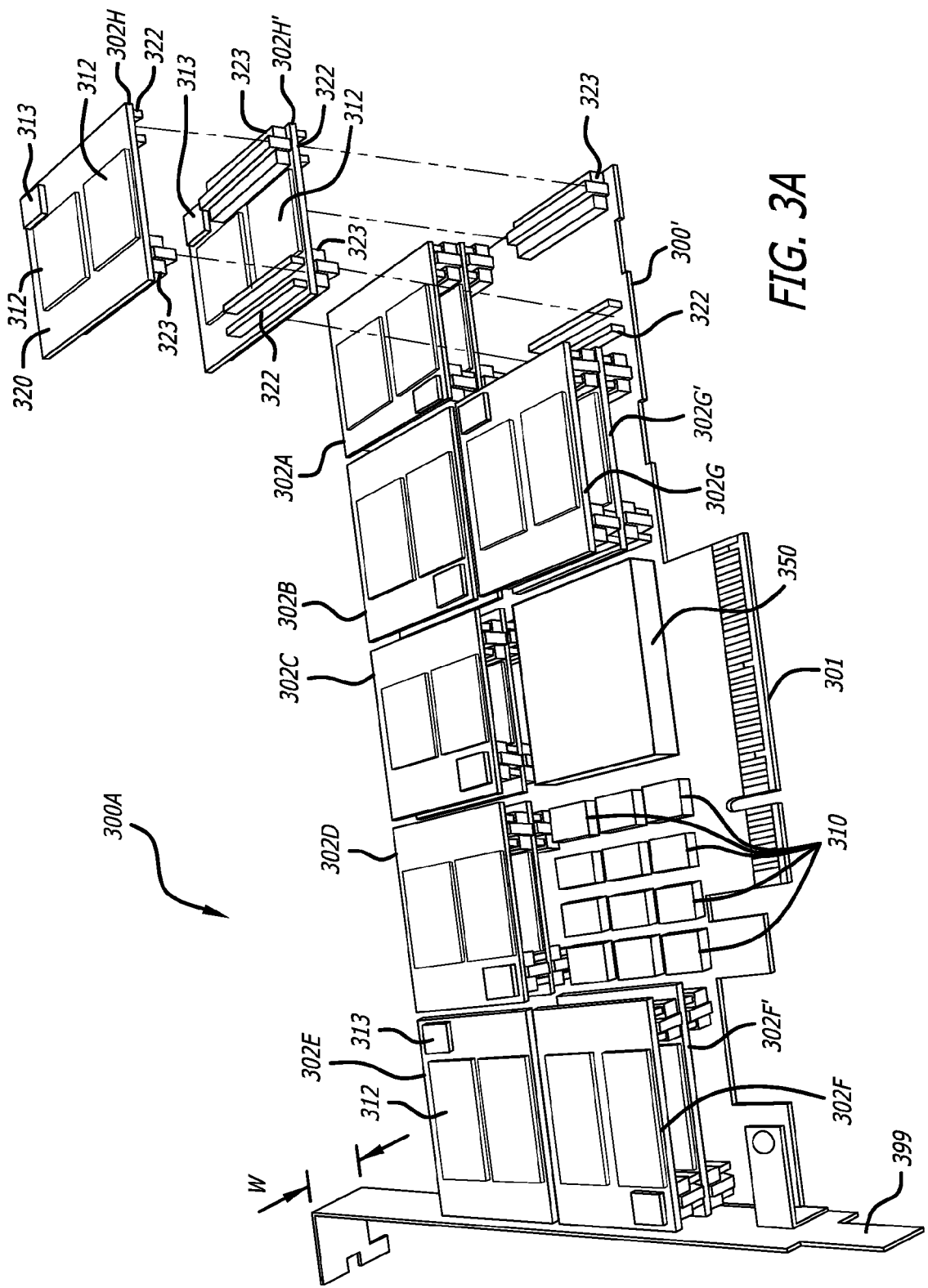
FIG. 3A is a perspective view of a pluggable server memory card with two levels of replaceable pluggable daughter-memory-cards.

Referring now to FIG. 3A, a partially exploded view of an instance of a server memory card 300A is illustrated that may be used for each of the server memory cards (SMC) 300A-300N,300A'-300N' shown in FIGS. 2A-2B.

The server memory card 300A includes a baseboard printed circuit board 300' having a host edge connector 301 and one or more layers of printed circuit board traces. A mounting bracket 399 having a width W is coupled to the baseboard printed circuit board 300'. The mounting bracket 399 may be coupled to a case of the compute server 112,112'.

The host edge connector 301 is adapted to couple to the sockets 221A-221N mounted to the motherboard 250 of the host server system.

The server memory card 300A includes one or more master controllers 350 mounted to a side (e.g., top or left side) of the baseboard PCB 300' and one or more slave controllers (see slave controllers 402A-402B in FIG. 4) mounted to a side (e.g., bottom or right side) of the baseboard PCB 300' and coupled to the master controller 350 by a plurality of master-slave memory bus channels. A host bus channel formed of traces of the baseboard printed circuit board 300' may couple the master controllers 217,217' to the host edge connector 301. The one or more slave controllers are adapted to provide transparent access to non-volatile memory. The master controllers and slave controllers provide native access of the non-volatile memory to the processors.

The server memory card 300A further includes a plurality of female daughter-card sockets 322 mounted to the baseboard 300' and respectively coupled to the slave memory controllers by means of the plurality of memory bus channels. The server memory card 300A further includes a plurality of male daughter-card sockets 323 mounted to the baseboard 300' and respectively coupled to the slave memory controllers by means of the plurality of memory bus channels. The daughter-card sockets 322-323 are adapted to receive a plurality of replaceable pluggable daughter memory cards 302A-302H, 302A'-302H'. While male daughter-card sockets 323 and female daughter-card sockets 322 have been described as positioned, they may be interchanged into different combinations including female only daughter-card sockets 322 mounted to the baseboard 300' to receive male only sockets of the daughter card or male only daughter-card sockets 323 mounted to the baseboard 300' to receive female only sockets of the daughter card.

The server memory card 300A further includes one or more of the replaceable pluggable daughter memory cards 302A-302H, 302A'-302H'. Each of the daughter memory cards includes a plurality of packaged non-volatile memory devices 312 mounted to a rectangular printed circuit board. For lower costs, the daughter memory cards avoid having a memory controller such that the flash memory interface of active ones of the plurality of packaged non-volatile memory devices 312 are seen at the connectors 322,323.

The server memory card 300A further includes a non-volatile card configuration device 420 (see FIG. 4) coupled to the one or more master controllers 217,217'. An embedded processor 422 may access the card configuration device 420 through the master controller 217,217' to initialize the server memory card 300. The master controller 217,217' may come out of a reset condition into a minimal functionality mode and access information from the card configuration device to complete initialization and setup of the master controller itself.

The master controllers 217,217' natively control the non-volatile memory devices to obtain predictable bandwidth and latency performance with the non-volatile memory mounted to the daughter-memory-cards. One or more slave controllers are adapted to provide transparent access to non-volatile memory devices 312. All operations that take place on the flash memory device 322 (read, write, erase, plus control operations such as reset, etc.) are completely visible to (and under the control of) the master controller. The flash memory interface of active ones of the plurality of packaged non-volatile memory devices 312 is passed through the slave memory controller to the master controller to which the slave memory controller is coupled.

The master controller is able to directly exercise each of the operations that are supported by the flash memory devices 322. The slave controller may perform protocol conversion, but does not drop/intercept (without involving the flash memory device) a request from the master controller. However, the slave controller does not autonomously initiate any flash memory operation.

In one embodiment of the invention, the plurality of slave controllers 402A-402B (see FIG. 4) are mounted to the baseboard 300' coupled between the master controller 217, 217' and the plurality of daughter-card sockets 322-323. In another embodiment of the invention, the plurality of slave controllers are mounted together in an integrated circuit package with the master controller 217,217' and coupled between the master controller 217,217' and the plurality of daughter-card sockets 322-323. In yet another embodiment of the invention, the plurality of slave controllers are mounted to the plurality of daughter-memory-cards 302A-302H, 302A'-302H' coupled between the master controller 217,217' and the plurality of packaged non-volatile memory 312.

Figure 4:
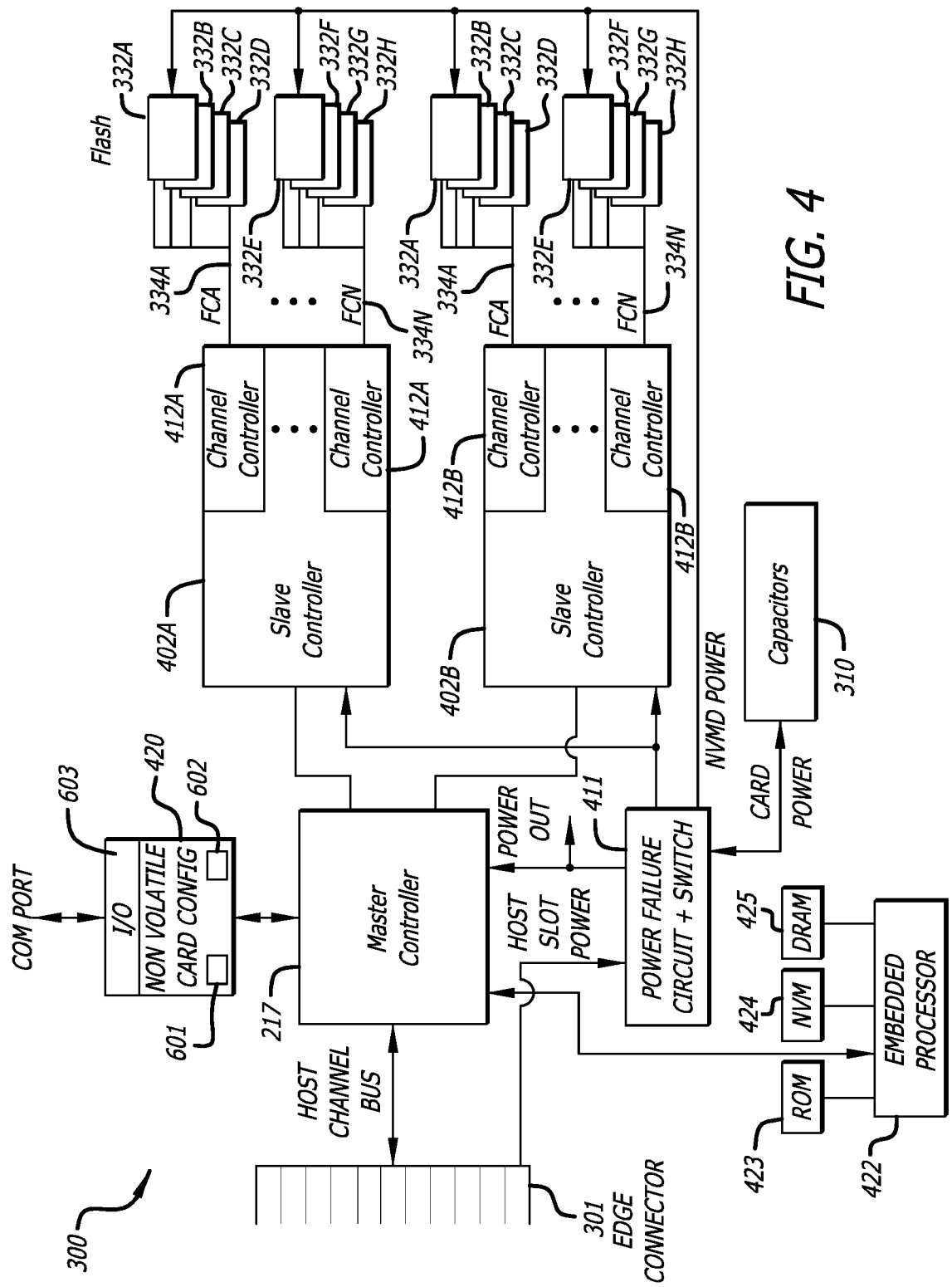
FIG. 4 is a block diagram of a portion of the pluggable server storage card with daughter-memory-cards.

Referring now to FIG. 4, each slave controller 402A-402B is adapted to arbitrate memory bus channels 334A-334N shared by the multiple non-volatile memory devices 312, to buffer and multiplex signals between the master controller 217,217' and the multiple non-volatile memory devices 312, and to combine a sequence of predictable non-volatile memory operations together into a compound operation to improve control bandwidth with the non-volatile memory devices.

Referring now back to FIG. 3A, intermediate daughter-memory-cards 302A'-302H' are removeably plugged into the receptacles 322,323 of the base-board 300'. The intermediate daughter-memory-cards 302A'-302H' include daughter-card sockets 323,322 on top and bottom sides of the rectangular printed circuit board.

Top daughter-memory-cards 302A-302H are respectively removeably plugged into a top-side of the intermediate daughter-memory-cards 302A'-302H'. Signals for the top daughter-memory-cards flow through the intermediate daughter-memory-cards by way of stacked daughter-card sockets 323-323 being plugged together. As discussed herein, each of the daughter memory cards 302A-302H, 302A'-302H' includes a plurality of packaged non-volatile memory devices 312 mounted to a rectangular printed circuit board.

Referring now to FIGS. 3A and 4, the server memory card 300A further includes a plurality of high density power capacitors 310 and power failure circuitry 411 (see FIG. 4) mounted to the baseboard 300' to store card power and switch from host power to card power in the case of power failure. The power failure circuitry 411 is coupled to the edge connector 301 to receive host or slot power and ground. The power failure circuitry 411 is coupled to the plurality of high density power capacitors 310 to receive capacitor power and ground (also referred to as card power). The power failure circuitry 411 further couples to the master controller 217,217', the plurality of slave controllers 402A-402B, the plurality of daughter-card sockets 323,322 and daughter-memory-cards 302 coupled thereto, and the non-volatile card configuration device 420 in order to provide power (either the slot power or the card power) thereto.

The power failure circuitry 411 detects slot power failure and switches from supplying slot power to provide capacitor or card power to the devices to which it couples. The power failure circuitry 411 further notifies the master controller 217,217' and the plurality of slave controllers 402A-402B to switch into a power failure mode to execute data preservation operations. Upon initial power up of the server memory card, the power failure circuitry charges the plurality of high density power capacitors 310 before the master memory controller 217,217' and the plurality of slave memory controllers 402A-402B permit access to the non-volatile memory devices of the daughter-memory-cards 302. The edge connector 301 of the server memory card may include staggered power pins (Ground pins first, power second) in order to provide hot plugability.

As shown in FIG. 4, each server memory card 300A may further include an embedded processor 422, a read only memory (ROM) 423, a non-volatile memory 424, and a dynamic random access memory (DRAM) 425 mounted to the baseboard 300' and coupled together as shown. The ROM 423 stores boot instructions for the server memory card 300A. The DRAM 425 proves scratch pad memory to the embedded processor 422 and can store translation structures (e.g., a translation table mapping logical addresses to physical addresses) to access data in the non-volatile memory devices 312. The non-volatile memory 424 includes firmware instructions that may be periodically upgraded. The firmware instructions drive and control the master and slave memory controllers 217, 402A-402B to perform read, write, erase or maintenance operations to access data with the non-volatile memory devices 312 of the daughter-memory-cards 302. The embedded processor 422 executes the firmware instructions to drive and control the master and slave memory controllers to access data as well as read, write, and maintain the translation structures in the DRAM.

The embedded processor 422 is further coupled to the master memory controller 217,217' and the edge connector 301 to communicate with each. The embedded processor is also in communication with the host processors 222A-222N over the edge connector to receive read and write operation requests from the host application or host operating system software to access data in the NVMDs.

Referring now back to FIGS. 2A-2B, the server 112,112' includes a host driver stored in a host storage device 233. The host driver stored in the host storage device 233 includes instructions that can be executed by one or more of the host processors 222A-222N that may result in issuing read or write memory requests to one or more server memory cards. In an alternate embodiment, the host driver stored in the host storage device can also directly interact with the master memory controller so that read/write requests can be issued directly.

Daughter Memory Card (DMC)

As discussed herein, the server memory card may include intermediate daughter-memory-cards 302A'-302H' and/or top daughter-memory-cards 302A-302H having male daughter-card sockets 323 and/or female daughter-card sockets 322 and respectively plugged into the female daughter-card sockets 322 and/or male daughter-card sockets 323. The one or more sockets 322,323, mounted to the top or bottom sides of the printed circuit boards near opposite edges, may also be referred to as pluggable electrical connectors. The female socket 322 may also be referred to as a receptacle and the male socket 323 may also be referred to as a plug. The one or more sockets 322,323 may be mounted parallel or perpendicular to the top or bottom sides of the printed circuit boards to make respective connections in parallel with or perpendicular to the edge connector 301.

In FIG. 3A, intermediate daughter-memory-cards 302A'-302H' are removeably plugged into the sockets 322-323 of the base-board 300'. Top daughter-memory-cards 302A-

302H are respectively removeably plugged into a top-side of the intermediate daughter-memory-cards 302A'-302H'. A dual level of daughter-memory-cards is used in the server memory card 300A. While only two levels of daughter-memory-cards are shown, additional levels may be added provided the spacing requirements are more relaxed, such as by using a double wide bracket 399 with the base-board 300'. Alternatively, spacing requirements may be more stringent or costs may be a factor, in which case a single level of daughter-memory-cards may be used.

Figure 3B:
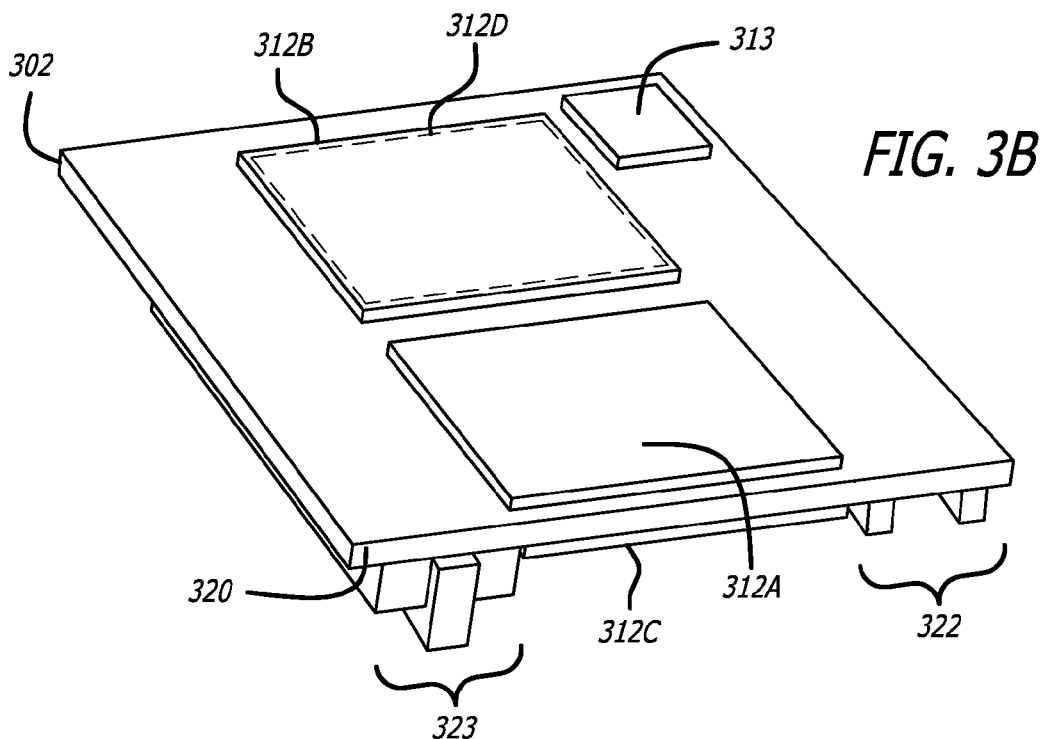
FIG. 3B is a perspective view of an intermediate replaceable pluggable daughter-memory-card.
Figure 3C:
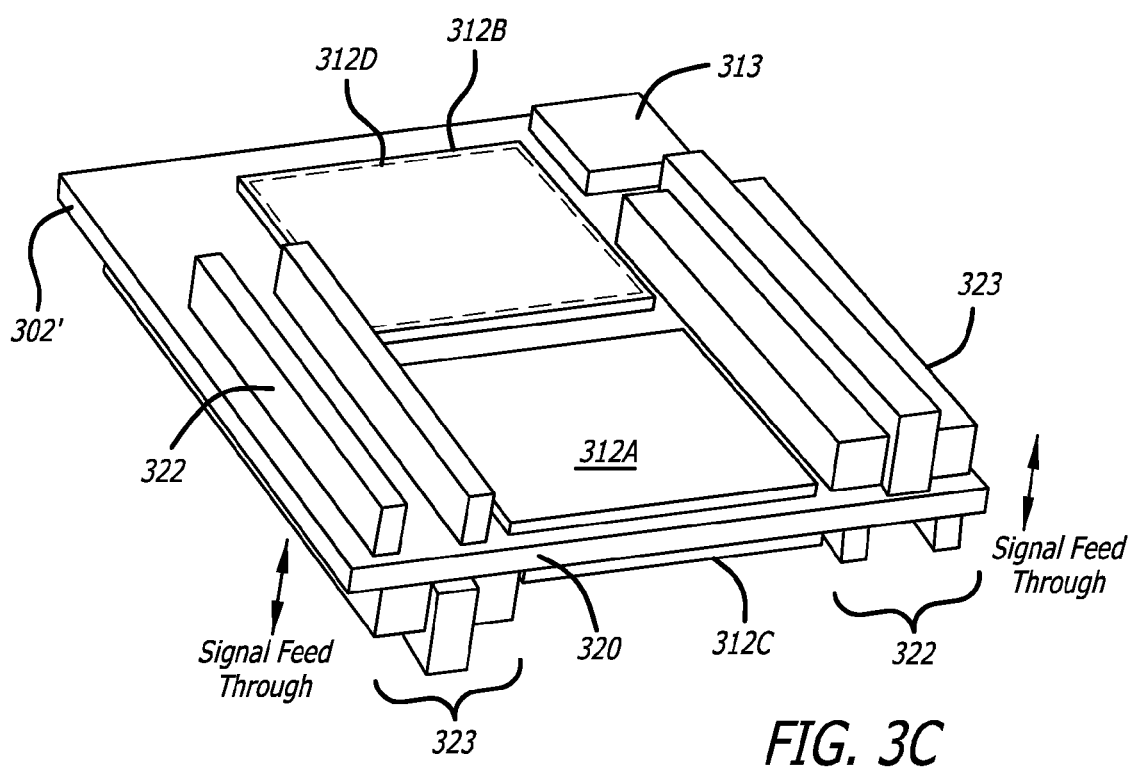
FIG. 3C is a perspective view of a top replaceable pluggable daughter-memory-card.
Figure 3D:
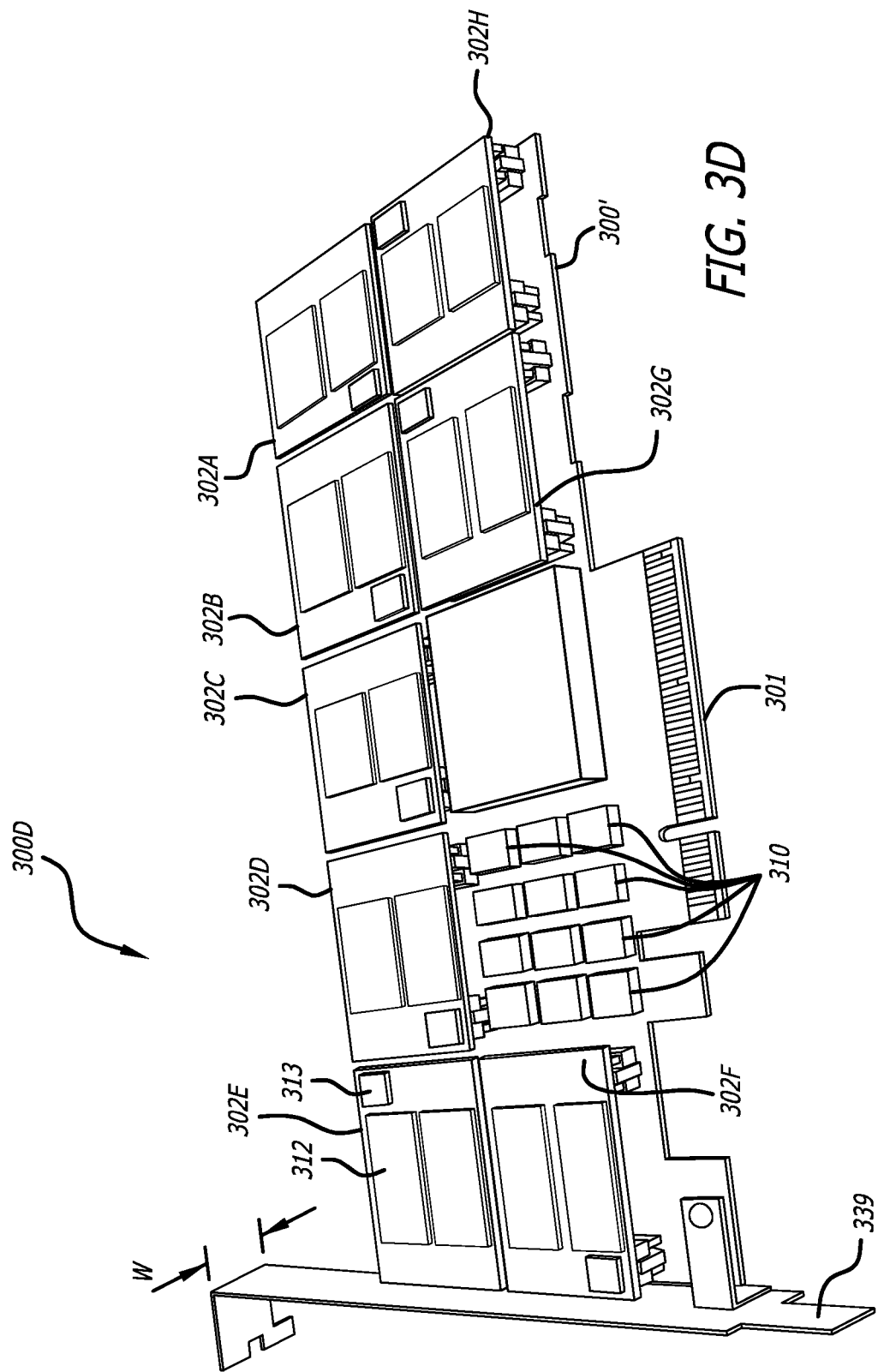
FIG. 3D is a perspective view of a pluggable server memory card with a single level of replaceable pluggable daughter-memory-cards.

In FIG. 3D, top daughter-memory-cards 302A-302H are removeably plugged into sockets 322-323 of the base-board 300' providing for a single level of daughter-memory-cards being used in the server memory card 300D.

The number of levels of daughter-memory-cards may typically limited by the width W of the bracket 399 setting the spacing requirements from neighboring cards. That is, the overall width of the server memory card may be no greater than the width W of the bracket.

Referring now to FIG. 3B, a perspective view of a top daughter-memory-card 302 is illustrated that is an instance of each of the top daughter-memory-cards 302A-302H shown in FIGS. 3A and 3D.

The top daughter-memory-card 302 includes a rectangular shaped multilayer printed circuit board 320 with a plurality of non-volatile memory devices 312A-312D (collectively referred to as non-volatile memory devices 312), a support chip 313, a male socket 323, and a female socket 322 mounted thereto. Electrical pins of the male socket 323 and the female socket 322 are coupled to the plurality of non-volatile memory devices 312A-312D by printed circuit board traces of the printed circuit board 320. The male socket 323 and the female socket 322 are mounted perpendicular to the bottom-side of the printed circuit board 320 of the top daughter-memory-card 320. Sockets may not be mounted to a top-side of the printed circuit board 320 of the top daughter-memory-card to reduce costs and meet the width requirement of the server memory card 300A.

Referring now to FIG. 3C, a perspective view of an intermediate daughter-memory-card 302' is illustrated that is an instance of each of the intermediate daughter-memory-cards 302A'-302H' shown in FIG. 3A.

The intermediate daughter-memory-card 302', similar to the top daughter-memory-card, includes a rectangular shaped multilayer printed circuit board 320 with a plurality of non-volatile memory devices 312A-312D, a support chip 313, male sockets 323, and female sockets 322 mounted thereto. Electrical pins of the male sockets 323 and the female sockets 322 are coupled to the plurality of non-volatile memory devices 312A-312D by printed circuit board traces of the printed circuit board 320.

The intermediate daughter-memory-cards 302A'-302H' include daughter-card sockets 323-323 mounted perpendicular to both top and bottom sides of the rectangular printed circuit board 320. A female socket 322 may be mounted on the top-side near a left or right side or edge in alignment with a male socket 323 on the bottom-side. Similarly, a male socket 323 may be mounted on the top-side near a right or left side or edge in alignment with a female socket 322 on the bottom-side. The pins of the top sockets are coupled to the pins of the bottom sockets so that signals can flow up or down through the printed circuit board 320. As the gender of the sockets changes from top to bottom, top daughter-memory-cards 302A-302H may be removeably plugged into a top-side of the intermediate daughter-memory-cards 302A'-302H', while the intermediate daughter-memory-cards 302A'-302H' plug into the sockets of the base-board 300'. Signals for the top daughter-memory-cards flow through the intermediate daughter-memory-cards to the base-board by way of stacked daughter-card sockets 323-323 being plugged together.

As discussed previously, each of the daughter memory cards 302A-302H, 302A'-302H' includes a plurality of packaged non-volatile memory devices 312 mounted to a rectangular printed circuit board. In one embodiment of the invention, four non-volatile memory devices 312A-312D are mounted to the printed circuit board 320 of the top daughter-memory-card 302 and/or the intermediate daughter-memory-cards 302'. The non-volatile memory devices 312A-312B may be mounted to the top-side while non-volatile memory devices 312C-312D may be mounted to the bottom-side of the printed circuit board 320. Signal lines on the top-side from the non-volatile memory devices 312A-312B are fed through to the male socket 323 and/or the female socket 322 mounted to the bottom-side of the printed circuit board 320. Signal lines on the bottom-side from the non-volatile memory devices 312C-312D are coupled to the male socket 323 and/or the female socket 322 mounted to the bottom-side of the printed circuit board 320.

On the intermediate daughter-memory-card, the pins of the top sockets are coupled to the pins of the bottom sockets so that signals can flow up or down through the printed circuit board 320. When in a stacked configuration (dual level), signals from the non-volatile memory devices 312A-312D of the top daughter-memory-card 302 are fed up and down through to the male socket 323 and/or the female socket 322 mounted to the bottom-side of the printed circuit board 320 of the intermediate daughter-memory-card 302', as shown by the arrows in FIG. 3C.

In one embodiment of the invention, a portion (e.g., half) of the signals in each connector of a daughter card are for the NVMDs mounted to the bottom side while the remaining portion (e.g., the other half) of the signals are for the NVMDs mounted to the top side. In another embodiment of the invention, signals in connectors of a daughter card on one side of the printed circuit board are for the NVMDs mounted to the bottom side while signals in connectors on the opposite side are for the NVMDs mounted to the top side.

Figure 3E:
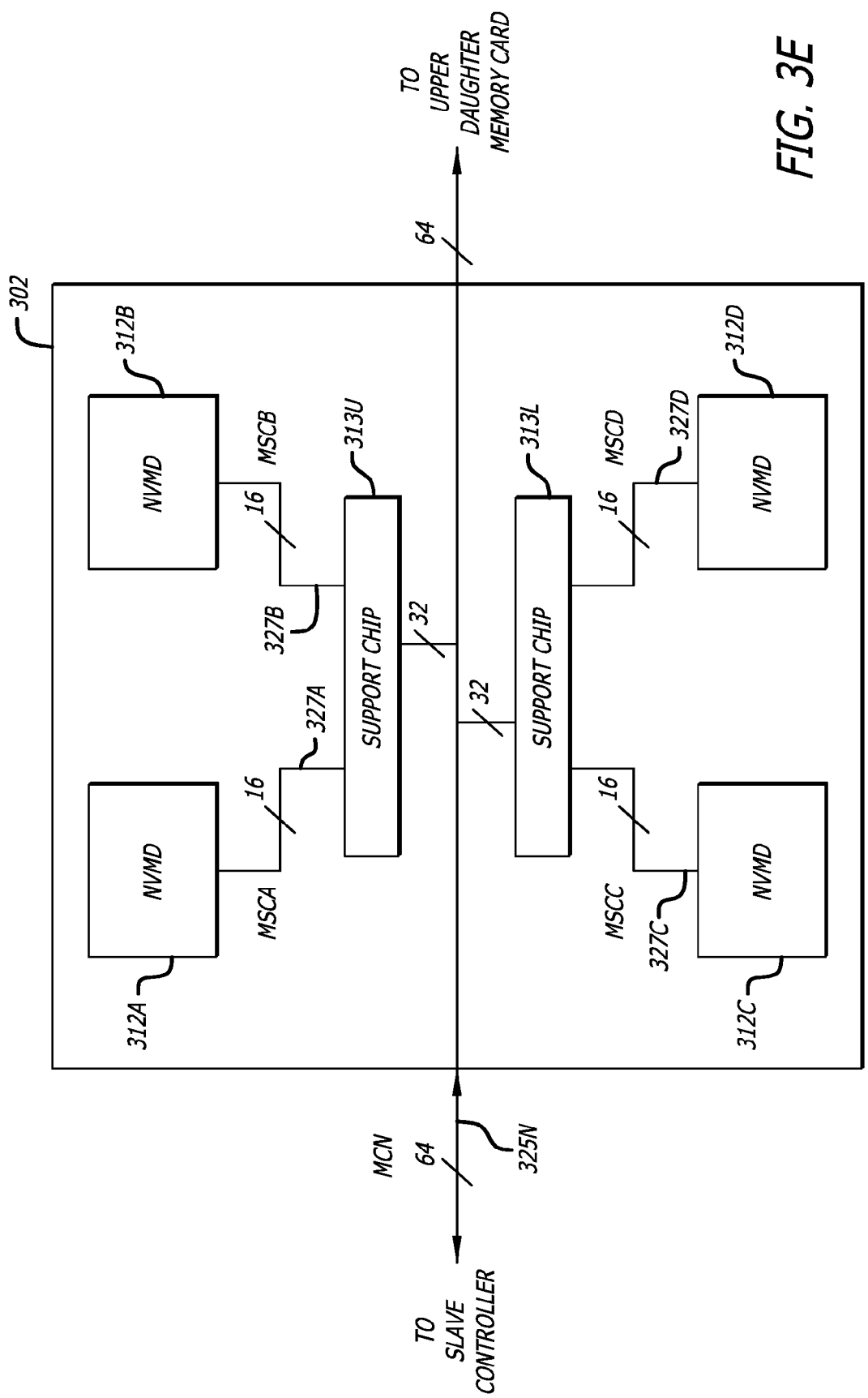
FIG. 3E is a block diagram of a pluggable daughter-memory-card that may plugged into the server memory card.

Referring now to FIG. 3E, an exemplary block diagram of a daughter memory card 302 is illustrated as an instance of the daughter memory cards 302A-302H, 302A'-302H'. The daughter memory card 302 includes non-volatile memory devices 312A-312D mounted to the board 320 and coupled to an end of printed circuit board traces that form memory subchannels.

Memory subchannels 327A-327D are formed on the daughter memory card between each NVMD and socket 323,322 coupled to the card. For example, a memory subchannel MSCA 327A is formed between NVMD 312A and the socket. Each memory subchannel may be 16 bits wide to carry multiplexed address/data. Each memory subchannel has one or more 8 bit flash memory channels (also referred to as flash channels herein) from an NVMD. In an embodiment described herein, each memory subchannel has two 8 bit flash memory channels. In this case, each memory subchannel MSCn 327N has a 16 bit data bus with multiplexed address/data, 8 independent chip enable control bits, and additional shared control bits.

A memory channel MCn 325N of printed circuit traces on the server memory card 300 is formed between each daughter memory card 302 (pair of sockets 322-323) and the respective slave controller to which they are coupled. In an embodiment described herein, each memory channel MCn 325 has a 64 bit data bus with multiplexed address/data, 32 independent chip enable control bits, and additional shared control bits.

Each of the daughter memory cards 302A-302H, 302A'-302H' includes one or more support chips 313 mounted to the rectangular printed circuit board 320. The support chips 313 uniquely identify the daughter memory card and the non-volatile memory devices mounted thereto such as by a combination of numbers and letters similar to serial numbers. This is so the health of each non-volatile memory chip in the non-volatile memory device can be uniquely monitored for warning signs of failure mechanisms associated with non-volatile memory devices.

The support chips 313 may further multiplex signals between the non-volatile memory devices and the male and female sockets 322-323. The one or more support integrated circuits 313 may further include buffers and queue registers to transparently buffer and combine non-volatile memory access operations together to increase memory bandwidth with the non-volatile memory devices.

In the embodiment of the daughter memory card 302 illustrated in FIG. 3E, an upper support chip 313U and a lower support chip 313L are coupled to and between the memory channel 325N and the non-volatile memory devices 312A-312D. While control signals may be multiplexed by each support chip for the respective NVMDs, the 16 bit data busses of memory subchannels 327A-327D may simply pass through or around the support chips and simply be aggregated together and coupled to the data bus of the memory channel MCn 325N. Alternatively each support chip may buffer the address and data with the memory channel data/address bus.

If the daughter memory card is an intermediate card, the memory channel MCN 325n is fed through and coupled to one or more sockets so that signals may be transferred to the upper daughter memory card. In other embodiments of the invention, other methods of routing signals and making connections between the baseboard, the intermediate daughter cards, and the upper daughter cards may be used, such as a flex connector for example.

The NVMDs may be implemented differently so there are alternate embodiments. For example, FIGS. 3F and 3G illustrate different implementations.

Figure 3F:
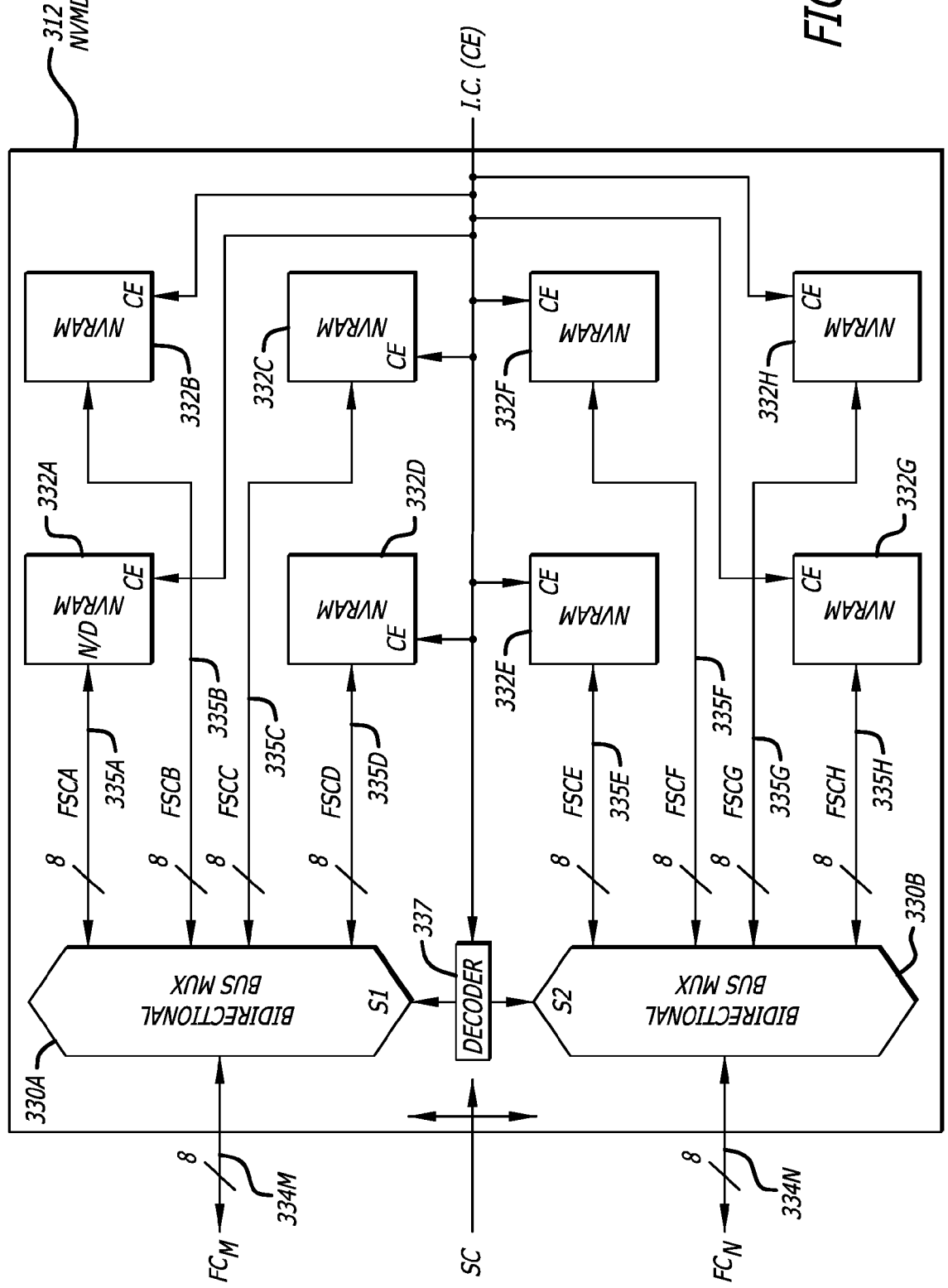
FIG. 3F is a block diagram of a non-volatile memory device that may be mounted to a replaceable pluggable daughter-memory-card.
Figure 3G:
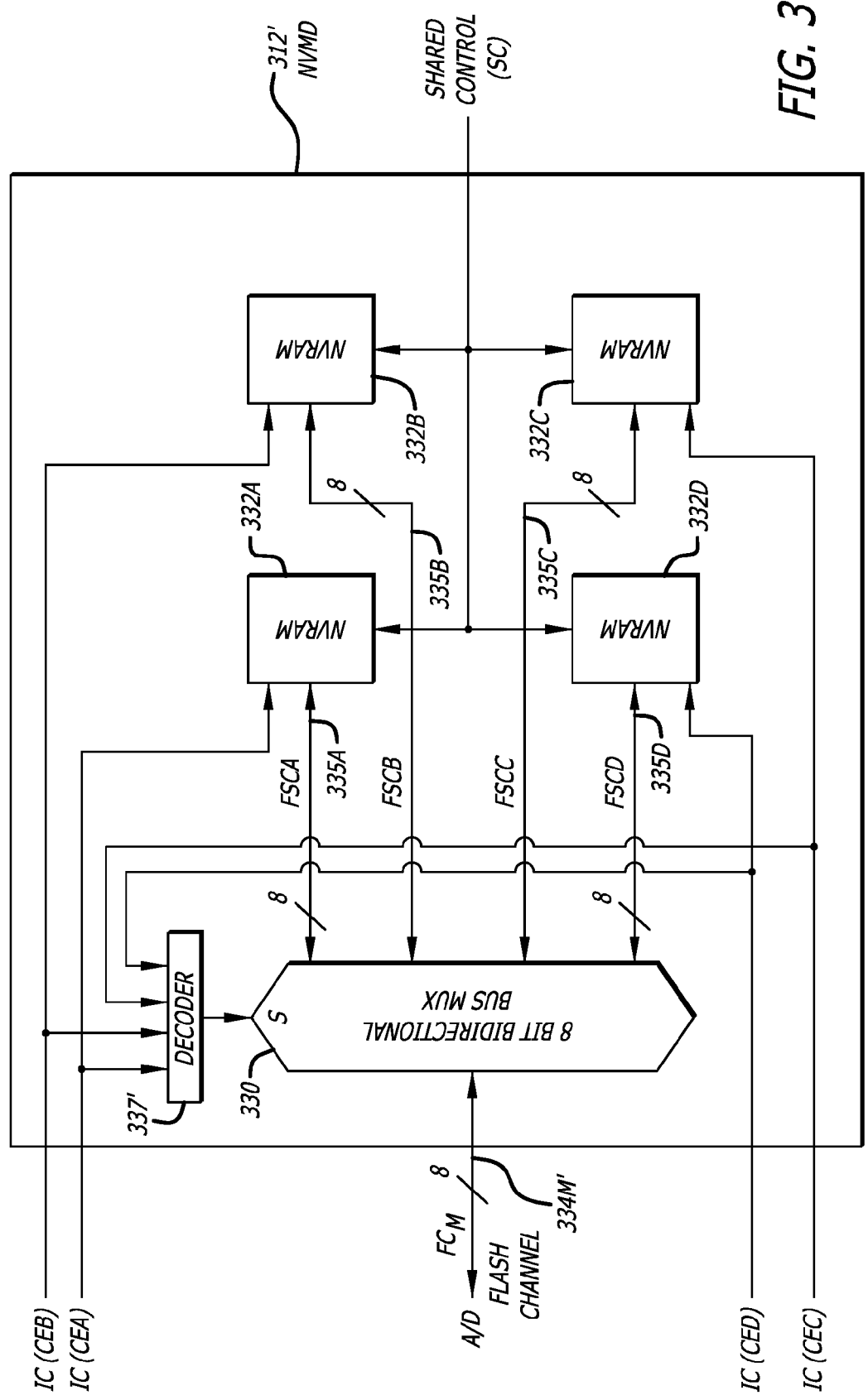
FIG. 3G is a block diagram of a alternate non-volatile memory device that may be mounted to a replaceable pluggable daughter-memory-card.

Referring now to FIG. 3F, a block diagram of a packaged non-volatile memory device (NVMD) 312 is shown. The NVMD 312 has two flash channel interfaces FCm 334M and FCn 334N. The NVMD 312 includes a plurality of non-volatile random access memory (NVRAM) chips or integrated circuits 332A-332D and 332E-332H. The NVMD 312 further includes, a plurality of eight bit bidirectional flash subchannels (FSCA-FSCD) 335A-335D, (FSCE-FSCH) 335E-335H, bidirectional bus multiplexors 330A-330B and a decoder 337 coupled together as shown.

Each flash channel FCn 334 has an 8-bit data bus with multiplexed address/data, 4 independent chip enable control bits, and additional shared control bits. Each flash channel logically has one or more flash subchannels. A flash subchannel is the logical connection made between a daughterboard connector and a single flash NVRAM die 332 within the NVMD 312. In the embodiments shown in FIG. 3F-3G, each flash channel is associated with four logical flash subchannels.

The NVRAM chips 332A-332H may be NAND flash memory, NOR flash memory, phase change memory, or other types of non-volatile random access memory. Each daughter-memory-card 302,302' may have different types of non-volatile random access memory that can be identified to the server memory card and the card configuration device so that read operations, write operations, and/or erase or maintenance operations can be tailored to the given type of memory. For example, flash programmable electrically erasable programmable read only memory (flash memory) has an erase operation performed on entire blocks of memory cells that is used before a write operation is performed to the block of memory cells. However, phase change memory does not need to erase blocks of memory cells before the memory cells can be written. However, other maintenance operations may be performed with phase change memory or other types of non-volatile memory. In one embodiment of the invention, the NVRAM chips are NAND flash memory die having 8 gigabits (Gb) of memory capacity per die (8 bits×1 gigabit) with a multiplex A/D data bus.

The plurality of eight bit bidirectional flash subchannels (FSCA-FSCD) 335A-335D, (FSCE-FSCH) 335E-335H are coupled between NVRAM chips 332A-332H and bidirectional bus multiplexors 330A-330B. The decoder 337, coupled to chip enable signals, can generate a select signal for the multiplexers 330A-330B to select and multiplex two of the eight flash memory subchannels onto the two flash channels FCm and FCn, respectively.

Each of the 8 bit flash subchannels and the flash channels multiplex address and data together onto the same data bus. Additionally, there are independent and shared control signal lines associated with the flash subchannels 335A-335H that couple to the NVRAM chips 332A-332H. There are eight independent chip enable control signals (CEA through CEH) one for each NVRAM chip and at least one shared control line that jointly couples to all the NVRAM chips.

Referring now to FIG. 3G, a block diagram of a packaged non-volatile memory device (NVMD) 312' is shown. The NVMD 312' has a single flash channel interface FCm 334M and includes the plurality of non-volatile random access memory (NVRAM) chips or integrated circuits 332A-332D. The NVMD 312' further includes, a plurality of eight bit bidirectional flash subchannels (FSCA-FSCD) 335A-335D, a bidirectional bus multiplexor 330 and a decoder 337' coupled together as shown.

As discussed herein, the NVRAM chips 332A-332D may be NAND flash memory, NOR flash memory, phase change memory, or other types of non-volatile random access memory. To achieve a similar capacity to the NVMD 312 on a single layer of daughter memory cards, two layers of stacked daughter memory cards may be used.

The plurality of eight bit bidirectional flash subchannels (FSCA-FSCD) 335A-335D, are coupled between NVRAM chips 332A-332D and the bidirectional bus multiplexor 330. The decoder 337', coupled to chip enable signals, can generate a select signal for the multiplexer 330 to select and multiplex one of the eight flash memory subchannels to be coupled with the one flash channel FCm.

Additionally, there are independent control signal lines (IC) and shared control signal lines (SC) associated with the flash subchannels 335A-335D that couple to the NVRAM chips 332A-332D. There are four independent chip enable control signals (CEA through CED) one for each NVRAM chip and may be one or more shared control signal lines that jointly couples to all the NVRAM chips.

Sustained Performance

In FIG. 2B, the master memory controller driver 303' stored in a storage device is in communication with each of the master memory controllers 217A'-217N' (collectively referred to as 217'). The master memory controller driver 303,303' may also be referred to as a software driver or driver software. In FIG. 4, the master memory controller driver 303,303' may be stored in the read only memory 423 or NVM 424 for example, executed by the processor 422 to initialize the memory controller 217,217'. The master memory controller driver 303 may include software instructions that when executed by the processor 422 provides support services to the server memory card (SMC) 300. The driver software may be implemented as firmware instructions executed by the embedded processor 422 of the server memory card 300 illustrated in FIG. 4.

One such support service provided is an operations scheduler to schedule read, write, and erase operations with the plurality of NVMDs 312 over the memory channel buses 334A-334N of each slave controller 402A-402B. Another support service provided is garbage collection to reclaim unused or invalid memory locations in the NVMDs 312 that are fragments of unused data or store invalid data. Garbage collection reclaims unused or invalid memory capacity in the NVMDs 312. Garbage collection is further described herein. Still another support service that may be provided is wear leveling to even out wear (write and erase operations) on the memory locations in the NVMDs.

In FIGS. 2A-2B, application software and/or operating system software may be executed by one or more of the processors 222A-222N and issue block memory access requests to the driver software 303 to read or write blocks of data with the main memory 260,260'. The driver software may aggregate a number of block memory access requests from application software and/or operating system software into sets of one or more block memory access requests against the master memory controllers 217,217A'-217N'.

Figure 5:
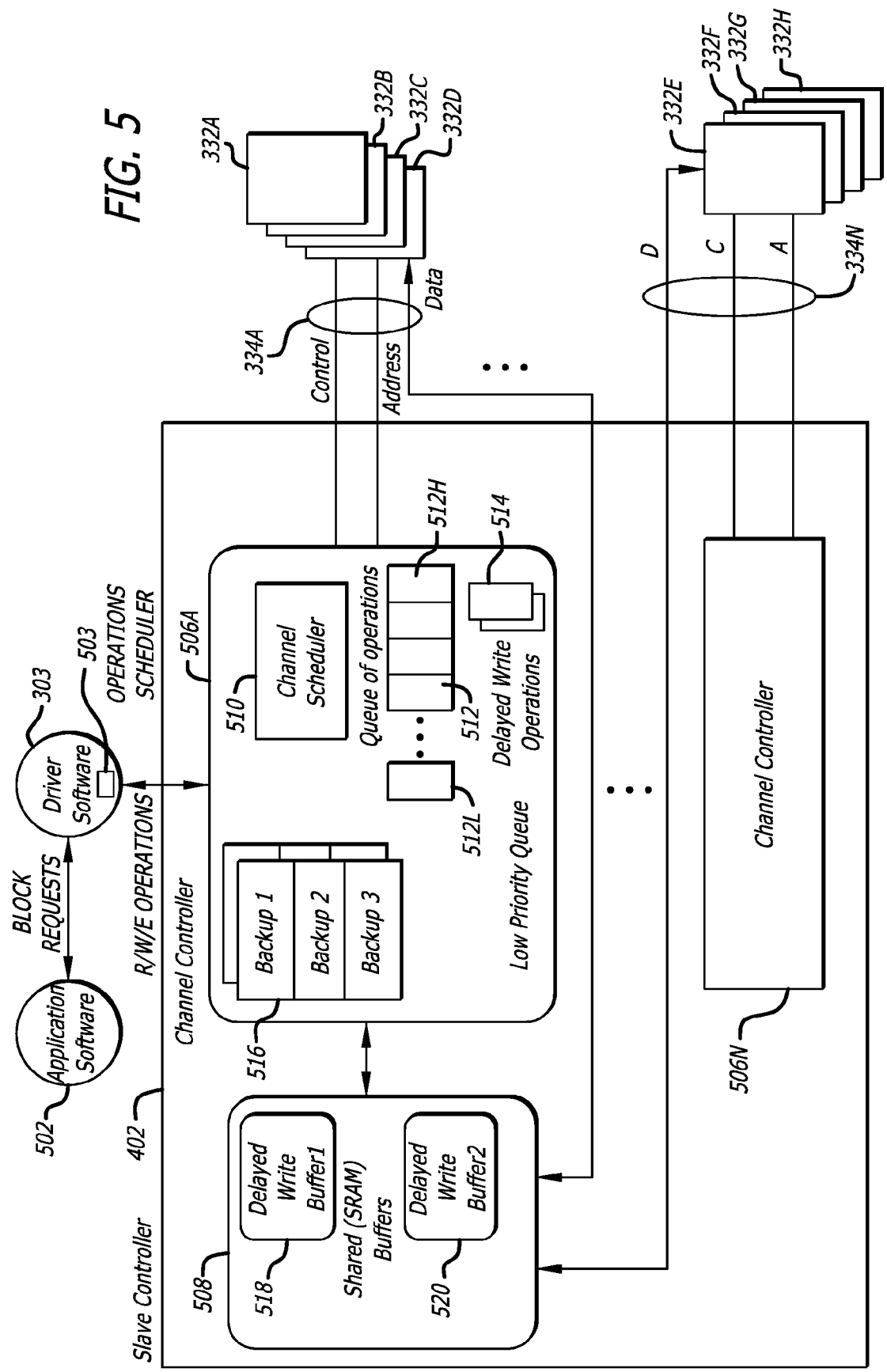
FIG. 5 is a block diagram of a slave memory controller coupled to non-volatile memory devices of a daughter-memory-card.

Referring now to FIG. 5, a slave memory controller 402 is coupled to a plurality of flash memory channels 334A-334N and their respective control (C), address (A), and data (D) busses. A plurality of NVMDs are coupled to a set of the plurality of memory channels to share buses. Application software 502 is coupled in communication with the driver software 303 to issue block memory access requests to the driver software. By way of the master memory controller, the driver software 303 is coupled in communication with the slave memory controller 402 and its one or more channel controllers 506A-506N, one for each flash channel 334A-334N. The driver software communicates read operations, write operations, and erase operations to the one or more channel controllers. The slave memory controller 402 further includes a shared data buffer 508. The one or more channel controllers 506A-506N are coupled in communication with the shared data buffer 508. The shared data buffer 508 is coupled to the data busses of the plurality of memory channels 334A-334N to read and write data with the NVMDs. The one or more channel controllers 506A-506N are coupled to the control and address busses of the plurality of memory channels 334A-334N to send address and control signals to the NVMDs.

Each NVMD can independently execute one read, write, or erase operation at a time. A memory channel can communicate one read, write, or erase operation at a time to an NVMD. For example, while four operations are coincidentally executed by four NVMDs, one operation is being communicated over the memory channel at a time to an NVMD of a plurality of NVMDs coupled thereto. Regardless the slave memory controller is coupled to the plurality of memory channels in communication between the plurality of NVMDs 312A-312D (collectively referred to as 312).

Each of the one or more channel controllers 506A-506N includes a channel scheduler 510, an operations queue 512, a delayed write operations storage 514, and a backup storage 516 coupled in communication together. The channel scheduler 510 schedules control and data transfers associated with the read, write, and erase operations on a memory channel. The operations queue may be formed of a high and low priority queue coupled in communication with the channel scheduler 510. The read, write and erase operations from the driver software are stored in the low priority queue and the high priority queue of the operations queue 512. The channel scheduler prioritizes the operations waiting in the high priority queue over the operations waiting in the low priority queue. The channel scheduler further prioritizes read operations waiting in either the high priority queue or the low priority queue over write and erase operations waiting in each respective queue.

The application or operating system software 502 includes instructions that when executed by a processor issues block memory access requests. The driver software 303 includes instructions that when executed by a processor provide an operations scheduler 503 to receive the block memory access requests.

The driver software 303 issues read, write, and erase operations to the plurality of NVMDs coupled to each of the plurality of memory channels in response to the block memory access requests. The high priority read, write and erase operations are stored in the high priority queue of the operations queue 512 by the driver software 303. The low priority read, write and erase operations are stored in the low priority queue of the operations queue 512 by the driver software 303. The operation of the driver software to schedule read and write operations is in part responsive to the application software or operating system making block memory access requests. The operation of the driver software to schedule read, write and erase operations is further responsive to garbage collection activity with the plurality of NVMDs.

The read, write erase operations correspond to application data requests, metadata requests, and garbage collection requests. Application data requests are block memory access requests made by the application software 502. Metadata requests are requests to store translations between a logical block number in a block device view and a physical block address identifying a unique memory block in an NVMD. Garbage collection requests correspond to operations issued by the driver software 303 to reclaim unused or invalid memory capacity in the NVMDs. Application data requests and metadata requests are stored in the high priority queue of the operations queue. Garbage collection requests are stored in the low priority queue of the operations queue. The driver software may provide fairness in execution of high and lower priority operations. The driver software monitors the number of outstanding high and lower priority operations in the high and low priority queues. In response to the number of outstanding low priority operations reaching a predetermined threshold, the driver software may throttle down the execution of the high priority operations in the high priority queue so that outstanding low priority operations are executed.

Each server memory card has a two-level scheduling hierarchy including an operation scheduler 503 at the driver level for each server memory card, and a channel scheduler 510 at the slave controller level for each channel controller 506A-506N as shown in FIG. 5.

The operation scheduler 503 takes into consideration the mix of operations issued against a logical view of the NVMDs. The operation scheduler 503 thinks of the collection of NVMDs at the level of flash channels 334A-334N and not at the level of the individual NVRAM dice 332A-332H.

The channel scheduler 510 is responsible for dealing with the specifics of the NVRAM dice 332A-332H behind the flash channels 334A-334N. The channel scheduler 510 orchestrates use of the shared address/data busses in each flash subchannel 335A-335H by the NVRAM dice 332A-332H to maximize performance of the server memory card.

At its level, the operation scheduler is responsible for making progress on all three types of operations (read, write, erase), in a fashion that allows overall progress on the workload of interest; making sure that low-latency operations such as reads don't end up getting queued behind longer-latency operations such as erases; making sure that the mixing of requests from application block requests, meta-data requests, and garbage collection requests are handled appropriately; and managing power consumption of the card (reads, writes, and erases consume different power, so the operation scheduler can control overall card power consumption by controlling how many of these are active at a time).

At its level, the channel scheduler is responsible for managing bus utilization for multi-phase operations with different latency—predictable latency such as reads, as well as varying latency such as writes and erases; prioritizing channel allocation for high-priority vs. low-priority operations; and within the high-priority operations, prioritizing low-latency operations to reduce blocking times at the application level. In response to the scheduled read, write, and erase operations with the plurality of NVMDs scheduled by the operations scheduler 503, a channel scheduler associated with a memory channel may schedule read operations, write operations, and erase operations to maximize channel utilization.

For example, in response to a set of one or more block memory access requests, the driver software schedules X NVMDs to perform read operations, Y NVMDs to perform write operations, and Z NVMDs to perform erase operations. The variables X, Y, and Z are responsive to the work load required by the application or operating system software and their sum (X+Y+Z) corresponds to the total number of NVMDs in the system (or alternatively the number of concurrently activatable NVMDs given a power budget). The selection of values for X, Y, and Z may be a function of the read to write ratio of the application workload requests and whether or not garbage collection is active with the plurality of NVMDs.

Garbage collection is a method of recovering memory space in each NVMD and may be activated for a number of reasons. Garbage collection may be activated when a ratio of currently used capacity to available capacity exceeds a first threshold and deactivated when the ratio falls below a second threshold different from the first. Alternatively or conjunctively, garbage collection may be activated for regions of memory locations in an NVMD that exceed a predetermined time limit of last access.

If garbage collection is inactive, values for X, Y, and Z may be selected to limit the impact of NVMD write and erase operations on NVMD read operations. Alternatively if garbage collection is inactive, values for X, Y, and Z may be selected to limit the impact on NVMD read latencies for NVMD read operations and to limit the impact on NVMD write latencies for NVMD write operations. If garbage collection is active, values for X, Y, and Z may be selected to match a rate of freeing capacity by the garbage collection activity to a rate of consumption of capacity by the application workload.

The first channel scheduler schedules L read operations, M write operations, and N erase operations for each memory channel in response to the scheduled read, write, and erase operations with the plurality of NVMDs scheduled by the operations scheduler 503. If L read operations, M write operations, and N erase operations are scheduled by the operation scheduler with the plurality of NVMDs coupled to a first memory channel, the first channel scheduler schedule the L read operations, the M write operations, and the N erase operations on the first memory channel to maximize channel utilization.

Early Write Termination

In FIG. 5, each of the one or more channel controllers 506A-506N includes an operations queue 512. The one or more channel controllers provide queuing and scheduling of memory operations on a flash memory channel 334 for each NVRAM 332 in each non-volatile memory device 312 coupled thereto.

In one embodiment of the invention, a write operation to write a block of memory into the NVMDs with NVRAM may take on the order of half a millisecond (0.5 msec). Read operations to NVRAM take much less time, are more frequent in some applications, and often stored in a queue with a high priority for execution. As a result, write operations may be delayed and stall an application or operating system software waiting for completion of the write operation.

However to maintain a high performance memory system for application software, it is desirable to have the server memory card 300 absorb a number of write operations (including data) and terminate the write operation early, before the associated data is written or completely into the NVRAM of the NVMDs. With the write operations absorbed into the server memory card, application software can continue to function normally. Otherwise, if write operations cannot be written in a timely fashion, the application software may need to wait for their completion.

One aspect of the invention is early write termination to absorb write operations into the server memory card. With early write termination, the server memory card should be able to assure storage of the associated data into NVRAM, regardless of a power failure or an error in a first write operation.

The early write termination process involves two different types of write operations, a standard write operation and a delayed write operation.

The standard write operation into an NVMD, consists of transferring data from a host DRAM 211,211' (where it has been placed by the application or operating system) into a buffer in the shared buffer pool 508, and then queuing up a write request in the operations queue 512 of the channel controller 510. The write request contains a pointer to the data buffer in the shared buffer pool holding the contents for the write request.

The standard write operation is used for storing normal writes, e.g., the update to a file block. Typically the granularity or size of a standard write is matched to a flash memory write page size (e.g., 4 KB). For the early write termination process, in the event of power failure before the write has happened or been completed, the hardware should assure or guarantee that if an operation is active at the channel controller level, it will in fact run to completion. While this may appear to be a simple matter of providing enough backup power to complete the operation, the challenge comes from the fact that NAND Flash may be unreliable. The server memory card should be prepared for the possibility that an attempted write operation will be unsuccessful in writing data to the initially requested location. Backup write locations in the backup locations registers 516 are used to provide for backup write operations or rewrites for the standard write operation.

The second type of write operation for early termination is a delayed write operation. This delayed write operation differs from the standard write operation in that usually the amount of data involved in a delayed write is small (e.g., 64 B), usually corresponding to the meta-data portion of a write request. It is inefficient to fill up an entire write-page worth of shared buffer area with meta data information and then request a write operation against the channel controller (which is what the standard write mechanism entails). The delayed write mechanism instead works by having the driver software perform a setup operation with the channel controller prior to writing any data into a region (a delayed write buffer) of the shared buffer pool. This region in the shared buffer pool may or may not be the same as the delayed write buffer area 518,520 used for a standard data write. The contract that the server memory card offers to the host is that the server memory card will write the meta data contents of this delayed write buffer region into the specified NVMD block in the event of a power failure. Otherwise, the meta data contents in the delayed write buffer of the shared buffer pool is left as is and readily accessible.

This delay write operation process allows smaller writes to be incrementally added to a delayed write buffer, while preserving the guarantee that all of these writes will make it into a persistent NVMD storage area in the event of an unexpected power outage. To complete the early write termination mechanism, issues of a full write buffer and write errors are addressed. A new procedure is introduced that handles what happens when the incremental writes end up consuming all of the space in a delayed write buffer. In case the accumulated meta data needs to be written into an NVMD, the mechanisms and processes for handling the possibility of a write error in the delayed write case are used, such as backup write registers.

Referring now to FIG. 5, to facilitate early write termination for delayed write operations, each of the one or more channel controllers 506A-506N includes at least one delayed write operations request register 514 for each NVMD to store the write operation requests that have been delayed (also referred to as delayed write operations) for the respective NVMD. The delayed write operations request register 514 is later read to execute the delayed write operation.

Each slave controller 402 further includes a shared buffer pool 518 coupled to the one or more channel controllers 506A-506N. The storage locations of the shared buffer pool 508 are shared amongst the one or more channel controllers 506A-506N of the slave memory controller 402. The shared buffer pool 508 includes at least one delayed write buffer 518,520 per NVMD coupled to each channel controller. The shared buffer pool 508 and the write buffers defined therein are a volatile memory such as static random access memory to provide a fast low power consumption memory. The at least one delayed write buffer 518,520 stores the write data associated with the delayed write operations stored in the set of delayed write operations request registers 514. The data bus of each flash channel 334 is coupled to the shared buffer pool 508 to read the associated data from the delayed write buffers 518,520 and write it out to the NVRAM 332A-332H of an NVMD 312. The write data stored in the delayed write buffers should be written into the NVMDs 312 before a power failure. Furthermore, a backup write process (rewrite) should be provided to be sure the write data can be written into the NVMDs of the server memory card.

Each of the channel controllers 506A-506N further includes a channel scheduler 510 to control the queuing and scheduling of memory operations to the NVMDs 312 for each flash channel 334A-334N. The channel scheduler 510 can prioritize and schedule delayed write operations over other types of operations that are to be performed with the NVMDs. In one case, if a delayed write operation is stored in the delayed write operations register 514 for an NVMD, the scheduler prevents other operations from being executed with that NVMD until the delayed write operation has been completed. In another case, if a delayed write operation is stored in the delayed write operations register 514 for an NVMD, the channel scheduler 510 permits a limited set of operations to be executed with that NVMD having the delayed write operation. For example, the limited set of operations that may be executed with an NVMD having a delayed write operation may comprise a read operation. Once the delayed write operation has been completed, the limit on the type of operations to execute can be lifted. Of course if an operation is currently being executed, the channel controller completes any currently executing operations with the NVMD prior to executing a delayed write operation for the NVMD, To provide power to the server memory card in the event of a power failure, the server memory card includes a card level power source mounted thereto. Expected types of power failure to the server memory card is a complete loss of power to the host (host power failure) or loss of power to the socket to which the edge connector of the server memory couples (edge connector power failure). The card level power source stores charges to provide a power capacity to a given server memory card 300 for a predetermined period of time to complete any currently pending or executing operation with NVMDs, as well as any delayed write operations whose request is stored in the delayed write request register 514 for each channel controller 506A-506N. The predetermined period of time may be the average time needed to complete a number of write operation requests. In one embodiment, the capacity of the card level power source is sufficient to store and provide power for at least six write cycles.

In one embodiment, as shown in FIG. 3A, the card level power source is one or more power capacitors 310. In an alternate embodiment, the card level power source may be a rechargeable battery mounted to the server memory card. In another embodiment, the card level power source may be a remote located rechargeable battery electrically coupled to card level power of the server memory card through power and ground cables. Power capacitors 310 are used in low profile form factors, such as a one unit server, where the slot size may prevent use of other alternatives.

As shown in FIG. 4, the server memory card 300A further has power failure circuitry 411 to detect and manage a loss of power to the compute server and the server memory card. The power failure circuitry can charge the power capacitors from power at the edge connector (slot power). The power failure circuitry can also sense and detect a loss of power and switches over to provide card level power to the circuits on the server memory card to which it couples.

In response to a power failure, the one or more memory controllers receive card level power from the card level power source and change the scheduling of memory operations to the one or more NVMDs in each of the one or more memory channels. Current write operations that are pending are completed and then the delayed write operations, if any.

Computer memory can be error prone. NVRAM may have an error for example when one or two bits in a block are not written properly. This may be due to a worn bit location or from a weak programming voltage during a program cycle. After writing a block, the NVRAM verifies that the block was written properly. If the block was unable to be written without error, a backup write (rewrite) process is provided to get the delayed write data stored to a different block in the same or possibly different NVRAM device.

The server memory card 300 prepares for errors by detecting failures in the write operations and backing up the failed write operations with rewrites to different memory locations. In the event of an error or failure in a write operation, the write operation is to be retried but with a different address. Each channel controller 506A-506N includes one or more backup location registers 516 for each flash subchannel 335A-335H of the NVMDs 312 coupled to the channel controllers. The one or more backup location registers 516 store NVMD backup addresses for each flash subchannel 335A-335N to assure pending operations on the subchannels can be completed.

Figure 6:
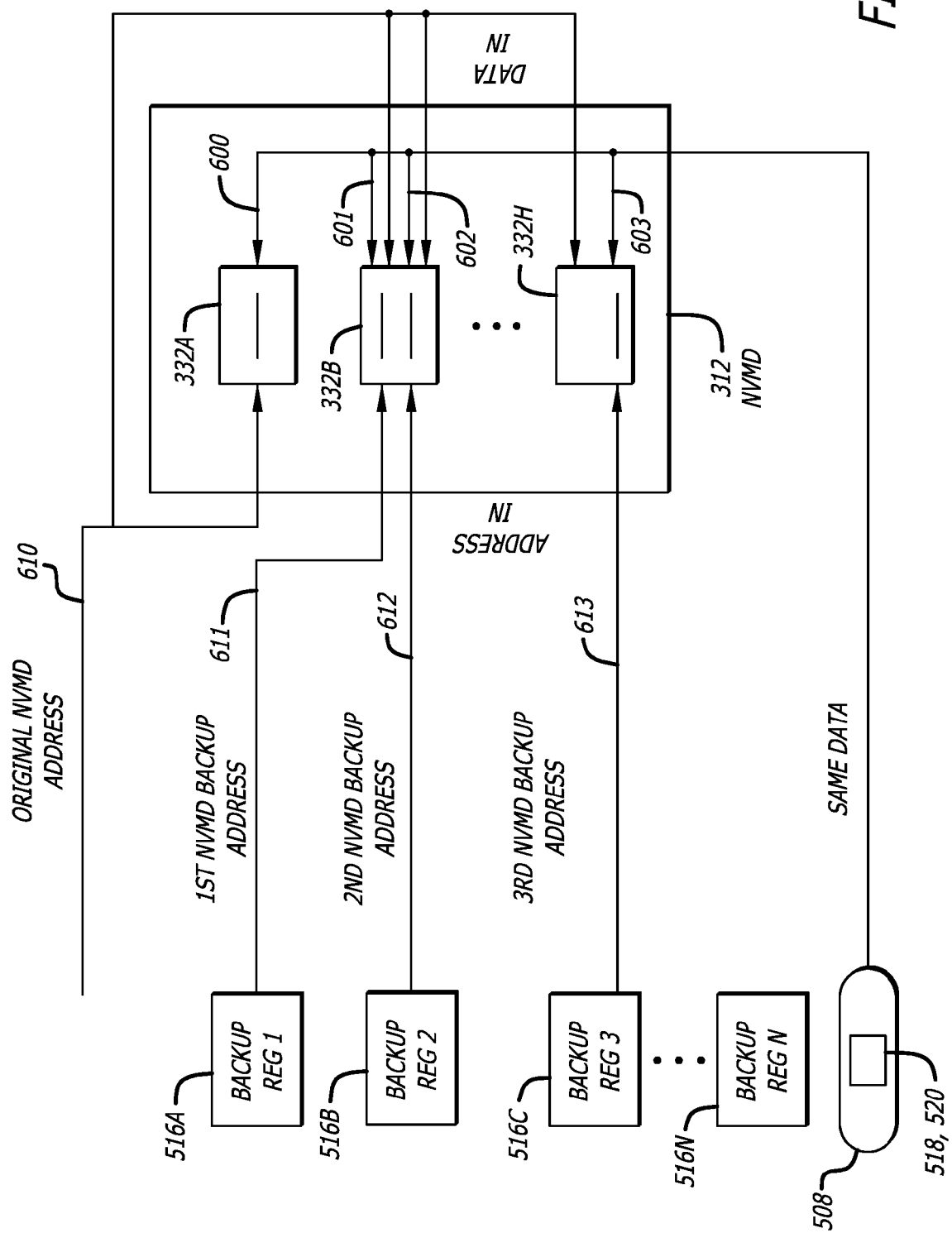
FIG. 6 is a diagram illustrating backup write operations to assure that data is stored in the event of one or more write errors into NVMDs.

Referring to FIG. 6, the backup location registers 516A-516C are used to point to data written into a different or backup memory locations into the NVMD 312 if there is a failed write operation to the original location 600 pointed to by the initial address 610. For example, in response to a failed write operation of data from a first location in the shared buffer pool to a memory location associated with the original NVMD address of an NVMD, the channel controller tries a first rewrite 601 of the data from the first location into another memory location at a first NVMD backup address 611 pointed to by the first backup location register 516A. If the first rewrite 601 is successful (the write of data from the first location in the shared buffer pool to the first NVMD backup address was successful), then the channel controller provides an indication that the write was successful verifying that data was stored into the memory location pointed to by the first NVMD backup address 611. With a successful write of data using the first NVMD backup address pointed to by the first backup location register 516A, the first backup location register 516A is replenished with a new NVMD address pointing to an unused memory location into which a data write operation can be absorbed. However, the attempt at the first rewrite 601 may not be successful.

If the first rewrite 601 is not successful (the write of data from the first location to another location at the first NVMD backup address failed), the channel controller tries a second rewrite 602 of the data from the first location into another memory location associated with a second NVMD backup address 612 pointed to by a second backup location register 516B. If the second rewrite 602 is successful (the write of data from the first location in the shared buffer pool to the second NVMD backup address was successful), then the channel controller provides an indication that the write was successful and that data was stored into the memory location pointed to by the second NVMD backup address 612. With a successful write of data using the first NVMD backup address pointed to by the first backup location register 516A, the first and second backup location registers 516A-516B are replenished with new NVMD addresses pointing to unused memory locations into which data write operation can be absorbed. These addresses will differ from the addresses 610-612 previously used. However, the attempt at the second rewrite 602 may not be successful.

If the second rewrite 602 is not successful (the write of data from the first location to another location at the second NVMD backup address failed), the channel controller tries a third rewrite 603 of the data from the first location into another memory location associated with a third NVMD backup address 613 pointed to by a third backup location register 516C. If the third rewrite 603 is successful (the write of data from the first location in the shared buffer pool to the third NVMD backup address was successful), then the channel controller provides an indication that the write was successful and that data was stored into the memory location pointed to by the third NVMD backup address 613. With a successful write of data using the third NVMD backup address pointed to by the third backup location register 516C, the first, second, and third backup location registers 516A-516C are replenished with new NVMD addresses pointing to unused memory locations into which data write operation can be absorbed. These addresses will differ from the addresses 610-613 previously used. It has been determined that by providing three backup write operations, the probability that data will be stored is substantially high such that further backup write operations are not needed. However, additional backup write operations can be provided with sufficient time provided by the backup card level power source.

In addition to writing the write data from the shared buffer 508, the original NVMD address 610 is written by the channel controller into the NVMD 312. If the NVRAM 332A-332H in the NVMD 312 is NAND flash memory, the write operation and rewrite operations corresponds to writing of a NAND flash write page and the original NVMD address 610 is written into the spare area (typically 128 bytes) associated with the NAND flash write page. The original address is stored so that it can be associated with the write data that is stored in a different address location and the compute server, application, and/or operating system software can read the write data using the original address.

During a power failure, the power capacity of the card level power source is sufficient to support a number of attempts to rewrite data from the first location into the NVMD addresses pointed to by the one or more backup location registers. After a power failure, it is expected that power will be restored and the server memory card will undergo a post power failure recovery.

During post power failure recovery, address locations in the NVMDs 312 are examined corresponding to the addresses stored in the backup location registers prior to power failure to determine if any have been used. If a backup location register was used, the channel controller determines the original NVMD address that had a write failure and triggered the use of the NVMD backup address stored in one of the backup location registers.

Figure 14:
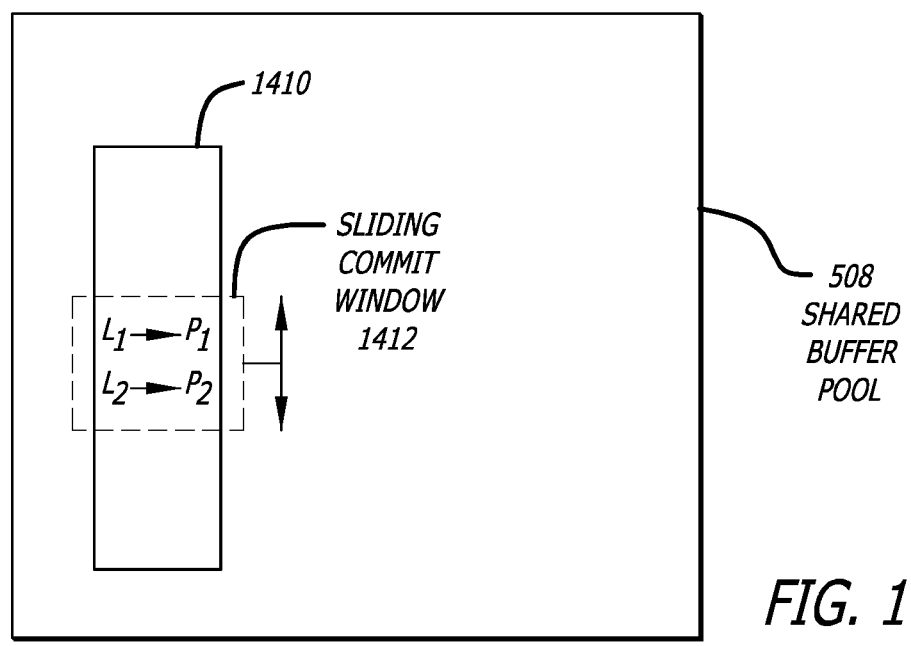
FIG. 14 is a block diagram illustrating storage of a translation log file of metawrites and a sliding commit window to safeguard data from power failures and unsuccessful writes.

As part of the post power failure recovery process, the driver software (or firmware if running on an embedded processor) first examines a meta-data log 1410 illustrated in FIG. 14 (which is maintained using the delayed write mechanism) to identify the backup or rewrite address locations to which writes were attempted before the power failure. The meta-data log 1410 is stored into an NVMD when a power failure occurs. The meta-data log 1410 has a known structure and one can efficiently scan for its whereabouts in the NVMDs during post power failure recovery.

The objective of the recovery process is to determine whether or not the write data actually ended up in the requested location. The write data may not have been stored in the requested location because of device write failures and the backup or rewrite process using a backup location to write the data. If the data was not stored at the requested location but at the backup location, fixup procedures are followed to allow the data to be accessed.

Starting with the original write location obtained from the meta data log 1410, the recovery process 1) Identifies the channel controller that was involved in writing the data associated with the original write location; 2) Identifies the last known backup address locations associated with the channel controller; and 3) Scans the backup locations one at a time in reverse order to determine whether or not a backup location was used. Each backup location is scanned in reverse order to see if it is still in erased state. The erased state indicates that data was not written using the associated backup address during the power failure. If the backup location is not in an erased state, a check is made to determine if the address stored with the data at the given location matches the requested target. When a match is found or if a match was never found, it can be determined whether or not any of the backup locations were used or not. If a match is found or if a match is never found, the address for the actual location of the data can be determined.

Assuming the data was stored at a backup location, the following fixup procedures are followed: 1) Scanning through the contents of the found block to update other recovery state; 2) Updating the translation between logical block and physical block to point to the (possibly alternate) physical block; and 3) Replenishing any alternate locations that might happen to have been used up.

Methods for Early Write Termination

Figure 7:
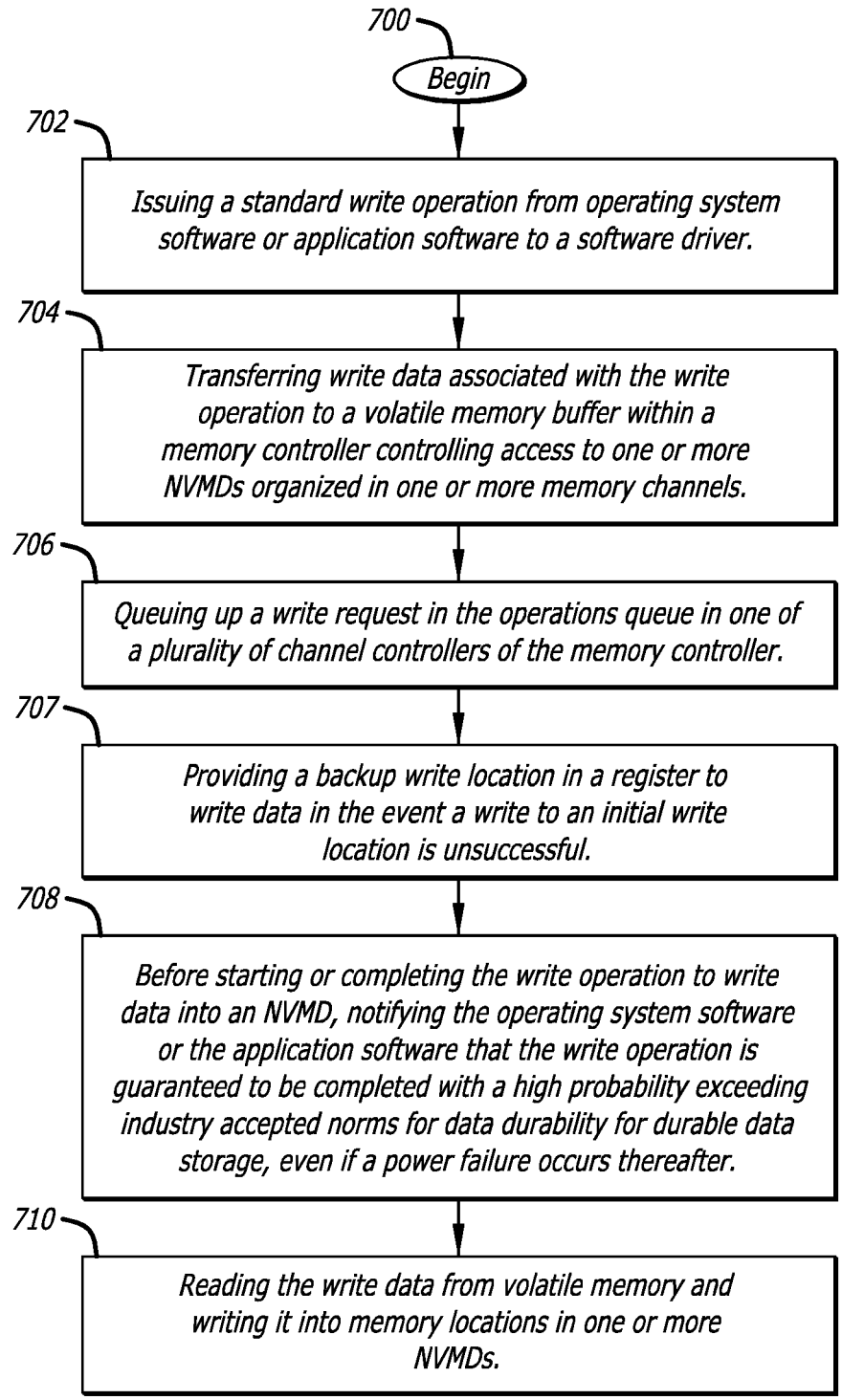
FIG. 7 is a flow chart illustrating a standard write operation process for an early write termination procedure.

Referring now to FIG. 7, a method for writing data into non-volatile memory in the server memory card 300 is now described. A software driver or firmware stored in memory (e.g., ROM 423, NVM 424, or DRAM 425) having instructions executed by a processor (e.g., processor 422) or a controller may perform a number of operations to write data into the NVMDs of the server memory card.

The method begins with process block 700 and then goes to process block 702.

At process block 702, a standard write operation from operating system software or application software to the software driver is issued. The process then goes to process block 704.

At process block 704, the write data associated with the write operation is transferred to a data buffer (e.g., a buffer in the shared buffer pool) in the slave memory controller 402. The slave memory controller 402 generally controls access to the one or more NVMDs organized within the memory channels. The process then goes to process block 706.

At process block 706, a write request operation is issued with an initial write location and queued up in one of the one or more channel controllers of the slave memory controller. Each of the one or more channel controllers controls one or more NVMDs organized on the same memory channel. The process then goes to process block 707.

At process block 707, a backup write location is provided in a backup location register to write data in the event a write to the initial write location is unsuccessful. The process then goes to process block 708.

At process block 708, before start or completion of the write operation to an NVMD 312 with the write data, the operating system software or application software is notified that the write operation into the non-volatile memory is completed with a high probability (guaranteed completion) even though it may not have occurred. The early write process continues with reference FIG. 8, where one or more delayed write operation processes are described.

The probability of completing the write operation exceeds industry accepted norms or practices for data durability for durable data storage, even if a power failure occurs after giving notice. For a computer system, this probability may be considered as being greater than ninety five percent or in the range between ninety-five percent and one hundred percent exclusive. For a server system, this probability may be considered as being greater than ninety nine percent or in the range between ninety nine percent and one hundred percent exclusive.

The early write termination notification may be issued at different times before the actual write operation of date into the NVMD is completed. In one case, the notification of the guaranteed write completion is issued immediately after the initiation of the write operation and well before the write operation of data into the NVMD is completed. In another case, the notification of the guaranteed completion may be issued in a time interval less than fifty percent of the write latency of the NVMD. In another case, the notification of the guaranteed completion is issued in a time interval less than twenty percent of the write latency of the NVMD. In the case that the NVRAM in the NVMD is NAND flash memory, then the notification of the guaranteed completion may be issued within fifty microseconds of the initiating of the write operation.

The write operation is guaranteed to be completed when a power fail occurs, if the server memory card switches to use a card level power source, and any current write operations of write data from the volatile memory buffer to NVMDs is completed. A further guarantee of write operation completion may be had if backup write operations (rewrites) are provided if a write is unsuccessful. If a power failure occurs, the process may wait for completion of a first write operation to write a first write data from the shared buffer pool to a first NVM location at a first NVMD address in a flash channel. The results of the first write operation may be examined to determine if it was successful or unsuccessful. If the first write operation was unsuccessful, then a rewrite of the first write data is attempted at an NVMD backup address. The rewrite attempts to write data from the shared buffer into a different NVMD location pointed to by another NVMD backup address. The NVMD backup address is provided by a backup register 516 in the channel controller 506.

Figure 8:
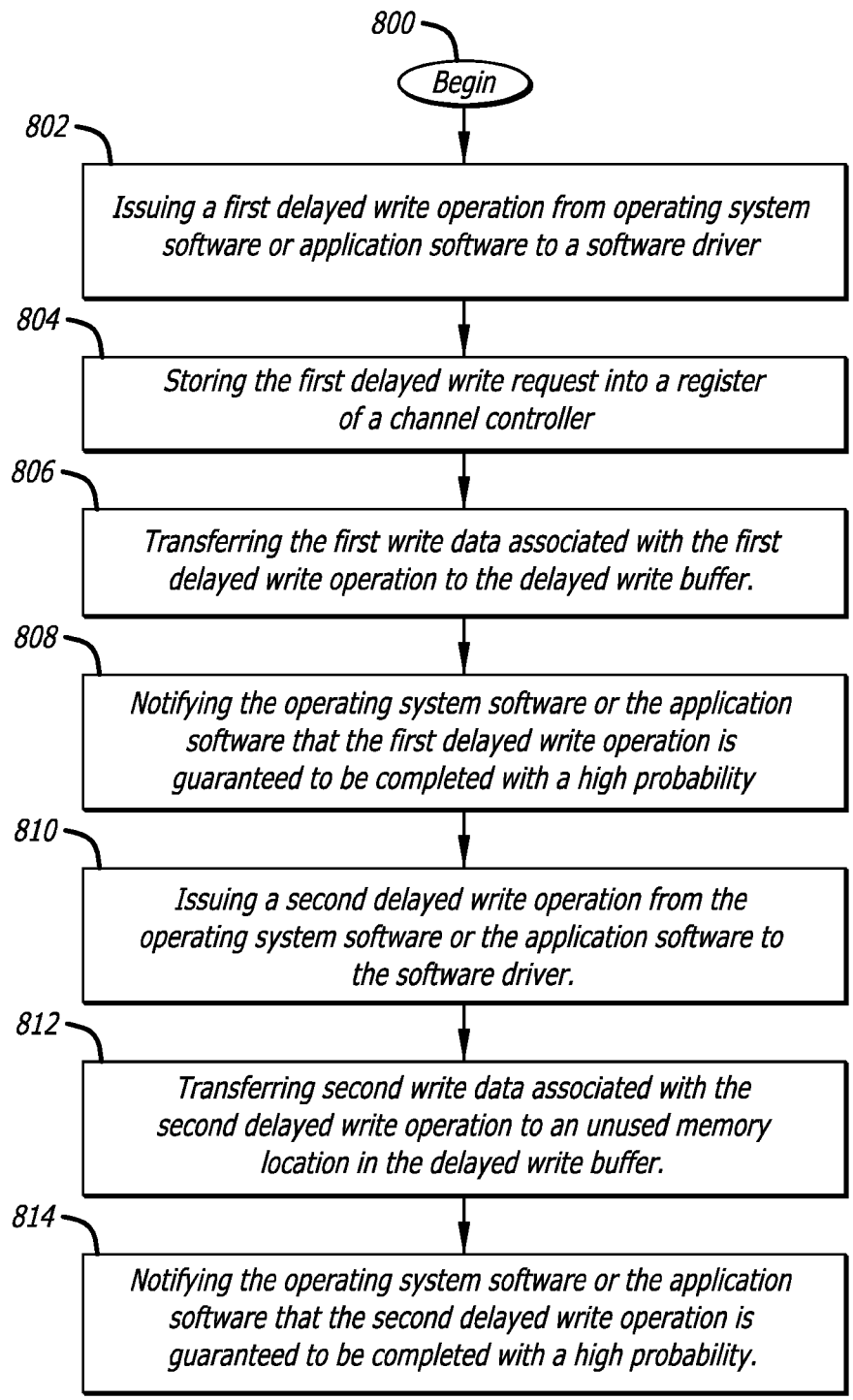
FIG. 8 is a flow chart illustrating a delayed write operation process for the early write termination procedure.

Referring now to FIG. 8, one or more delayed write operation processes are now described to further process an early write termination with the server memory card 300. Instructions of a software driver stored in memory (e.g., ROM 423, NVM 424, or DRAM 425) or firmware and executed by a processor (e.g., processor 422) or a controller may perform a number of operations to perform a delayed write operation of data in the server memory card. The method begins with process block 800 and then goes to process block 802.

At process block 802, a first write request operation is issued from the operating system software or application software to a software driver. The process then goes to process block 804.

At process block 804, the first write request operation is stored into the delayed write request register 514 in the channel controller 516 of the slave memory controller 402.

As the first write request operation is an operation that is going to be delayed, it may be referred to herein as a first delayed write request. The first delayed write request and any subsequent delayed write request for the same flash subchannel are accumulated or batched together and stored into same delayed write buffer 514. With the first delayed write request for a flash subchannel, the software driver/firmware sets up the channel controller 516, the delayed write buffer, and a register entry or row in the delayed write request register 514. While the delayed write buffer in the slave memory controller 402 can quickly store the accumulated write data for delayed write requests, power failure procedures are used to safeguard the write data as the shared buffer pool 508 is formed using volatile memory. The entry in the delayed write request register 514 identifies a starting address (e.g., the delayed write buffer starting address) of the delayed write buffer 518,520 in the shared buffer pool 508 where the delayed write data is normally accumulated without being written into the NVMDs. The entry in the delayed write request register 514 further identifies a first starting NVMD address at which the delayed write buffer may be stored into the one or more NVMDs in the event of a power failure to assure non-volatile data storage.

Figure 9:
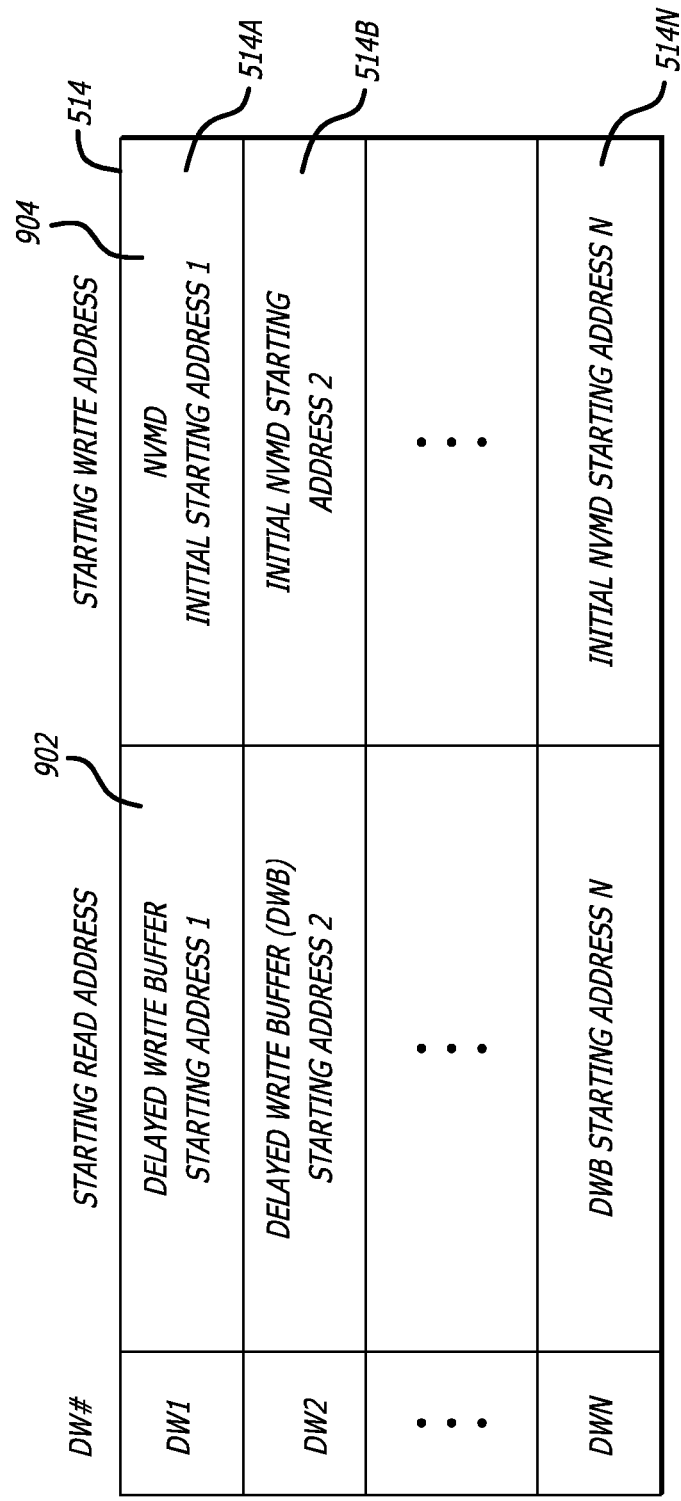
FIG. 9 is a diagram illustrating a delayed write request register with data fields of a delayed write buffer starting address and an NVMD initial starting address for each delayed write request stored therein.

Referring momentarily now to FIG. 9, a block diagram of a table of values stored in the delayed write request register 514 is illustrated with a plurality of delayed write request stored therein. Each row in the delayed write request register 514 includes data fields of a delayed write buffer starting address 902 and an NVMD initial starting address 904 for a delayed write request. The delayed write buffer starting address 902 is the starting read address into the delayed write buffer in the shared buffer pool from where to start reading or storing write data. The NVMD initial starting address 904 or first NVMD address is the initial starting write address to write data into the NVMDs in the event of a power failure. The NVMD initial starting address 904 may not be the actual address where data is stored if there is a write failure and a backup address is used.

In one embodiment of the invention, there can be one delayed write operation queued for each flash subchannel 335 within the NVMDs. Thus, number of rows in the table of values stored in delayed write request register 514 is the total number of flash subchannels 335 within the NVMDs that are being managed by the channel controller 412. Each row refers to a single delayed write buffer for that flash subchannel, and the starting address of the NVMD location where the buffer contents are to be deposited in the event of a power outage.

Delayed write requests for the same flash subchannel all use the same delayed write buffer and the same starting NVMD address for that buffer in the event of power failure. As discussed further herein, the delayed write mechanism merges multiple writes to the same NVMD write page together to improve write efficiency while still providing the safe guard against power failure. For example, in one embodiment of the invention, a delayed write buffer may be 4 kilobytes (KB) in size. The NVMD start address refers to an NVMD write page, which is 4 KB in size as well. An individual delayed write request may be in the range of 16 to 64 bytes in size. Thus, assuming 64 bytes in size, up to 256 delayed writes can be merged/batched together and stored into the same delayed write buffer.

At process block 806 of FIG. 8, the first write data associated with the first delayed write operation is transferred into the delayed write buffer 518,520 at the delayed write buffer starting address 902 pointed out by the delayed write request register 514. The process then goes to process block 808.

At process block 808, before completion of the first delayed write operation into an NVMD, the operating system software or the application software is notified that the first delayed write operation is guaranteed to be completed with a high probability. The probability that the data is stored exceeds industry accepted norms for data durability for durable data storage, even if a power failure is to occur. The process then goes to process block 810.

At process block 810, a second write operation that is to be delayed is issued from the operating system software or the application software to the software driver. As the second write request operation is an operation that is going to be delayed, it may be referred to herein as a second delayed write request. As this second delay write operation is another metadata write, it can be accumulated or batched with the first delayed write request in the memory locations within the delayed write buffer 518,520. The process then goes to process block 812.

At process block 812, the second write data associated with the second delayed write operation is transferred to one or more unused memory locations in the delayed write buffer 518,520. The process then goes to process block 814.

At process block 814, before completion of the second delayed write operation to an NVMD, the operating system software or the application software is notified that the second delayed write operation is guaranteed to be completed with the high probability.

The first and second delayed write operations are guaranteed to be completed even if a power failure occurs. If a power failure does occur, a power failure process may be invoked.

Figure 10:
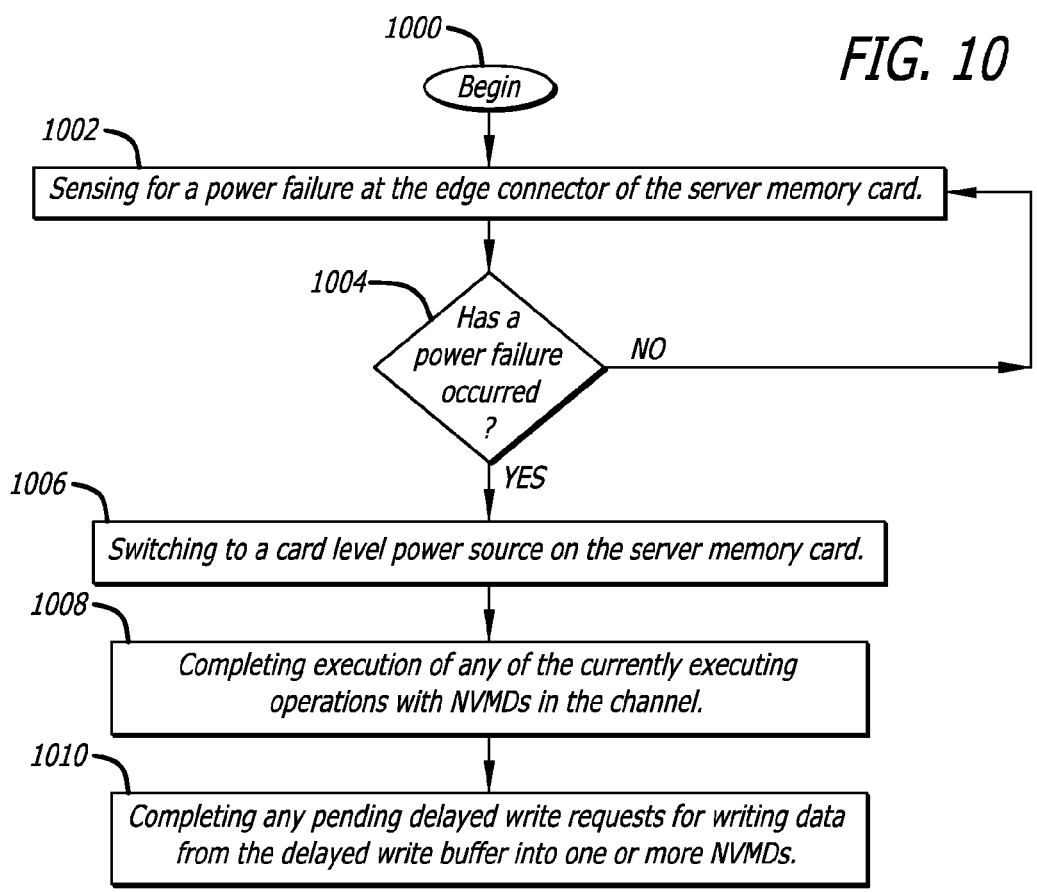
FIG. 10 is a flow chart illustrating a power failure process that may be executed in the event of a power failure.

Referring now to FIG. 10, a power failure process may be executed if a power failure is detected. The process begins at process block 1000 and then goes to process block 1002.

At process block 1002, the power failure circuit 411 senses for a power failure at the edge connector 301 of the server memory card 300. The process then goes to process block 1004.

At process block 1004, a determination is made if a power failure has occurred at the edge connector. If a power failure has occurred at the edge connector, the process goes to process block 1006. Otherwise, the process returns to process block 1002 and continues to sense for a power failure. Assuming power failure has occurred and been detected, the process goes to process block 1006.

At process block 1006, the power failure circuit switches to use the card level power source provided on the server memory card to power the circuits therein. The process then goes to process block 1008.

At process block 1008, execution of currently executing operations with NVMDs in the flash channels, if any, is to be completed to make the flash channels available for any pending delayed write operations.

At process block 1010, execution of any pending delayed write requests for writing data from the delayed write buffer into the one or more NVMDs is to be completed. The writing of data begins with a first starting NVMD address.

The delayed write operations are guaranteed to be completed even if there are a couple of unsuccessful write attempts into the NVMDs when trying to store the write data. If a write failure does occur, a write failure process may be invoked.

Figure 11:
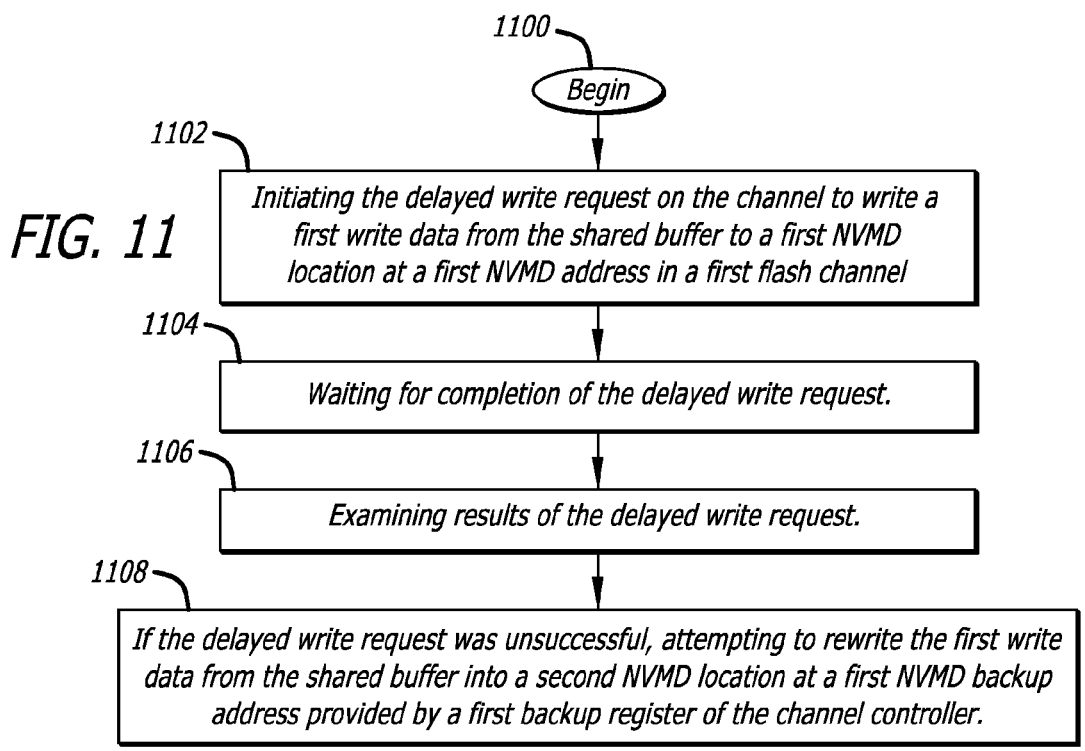
FIG. 11 is a flow chart illustrating a write failure process to assure completion of a delayed write operation in the vent of a write failure.

Referring now to FIG. 11, a write failure process may be executed to further guarantee completion of a delayed write operation if a write failure is detected. The process begins at process block 1100 and then goes to process block 1102.

At process block 1102, the delayed write request on the flash channel is initiated. The channel controller 506A-506N reads first write data from the delayed write buffer 518 in the shared buffer pool 508 using the delayed write buffer staring address 902 pointed to by the delayed write request register 514. The channel controller 506A-506N begins writing the first write data into a first NVMD location over the flash channel at an initial NVMD starting address 904 pointed to by the entry in the delayed write request register 514. The process then goes to process block 1104.

At process block 1104, the process waits for completion of the delayed write request. The process then goes to process block 1106.

At process block 1106, results of the delayed write request are examined. The process verifies that the delayed write operation was successful in being completed without errors or was unsuccessful as it could not be completed without errors. If the delayed write operation was successful, the process can return to begin writing any further delayed write requests. However if the delayed write operation was unsuccessful, the process then goes to process block 1108.

At process block 1108, an attempt to rewrite the first write data from the delayed write buffer 518,520 of the shared buffer pool 508 is made. The rewrite attempts to write data into the NVMDs beginning at a different NVMD location pointed out by an NVMD backup address provided by the backup registers 516 in the channel controller 506A-506N. The rewrite attempts may be repeated multiple times starting at different NVMD backup addresses provided by the backup registers 516 until the delayed write operation is successful.

The delayed write buffers 518,520 have a finite size and can store a limited number of delayed write operations. The level of unused storage capacity and used storage capacity can be monitored to determine if another delayed write operation can be absorbed. If a delayed write buffer is too full to accept another delayed write operation, a process may be invoked to handle a full delayed write buffer and begin emptying data there-from.

Figure 12:
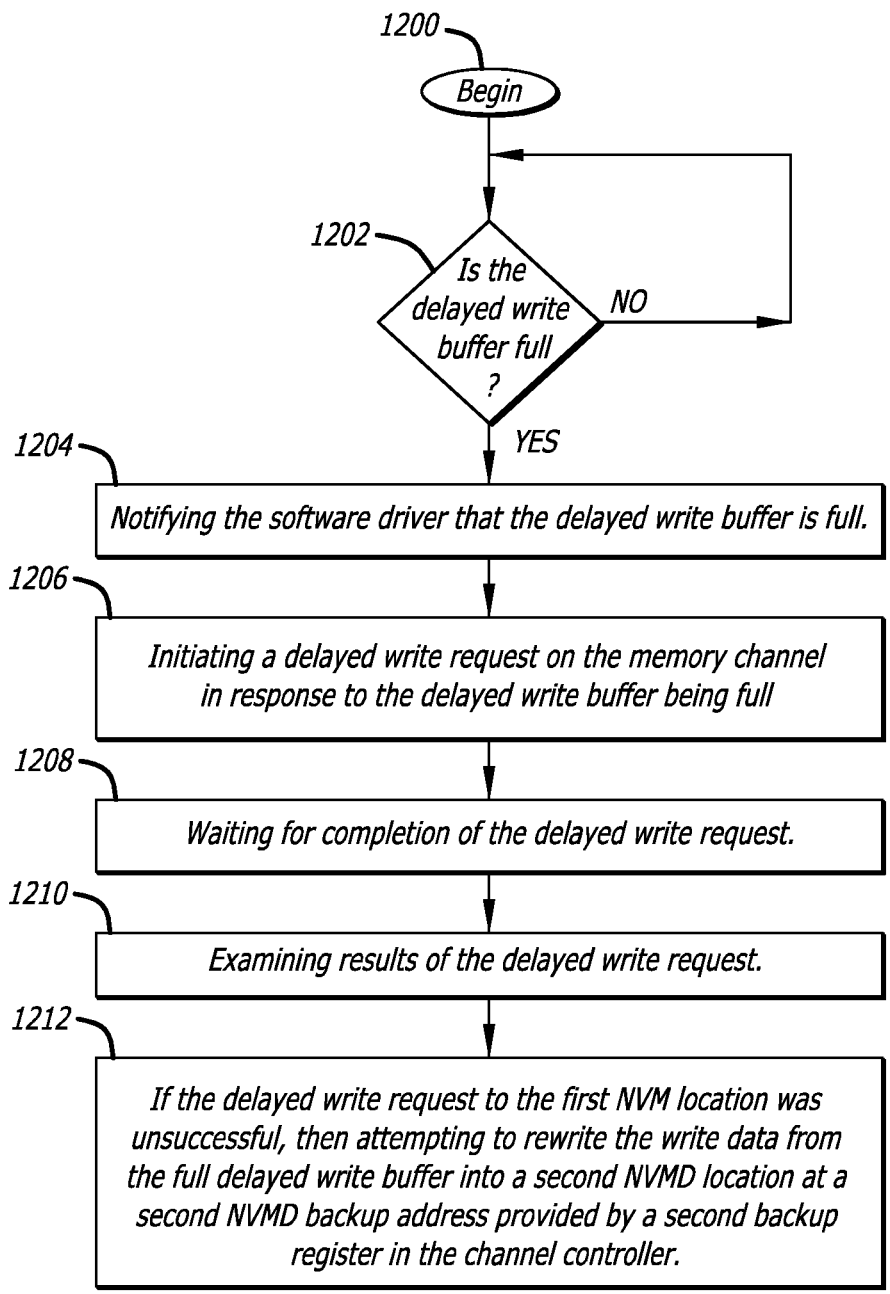
FIG. 12 is a flow chart illustrating a full buffer write process in the event that a delay write buffer becomes full or nearly full.

Referring now to FIG. 12, a full buffer write process may be executed. The process begins at process block 1200 and then goes to process block 1202.

At process block 1202, the used and/or unused capacity of the delayed write buffers 518,520 are monitored to determine if they are full. A delayed write buffer is detected to be full if it is absent a sufficient number of unused memory locations to store one or more blocks of write data. If not the process block 1202 is repeated. However if it is detected that a write buffer is detected to be full, then the process then goes to process block 1204.

At process block 1204, the software driver that initiates the delayed write requests is notified that the delayed write buffer is full. In this case, further write requests may be issued to other flash channels and NVMDs that do not have a delayed write buffers that are full. The process then goes to process block 1206.

At process block 1206, a delayed write request is issued on the flash channel in response to the delayed write buffer being full. The channel controller 506A-506N tries to begin the process of emptying out the delayed write buffer to free it up so store further write request operations. The delayed write request attempts to write the write data from the full delayed write buffer into a first NVMD location at a first NVMD address in an NVMD pointed out by the initial NVMD starting address 904. The process then goes to process block 1208.

At process block 1208, the process waits for completion of the attempt at the delayed write request into the NVMDs. The process then goes to process block 1210.

At process block 1210, results of the delayed write request are examined. The process then goes to process block 1212.

At process block 1212, if the delayed write request to the first NVMD location was unsuccessful, then a rewrite is attempted. An attempt is made to try and rewrite the write data from the full delayed write buffer into a second NVM location at a second NVMD backup address provided by a second backup register in the first memory channel controller. The rewrite attempts may be repeated multiple times starting at different NVMD backup addresses provided by the backup registers 516 until the delayed write operation is successful.

Meta Data Write Operations

Most non-volatile memory either require an erase operation prior to writing, or benefit from an erase-style operation for improved write performance. Examples of the first kind of non-volatile memory that are erased prior to writing includes NOR and NAND flash memory. An example of a second kind of non-volatile memory that benefits from an erase-style operation for improved write performance includes phase change memory. Non-volatile memory often stores data in block quantities.

Both of these kinds of non-volatile memory benefit from a process that first pre-erases regions of the memory, and then carries out all writes by absorbing them into the pre-erased regions. When an NVMD runs out of pre-erased regions, a garbage collection process can be employed to relocate valid blocks and reclaim usable space by erasing a region whose valid blocks have all been relocated elsewhere.

In either case, since the same logical block can now reside in potentially different physical locations, one needs to store some meta-data information that associates the translation from a logical block L to a physical block P.

Figure 13:
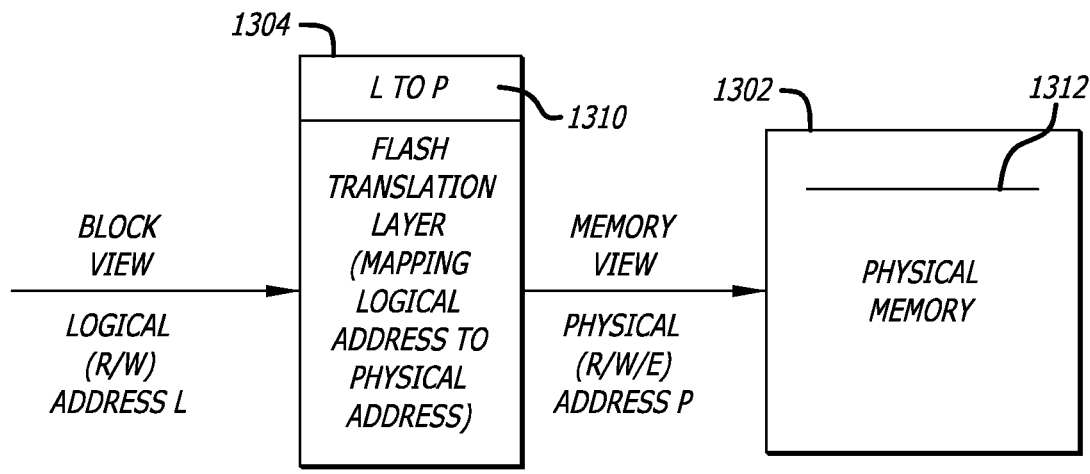
FIG. 13 is a block diagram illustrating different views or hierarchical levels of abstraction seen by subsystems in the compute server over the memory channel.

Referring now to FIG. 13, in a block or logical view, application and operating system software view the reading and writing of blocks of data using a logical address L. The server memory card operates in a memory of physical view of the NVMDs making up physical memory 1302 using a physical address P. The server memory card reads blocks of data, erases and writes blocks of data at physical memory locations 1312 pointed to by the physical address P.

An application or operating system trying to write to a location L in the NVMDs with flash memory may not be able to use a physical location L as it already has data stored there or physical location L has yet to be erased so a write can occur. Accordingly, a different physical location P may be used to store the data into flash memory of the NVMDs.

Thus, a pointer or translation from address L to address P of a flash translation layer 1304 also needs to be stored into the flash memory of the NVMDs so that the application can recall the information that it thought was stored at address L. This pointer or translation for a logical address L to a physical address P is referred to herein as metadata 1310. Metadata 1310 points to physical memory locations 1312 in the physical memory space 1302.

Storing one metadata does not use a full block of flash memory. It is therefore wise to group or batch a plurality of metadata together into a single block write into flash memory. Furthermore, the server memory card can commit to writing the batched metadata into the NVMDs in an absorbed state similar to the delayed writes described previously that are safeguarded from power failure. A metadata write that is delayed as a result of being batched together may be referred to herein as a metawrite. The metawrites are batched together to write into one or more blocks of flash memory. However, the number of outstanding writes that can be batched together is constrained due to the safeguards to power failure.

Referring now to FIG. 14, the shared buffer pool 508 in the slave memory controller 402 may further store a translation log file 1410. Alternatively, the translation log file 1410 can be stored in other storage (SRAM, DRAM, or buffer) located with the slave memory controllers 402 or master memory controllers. The translation log file 1410 includes the metawrites indicating the translations from logical addresses L1,L2 to physical addresses P1,P2. A sliding commit window 1412 is used to guarantee the metawrites will be stored in the NVMDs along with the associated data to safeguard against power failures and unsuccessful writes.

Referring now to FIG. 15, a method of writing data into non-volatile memory into an expansion memory card such as the server memory card 300 is now described. A software driver stored in memory (e.g., ROM 423, NVM 424, or DRAM 425) and executed by a processor (e.g., processor 422) may perform a number of operations to write data into the NVMDs of the server memory card. With flash memory, the software driver provides a block device view of the flash memory devices in the NVMDs. A write operation for the flash memory not only causes write data to be stored but further stores a translation between a logical block number in the block device view and a physical block address that identifies a unique memory block in the flash memory devices. The method begins with process block 1500 and then goes to process block 1502.

At process block 1502, a first data write operation is issued from the operating system software or application software to the software driver for a first write data. The first data write operation is a standard write operation. It is not a delay write operation. The process then goes to process block 1504.

At process block 1504, first write data is transferred to a volatile memory buffer within the slave memory controller 402. Recall that the slave memory controller 402 controls access to the one or more NVMDs 312 organized in the one or more flash channels 334A-334N and the NVRAM 332A-332H therein. The process then goes to process block 1505.

At process block 1505, the first write request is queued in the operations queue in a channel controller of the slave memory controller.

At process block 1506, the first data write operation is initiated by the channel controller to transfer the first write data from the volatile memory buffer to one or more NVMDs coupled to the channel controller. Each of the one or more channel controllers 412A control access to one or more NVMDs 312 organized on the same flash channel 334A-334A. The process then goes to process block 1508.

At process block 1508, a second metadata write operation is requested from operating system software or application software to a software driver for a second write data. Metadata write operations are subject to a delayed write operation. The process then goes to process block 1510.

At process block 1510, in response to receiving the second metadata write operation, a delayed write request is stored in the delayed write request register 514 in a channel controller of the slave memory controller 402. The stored delayed write request identifies a starting address of a delayed write buffer 518,520 in the volatile shared memory buffer pool 508 of the slave memory controller 402. The stored delayed write request further identifies a first starting NVMD address to which second write data is to be stored in a memory channel comprising one or more NVMDs. The process then goes to process block 1512.

At process block 1512, the second write data associated with the second metadata write operation is transferred to the delayed write buffer. The process then goes to process block 1514.

At process block 1514, before completion of the first write operation and the second metadata write operation to one or more NVMDs, the operating system software or the application software is notified that the first write operation and the second metadata write operation are guaranteed to be completed with a high probability. This probability exceeds industry accepted norms or practices for data durability for durable data storage, even if a power failure occurs thereafter.

Additional data write operations and metadata write operations can be issued, transferred and initiated with guaranteed write performance for early write termination with a greater capacity in the card level backup power. A third data write operation from operating system software or application software may be issued to the software driver for a third write data. The third write data is transferred to the volatile memory buffer within the memory controller. The third data write operation is queued up in the respective operations queue and issued to the channel controller to transfer the third write data from the volatile memory buffer to one or more NVMDs. A fourth metadata write operation may be issued from operating system software or application software to the software driver for the fourth write data. The fourth write data associated with the fourth metadata write operation may be transferred to an unused memory location in the delayed write buffer. Before completion of the third data write operation and the fourth metadata write operation to one or more NVMDs, the operating system software or the application software is notified that the third data write operation and the fourth metadata write operation are guaranteed to be completed with a high probability exceeding industry accepted norms for data durability for durable data storage, even if a power failure occurs thereafter. These subsequent delayed write operations avoid channel controller setup.

Delayed Write Scheduling

A delayed write operation with an accumulation of a plurality of metadata write operations may be an operation scheduled by the channel scheduler and queued up in the operations queue. However, unless a power failure occurs or a buffer becomes full, the delayed write operation with the accumulated or batch metadata write operations may not be needed. In which case, the delayed write operation may stall the execution of operations over the flash channels to the NVMDs.

Referring now to FIG. 16, an order of operations are scheduled and/or queued up in the scheduler and/or operations queue. The order includes a delayed write ahead of four read operations. To avoid a reduced performance due to waiting for a delayed write operation to occur, the queue may allow read operations to skip over or pass around the delayed write operation in the scheduler/queue and execute ahead of the delayed write operations. In this manner, the delayed write that is scheduled/queued does not significantly impact performance.

Weak Pages

A word line is referred to being partially written if only a subset of all the pages in the word line have been programmed or written to with data. The pages that have been written may be referred to as write pages while the pages that have yet to be written may be referred to as an erased or empty page.

It has been discovered that a flash memory device can be unreliable when a word line is partially written to. A partially written word line results in a vulnerability of the data written into a page (write page) along the partially written word line. A write page in which data is compromised over an acceptable level is referred to as a weak page along the partially written word line. A weak page causes the system to experience a higher than acceptable read error rate. More than one write page in a word line may cause the system to experience a higher than acceptable read error rate. Thus, a given word line may have multiple weak pages.

The system can stabilize weak pages after the system performs more writes to the partially written word line as well as to other word lines (e.g., an adjacent word line, a previously written word line, and/or a subsequently written word line). The writes to the other word lines result in the stabilization of the voltage levels in the weak pages. Accordingly, the weak pages become non-weak pages by way of the stabilization.

The first read operation into a weak page on the partially written word line can result in an incorrect sense of data (read data) out from the weak page. This can result in an error that is uncorrectable by an error-correcting code (ECC) and a loss of data for the user. With multiple word lines and multiple weak pages in multiple partially written word lines, these read errors can be a frequent occurrence and widespread throughout each flash memory device. One way for it to function more reliably would be to avoid the use of weak pages. However, this may result in a loss of memory capacity which is also undesirable. Accordingly, it is desirable to have a system with hardware and software mechanisms that can collectively solve the issue of read errors when performing read accesses to weak pages in a flash memory device.

The system cannot reliably read weak pages on a read-writable NVMD (non-volatile memory device or integrated circuit) chip because voltage levels of memory cells for a weak page are unstable. The location of a weak page on an NVMD chip depends on the order in which data is written into the NVMD chip. The order in which data is written to an NVMD chip depends on the topology of the NVMD chip and how the manufacturer has implemented the particular NVMD chip. Also, an operating system (e.g., Windows™ or IOS™) may be configured to write to pages according to a predetermined order. An example topology of an NVMD chip and an example write order are described below with respect to FIGS. 17A-17C.

Figure 17A:
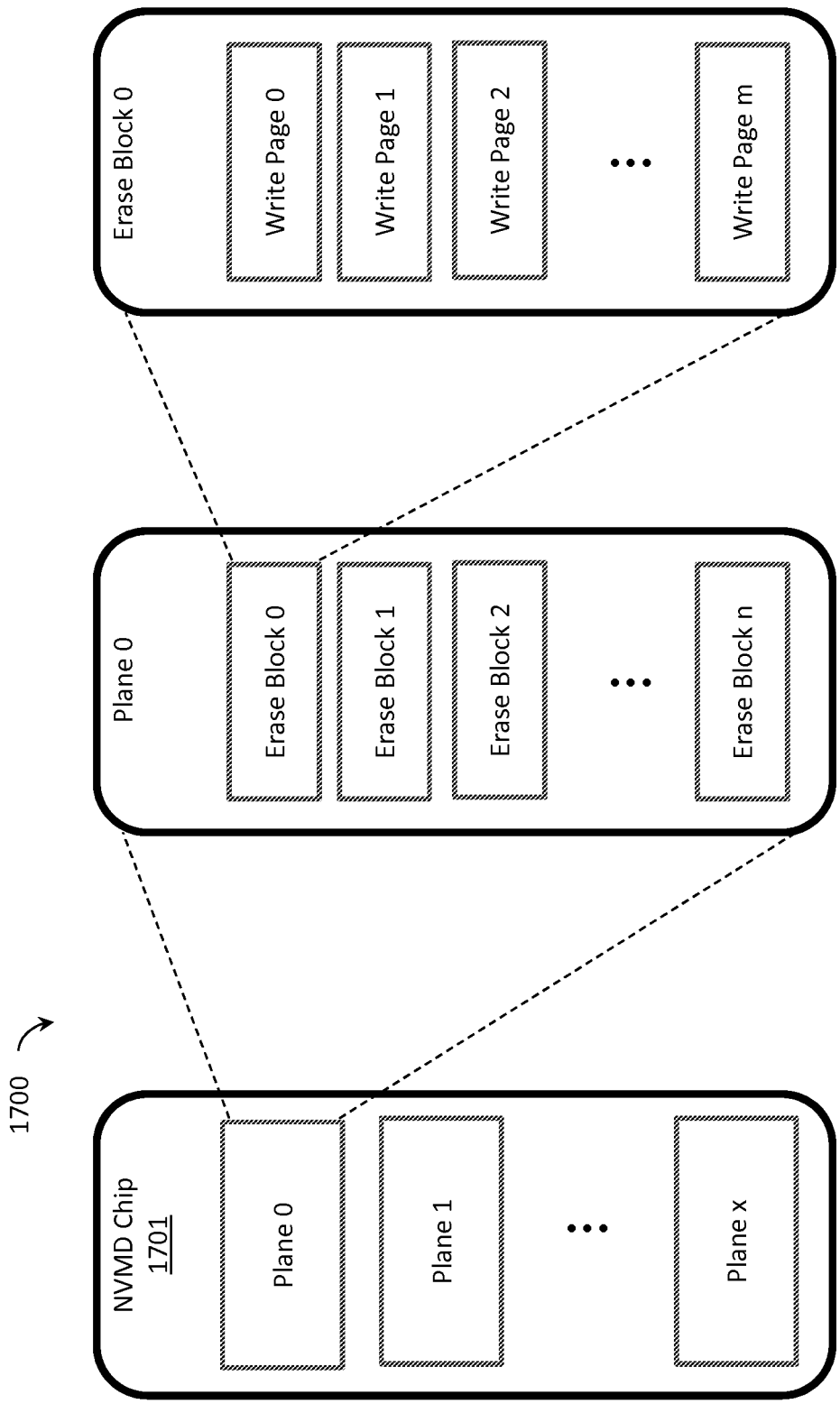
FIG. 17A is a block diagram of a topology of a read-writable NVMD chip.

FIG. 17A is a block diagram of a topology 1700 of a read-writable NVMD chip 1701. Other examples of NVMD chips are NVRAM chips 332A-332H described above with respect to FIG. 3F.

As shown in FIG. 17A, NVMD chip 1701 is organized into planes of data. For example, NVMD chip 1701 includes plane 0 through plane x, where x is a non-negative integer.

Each plane of NVMD chip 1701 is organized into erase blocks. For example, plane 0 includes erase block 0 through erase block n, where n is a non-negative integer. An erase block is the smallest unit of granularity at which the system can erase data from an NVMD chip. A NVMD chip may include, for example, 2,000 erase blocks. Another number of erase blocks is also feasible depending on the implementation of the read-writable NVMD chip.

Each erase block of each plane of NVMD chip 1701 is organized into write pages. For example, erase block 0 includes write page 0 through write page m, where m is a non-negative integer. A write page is the smallest unit of granularity at which the system can write data to an NVMD chip. A typical erase block may include, for example, 512 write pages. Another number of write pages is also feasible depending on the implementation of the read-writable NVMD chip.

Each write page is configured to store a predetermined amount of data (e.g., 16 kilobytes of data). For example, write page 0 may be configured to store 16 kilobytes of data. Write page 1 may be configured to store 16 kilobytes of data. Write page 2 may be configured to store 16 kilobytes of data. Write page n may be configured to store 16 kilobytes of data, where n is a non-negative integer. Another amount of data may be stored in each write page depending on the implementation of the read-writable NVMD chip.

Accordingly, one implementation of an NVMD chip can store, for example, 16 gigabytes of data, which equals 2,000 erase blocks×512 pages/erase block×16 kilobytes/write page. Write pages are grouped into word lines in a particular manner as described below with respect to FIG. 17B.

Figure 17B:
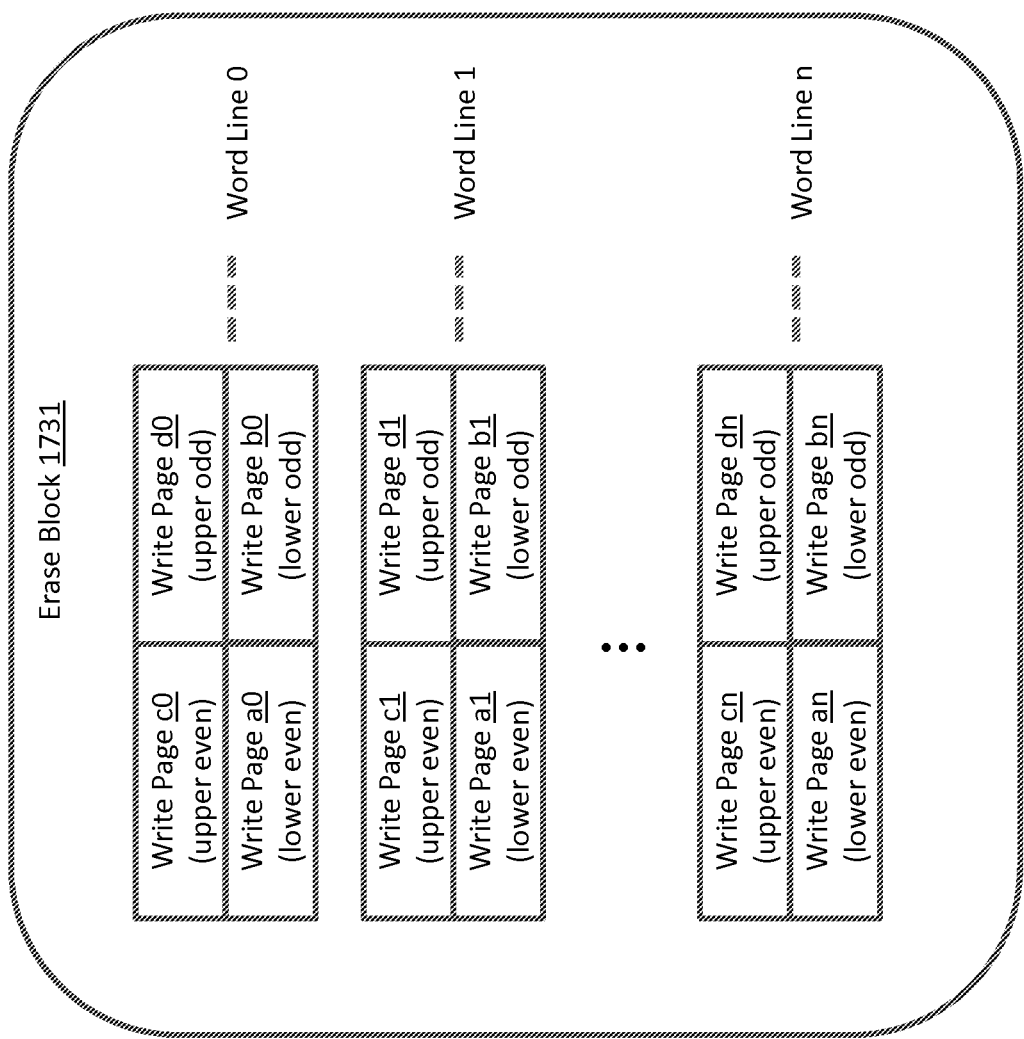
FIG. 17B is a block diagram of example groups of write pages per word line in an erase block.

FIG. 17B is a block diagram of example groups of write pages per word line in an erase block 1731. Erase block 1731 is topologically similar to erase block 0 shown in FIG. 17A, except erase block 1731 of FIG. 17B illustrates a conceptual view of a physical layout of word lines. Each word line includes a group of write pages. A single write page is a part of one word line only.

As shown in the example of FIG. 17B, each word line includes four write pages, including a lower even write page, a lower odd write page, an upper even write page, and an upper odd write page. For instance, word line 0 includes write page a0 (lower even), write page b0 (lower odd), write page c0 (upper even), and write page d0 (upper odd). Word line 1 includes write page a1 (lower even), write page b1 (lower odd), write page c1 (upper even), and write page d1 (upper odd). Word line n includes write page an (lower even), write page bn (lower odd), write page cn (upper even), and write page dn (upper odd), where n is a non-negative integer.

In each group of four write pages in a word line, even write pages include a lower level of memory cells (e.g., lower even memory cells) and an upper level of memory cells (e.g., upper even memory cells). Likewise, in each group of four write pages of a word line, odd pages include a lower level of memory cells (e.g., lower odd memory cells) and an upper level of memory cells (e.g., upper odd memory cells).

Each memory cell includes two bits, one bit for an upper write page and one bit for a corresponding lower write page. Accordingly, each upper page includes bits that are within close proximity to (e.g., physically adjacent to or layered on top of) bits of a lower page. The system writes to a memory cell by setting each bit of a memory cell to have a particular voltage level. Memory cells of write pages of a word line, or one or more next word lines in write order, may be coupled in such a manner that the memory cells electrically affect each other, as further discussed below.

As described above with respect to FIG. 17A, each write page may store 16 kilobytes in one implementation. For example, in FIG. 17B, the system may store 16 kilobytes of write page c0 (upper even) within close proximity to 16 kilobytes of write page a0 (lower even). The system may store 16 kilobytes of write page d0 (upper odd) within close proximity to 16 kilobytes of write page a0 (lower odd). The system may store 16 kilobytes of write page c1 (upper even) within close proximity to 16 kilobytes of write page a1 (lower even). The system may store 16 kilobytes of write page d1 (upper odd) within close proximity to 16 kilobytes of write page a1 (lower odd). The system may store 16 kilobytes of write page cn (upper even) within close proximity to 16 kilobytes of write page an (lower even). The system may store 16 kilobytes of write page dn (upper odd) within close proximity to 16 kilobytes of write page an (lower odd).

Figure 17C:
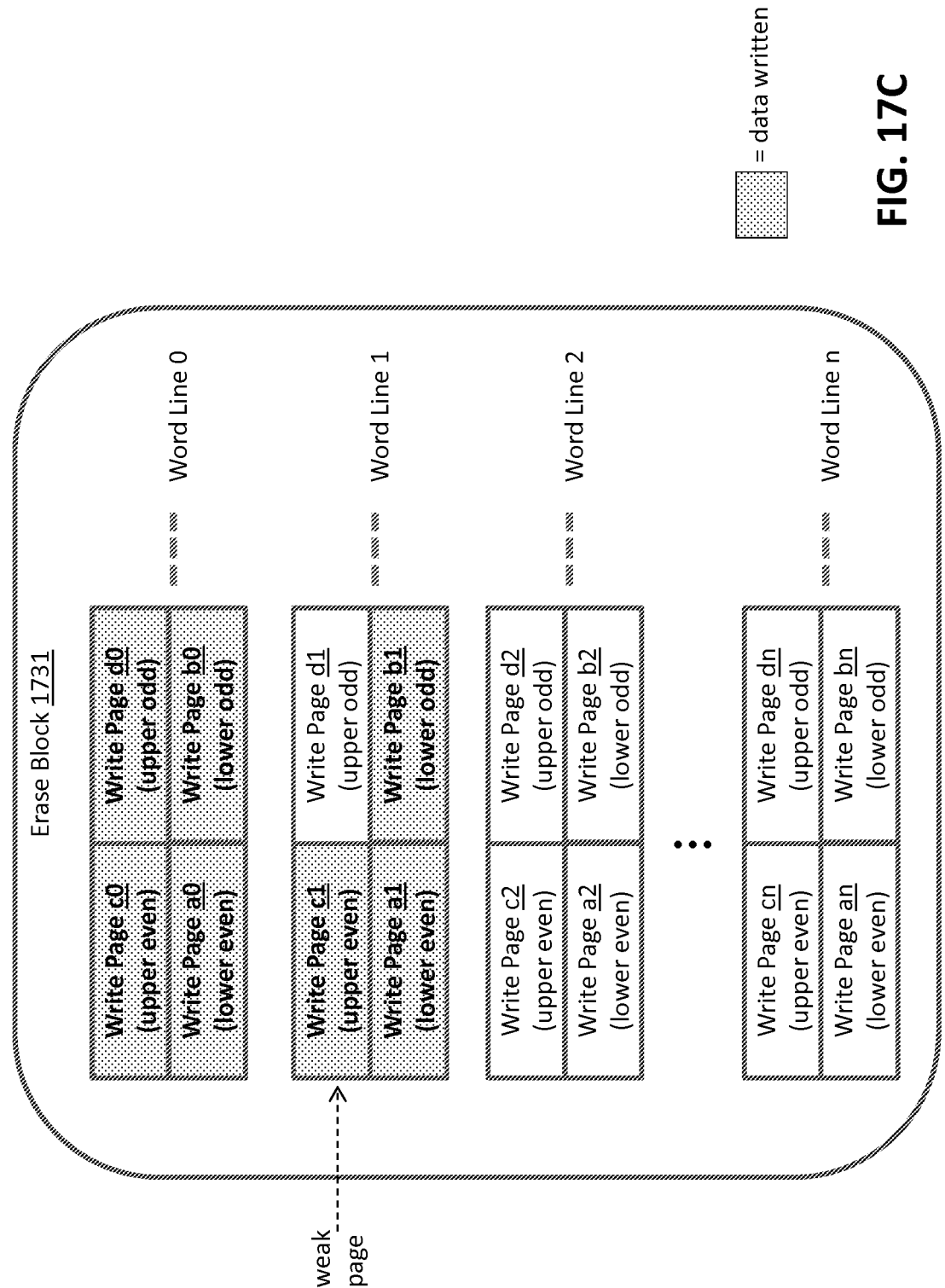
FIG. 17C is a block diagram illustrating a manner in which the system writes data to an erase block such that weak pages may occur.

FIG. 17C is a block diagram illustrating a manner in which the system writes data to erase block 1731 such that weak pages may occur. Where all the write pages of a word line are not entirely written (e.g., partially written word line), a weak page can occur. For example, if a word line includes N write pages, a weak page may occur where pages 1 through N−1 are written. In erase block 1731, each word line includes four write pages. Accordingly, a weak page may occur where pages 1 through 3 are written, as in word line 1.

The order in which word lines are written depends on the implementation of the manufacturer of the NVMD chip and the configuration of the operating system. The system writes one page at a time. Depending on the implementation, the system does not necessarily write to word lines in sequential order.

For example, in FIG. 17C, the system may write to pages a0 (lower even) and b0 (lower odd) in word line 0. The system may then go to word line 1 and write to pages a1 (lower even) and b1 (lower odd). The system may then go back to word line 0 and write to pages c0 (upper even) and d0 (upper odd). The system may then go back to word line 1 and write to pages c1. However, in the example of FIG. 17C, the system does not write to page d1 (upper odd). Accordingly, word line 1 is a partially written word line (e.g., only three out of four pages of the word line are written).

In the example of FIG. 17C, write page c1 is a weak page during this particular state shown in FIG. 17C. In general terms, where an upper even page is written while the corresponding upper odd page is unwritten, the memory cells of the word line are arranged in such a manner that that the upper even page tends to be a weak page. In electrical terms, the voltage levels of memory cells of a weak page (e.g., write page c1) do not settle to stable voltage levels until the system is done programming the adjacent upper-level write page (e.g., write page d1) in the word line (e.g., word line 1).

Write page c1 is shown in FIG. 17C as being a weak page for explanatory purposes. However, a weak page is likely to occur anywhere a partially written word line occurs. As described above, there may be one or more weak pages in a word line. For example, due to write page c1 being an upper even weak page that electrically affects other pages in word line 1, lower even write page a1 and lower odd write page b1 are likely to be weak pages. The one or more weak pages may include any combination of the write pages in the word line including, for example, the lower even write page (e.g., write page a1), the lower odd write page (e.g., write page b1), the upper even write page (e.g., write page c1), and the upper odd write page (e.g., write page d1).

In one erase block, the number of weak pages can amount to a substantial number (e.g., one-fourth of all pages). For example, an erase block that includes 512 write pages can have as many as 128 weak pages (e.g., one-fourth of 512 write pages). If the NVMD chip includes 2,000 erase blocks, the NVMD chip can have as many as 256,000 weak pages (e.g., 2,000 erase blocks×128 weak pages/erase block). At 16 kilobytes per write page, the NVMD can have as much as 4 gigabytes that are unreliable due to weak pages (e.g., 16 kilobytes/page×256,000 weak pages). Thus, 4 gigabytes of the total 16 gigabytes of the NVMD chip can be unreliable due to weak pages.

Such massive amount of unreliability of weak pages is problematic and unacceptable. The systems and methods provided below address unreliability issues associated with weak pages. As further discussed below, weak pages may be stabilized after the present word line and one or more next word lines in write order (e.g., adjacent word lines) are fully written.

System Architecture for Preventing Read Errors on Weak Pages

When the system tries to read a weak page in a read-writable NVMD chip, an uncorrectable ECC (error-correcting code) error can occur. An ECC error occurs where the system senses the voltage levels of the memory cells associated with a weak page incorrectly and the number of erroneous bits in the data exceeds the error correction capability of the ECC. Because a large number of weak pages can occur, as described above with respect to FIG. 17C, a large number of uncorrectable ECC errors can also occur. Thus, the systems and methods described below provide a way to handle weak pages so that uncorrectable ECC errors do not occur or occur less often.

Example architectures of a system for preventing read errors on weak pages are described below with respect to FIGS. 18A and 18B. Example flowcharts for performing writing and reading operations for weak pages are described below with respect to FIGS. 19A-19C. Example flowcharts for performing power shutdown operations for weak pages are described below with respect to FIGS. 20A and 20B.

Figure 18A:
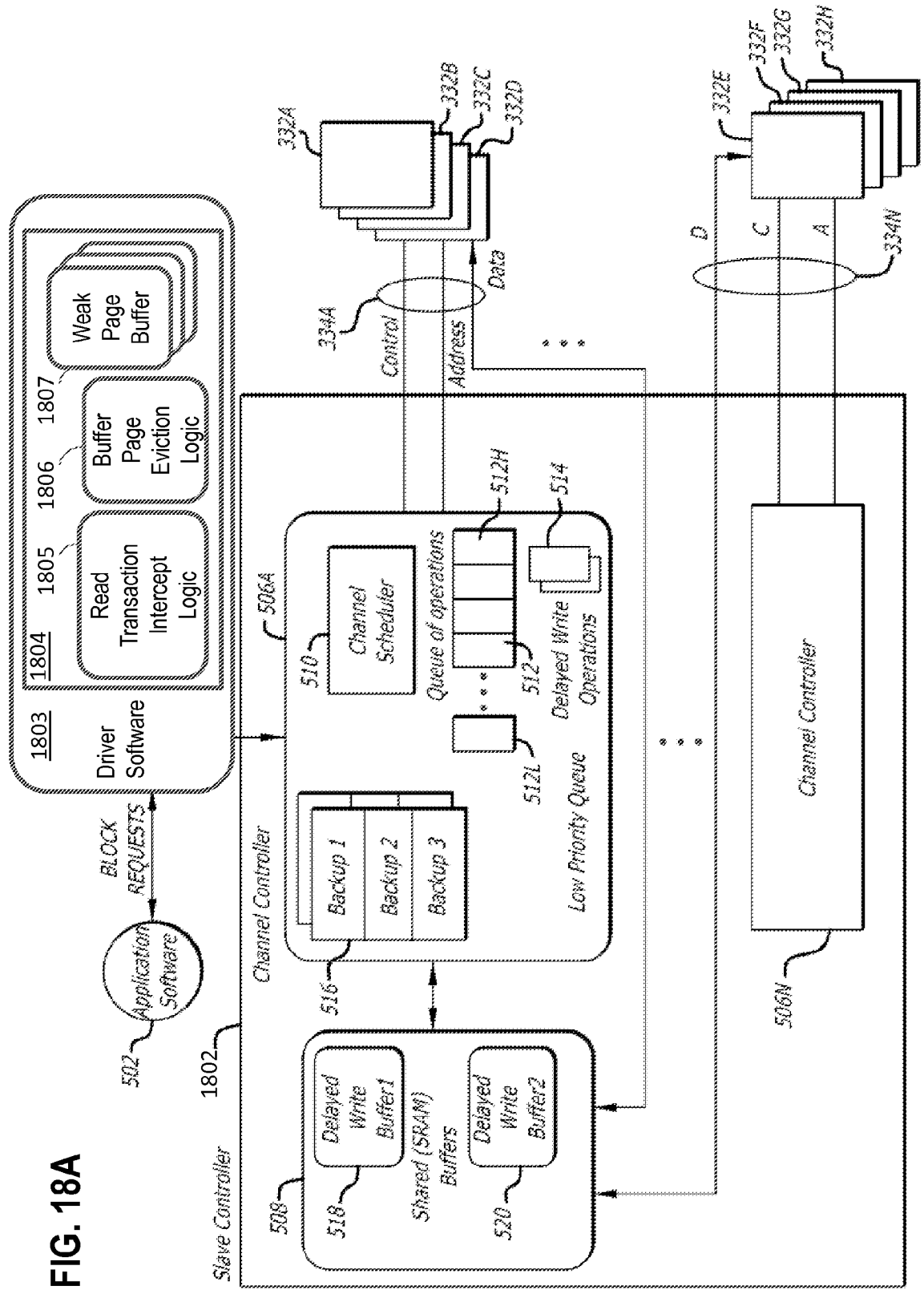
FIG. 18A is a block diagram of example driver software coupled to a slave controller.

FIG. 18A is a block diagram of example driver software 1803 coupled to a slave memory controller 1802. The slave memory controller 1802 is coupled to read-writable NVMDs of a daughter-memory-card. As shown in FIG. 18A, driver software 1803 includes an operations scheduler 1804, which includes read transaction intercept logic 1805, buffer page eviction logic 1806, and a weak page buffer 1807.

The system uses weak page buffer 1807 to temporarily store data for a weak page. When a read needs to occur from the weak page, the system may read from the weak page buffer 1807, instead of from one of the NVMD chips 332A-332H.

Buffer page eviction logic 1806 includes instructions for buffering data in weak page buffer 1807, and for evicting data from the weak page buffer when a particular write page ceases to be a weak page. Buffer eviction logic 1806 is further described below with respect to FIGS. 19A-20B.

Read transaction intercept logic 1805 includes instructions for intercepting a read that would otherwise occur from an NVMD chip 332A-332H. The instructions direct the system to read from the weak page buffer 1807 instead of from the NVMD chip. Operations of read transaction intercept logic 1805 are further described below with respect to FIGS. 19A-20B.

Other components of FIG. 18A are similar to the components of the FIG. 5, which is described above. For simplicity, many components of FIG. 5 are not described again here.

Figure 18B:
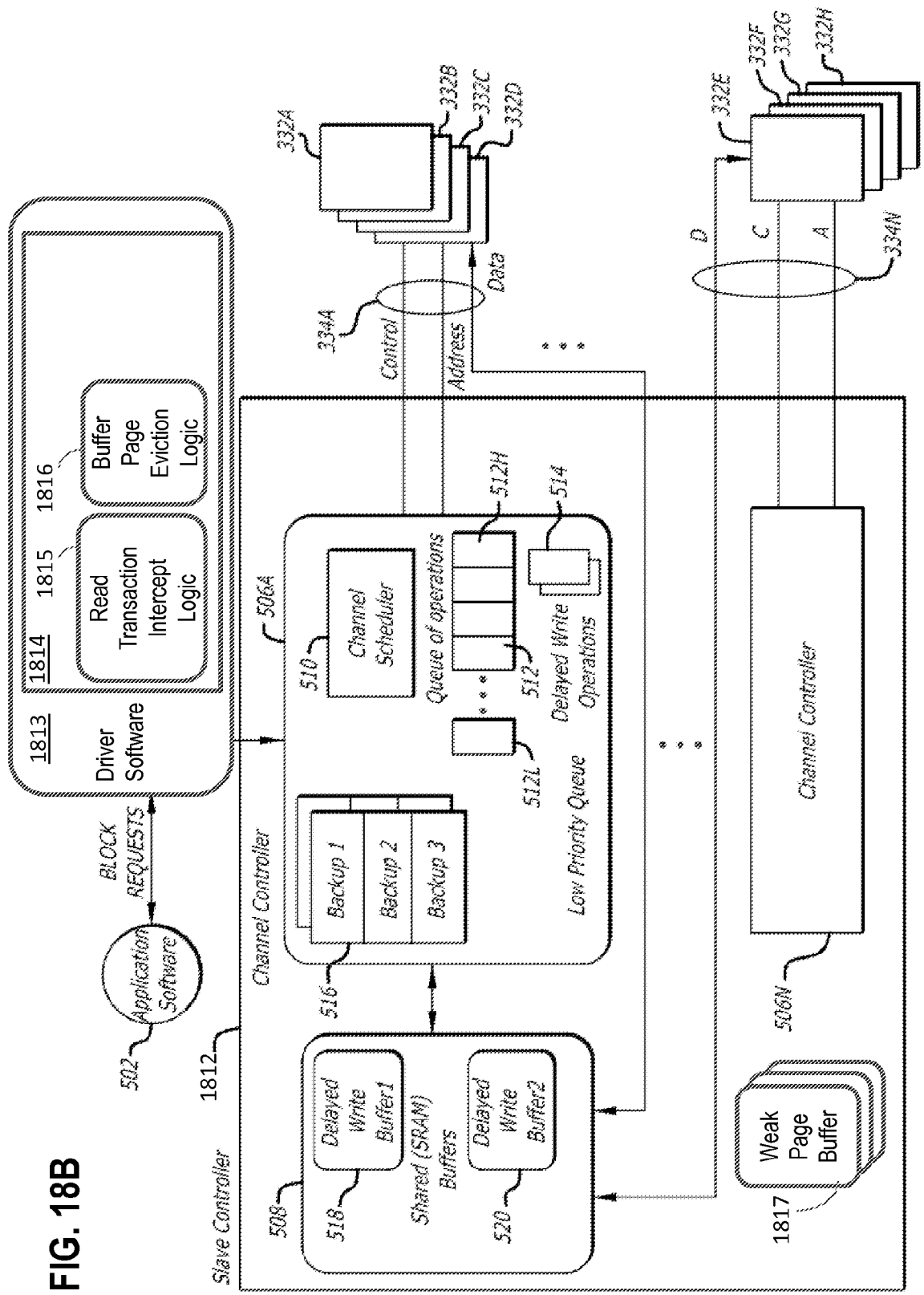
FIG. 18B is a block diagram of other example driver software coupled to a slave controller.

FIG. 18B is a block diagram of another example driver software 1813 coupled to a slave controller 1812. The slave memory controller 1812 is coupled to read-writable NVMDs of a daughter-memory-card. As shown in FIG. 18B, driver software 1813 includes an operations scheduler 1814, which includes read transaction intercept logic 1815, buffer page eviction logic 1816. The slave controller 1812 includes a weak page buffer 1817.

Buffer page eviction logic 1816 includes instructions for buffering data in weak page buffer 1817, and for evicting data from the weak page buffer when a particular write page ceases to be a weak page. Buffer eviction logic 1816 is further described below with respect to FIGS. 19A-20B.

Read transaction intercept logic 1815 includes instructions for intercepting a read that would otherwise occur from an NVMD chip 332A-332H. The instructions direct the system to read from the weak page buffer 1817 in the slave controller 1812 instead of from the NVMD chip. Operations of read transaction intercept logic 1815 are further described below with respect to FIGS. 19A-20B.

Other components of FIG. 18B are similar to the components of the FIG. 5, which is described above. For simplicity, many components of FIG. 5 are not described again here.

Methods for Preventing Read Errors on Weak Pages

Figure 19A:
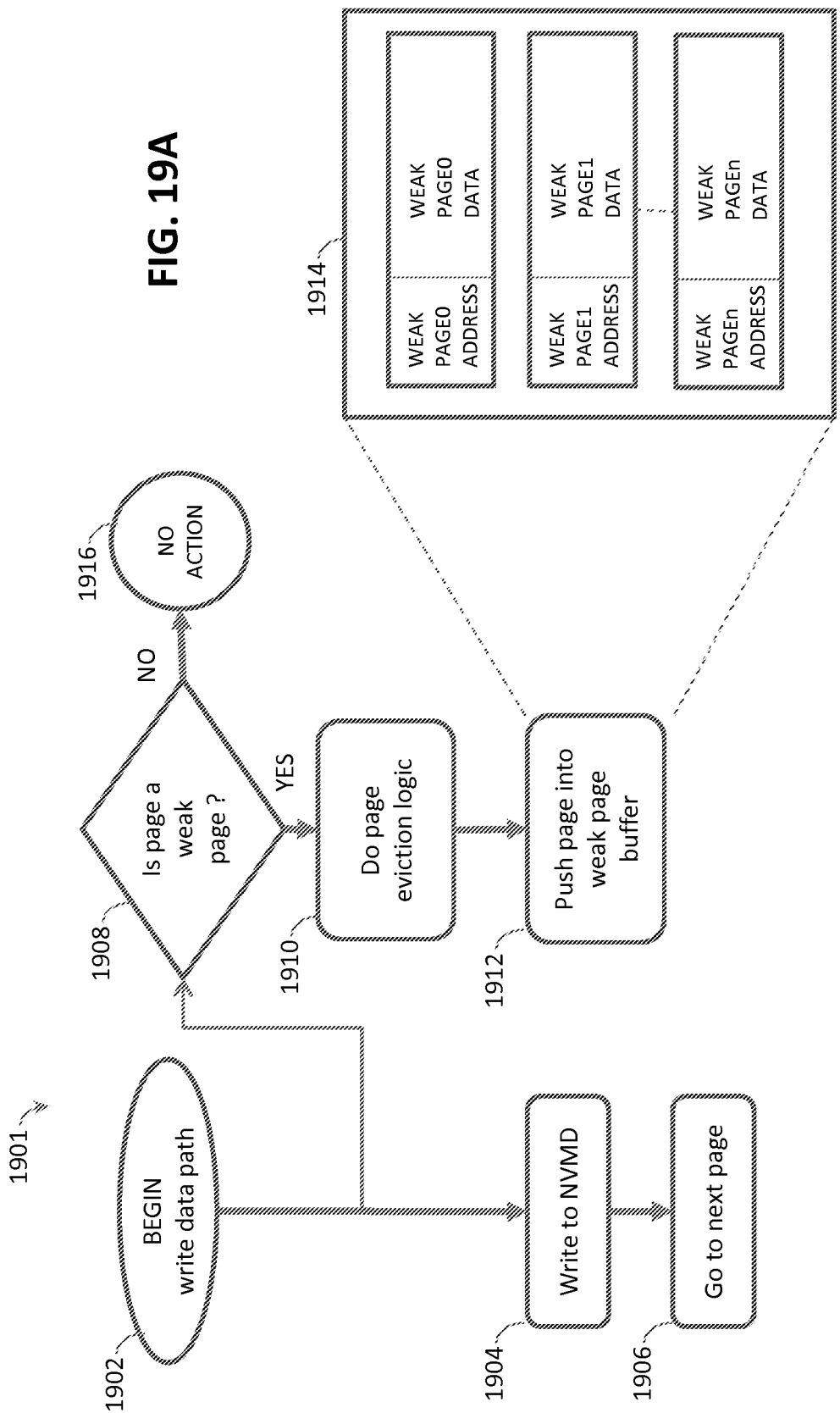
FIG. 19A is a flowchart of an example method for managing a write data path for a weak page buffer.

FIG. 19A is a flowchart of an example method 1901 for managing a write data path for a weak page buffer. The write data path helps to improve reliability of a read-writable NVMD chip. In one implementation, the method 1901 may be carried out by the system of FIG. 18A or FIG. 18B.

Driver software (e.g., driver software 1803 or 1813) stored in memory (e.g., ROM 423, NVM 424, and/or DRAM 425) and executed by a processor (e.g., processor 422) may perform a number of operations to carry out the write data path for the weak page buffer (e.g. weak page buffer 1807 or 1817). With flash memory, the driver software provides a block device view of the flash memory devices in the NVMDs. A write operation to a weak page not only causes write data to be stored in the weak page buffer, but further stores a translation between a logical block number in the block device view and a physical block address that identifies a unique memory block in the flash memory devices. The method 1901 begins with process block 1902 and then goes to process block 1904 and to decision block 1908.

At process block 1904, the system writes data to a current write page of a read-writable NVMD. At about the same time, at decision block 1908, the system determines if the current write page is a weak page. Ways for the system to identify a weak page are further described below with respect to FIG. 17B. If the system determines the current write page is not a weak page, then, at process block 1916, the system performs no further action with respect to weak page buffering for the current write page.

However, if the system determines the current write page is a weak page, then, at process block 1910, the system performs page eviction logic to determine whether the system can free up space in the weak page buffer. For example, the system can evict pages from the weak page buffer (e.g., clear the weak page buffer) once the system has fully written to the word lines that the system has been targeting (e.g., once the current write pages in flash are no longer considered weak). The system can indicate the data of the duplicate weak page in the weak page buffer can be overwritten in response to determining that a sufficient number of page writes have occurred along the word line. In another embodiment, system can indicate the data of the duplicate weak page in the weak page buffer can be overwritten in response to determining that a sufficient number of page writes have occurred along the word line and one or more next word lines in write order.

Referring back FIG. 17C, the system may consider write pages a1, b1, and c1 to be sufficiently stable after the system writes to pages d1 and a2. Note that write page a2 is in word line 2, which is the next word line in write order and happens to be adjacent to word line 1. Accordingly, a triggering point for evicting data from the weak page buffer may be where all the pages in a word line are written and the system has written to the first page (e.g., write page a2) of the next word line in write order (e.g., word line 2).

Referring back to FIG. 19A at process block 1912, the system pushes (e.g., stores, buffers) data of the current write page into a weak page buffer (e.g., weak page buffer 1807 or 1817). For example, the system manages a table 1914 in software and/or hardware that keeps track of one or more weak pages. For each weak page, the table 1914 includes a weak page address and corresponding weak page data. As shown in FIG. 19A, a weak page 0 address is associated with weak page 0 data. A weak page 1 address is associated with weak page 1 data. A weak page n address is associated with weak page n data, where n is a non-negative integer.

The system buffers data in the weak page buffer until the system determines the write pages associated with the data residing in the weak page buffer have been stabilized (e.g., the system has performed enough writes such that the original flash pages that were stored in the weak page buffers are no longer weak and a read to those pages from the NVMD device would not result in excessive amount of erroneous bits). Once this point of stabilization is reached, the system can evict the corresponding data in the weak page buffer, thereby freeing up space for new weak page data. After process blocks 1904, the system goes to process block 1906.

At process block 1906, the system goes to the next write page. For example, the system returns to process block 1902 to perform write path operations for the next write page. In one implementation, the system may continue to perform write path operations of method 1901 until data writing to the read-writable NVMD is complete. Alternatively, the system may continue to perform write path operations of method 1901 until the system undergoes a power shutdown, as further discussed below with respect to FIGS. 20A and 20B. After process block 1906, the method 1901 concludes.

Figure 19B:
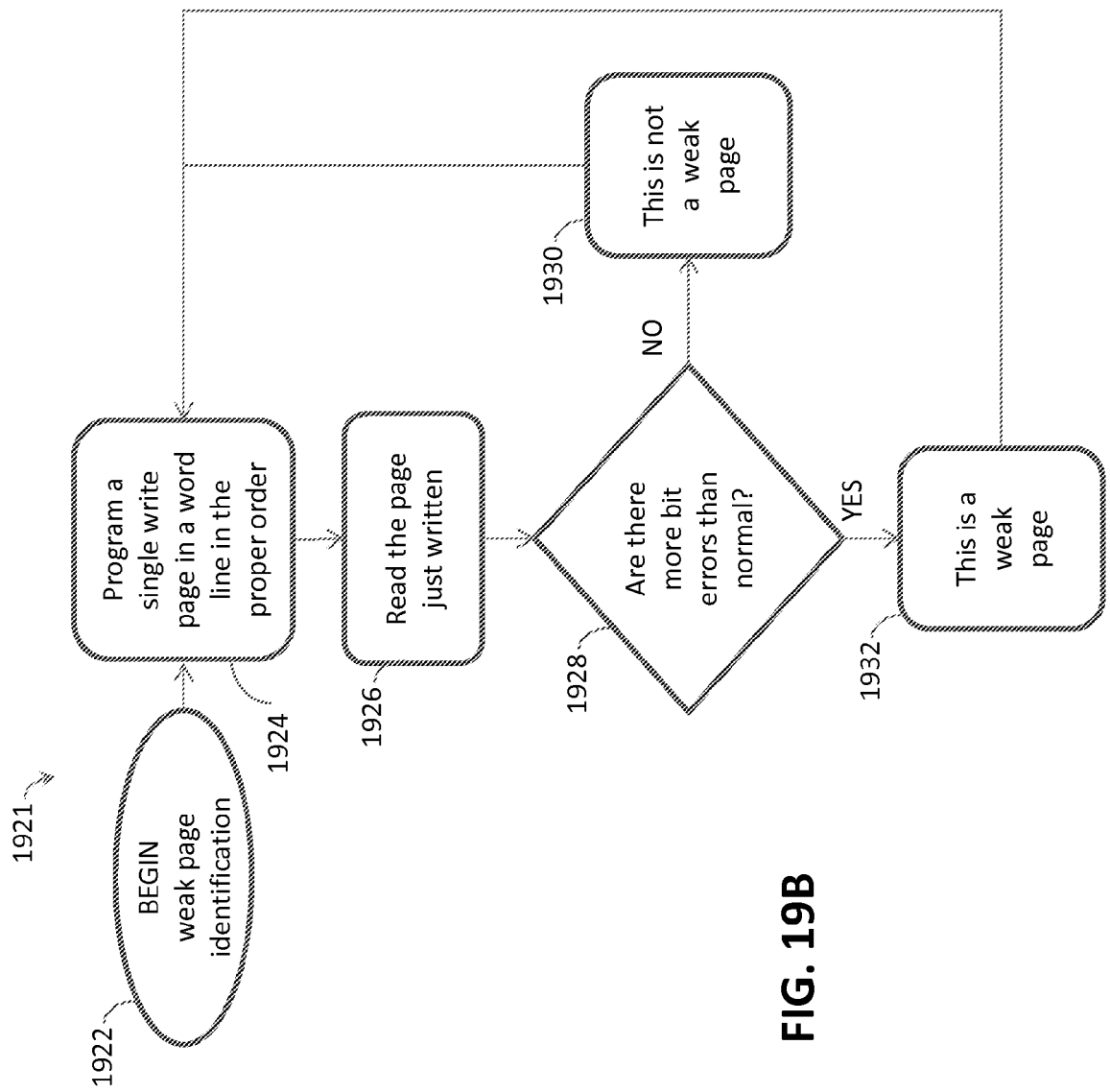
FIG. 19B is a flowchart of an example method for identifying a weak page in a read-writable NVMD.

FIG. 19B is a flowchart of an example method 1921 for characterizing a NVMD to identify one or more pages along each word line likely to be a weak page if the word line is partially written. The method 1921 provides more details of the decision block 1908 of FIG. 19A, which is described above. In one implementation, the method 1921 may be carried out by the system of FIG. 18A or FIG. 18B. The method 1921 begins with decision block 1922 and then goes to process block 1924.

At process block 1924, the system programs a single write page in a word line in the proper order. For example, as described above with respect to FIG. 17A, the order in which data is written to an NVMD chip depends on the topology of the NVMD chip and how the manufacturer has implemented the particular NVMD chip. Also, an operating system (e.g., Windows™ or IOS™) may be configured to write to pages according to a predetermined order.

At process block 1926, the system reads the page written in process block 1924. Accordingly, the page written becomes the page read. Also, the page written is at least partially written with at least some data.

At decision block 1928, the system determines if the page read causes the system to generate more bit errors than a predetermined error level. For example, a non-weak page (e.g., stable or stabilized page) typically causes the system to generate bit errors within a normal bit error range, if any bit errors are generated. A normal bit error range is where the number of erroneous bits in the data is within the error correction capability of the ECC. For example, the number of erroneous bits in the data is not greater than the predetermined error level. In contrast, a weak page causes the system to generate a higher than normal amount of bit errors.

Referring again to FIG. 17C, a normal bit error range may be, for example, 0 to 6 bit errors per read from an upper even write page. Accordingly, in one implementation, the predetermined error level may be set at 6 bit errors per read from an upper even write page. In such a case, more than 6 bit errors per read from an upper even write page is considered higher than the normal bit error range. For example, if the system determines that reading page c1 generates 11 bit errors, then the system determines that page c1 generates more than a normal number of bit errors (e.g., more than the predetermined error level of 6 bit errors). As another example, if the system determines that reading page c0 causes the system to generate only 4 bit errors, then the system determines that page c0 generates a normal number of bit errors (e.g., less than the predetermined error level of 6 bit errors).

Other write pages in other locations may have different normal bit error ranges. For example, lower even write pages (e.g., write page a1) may have a predetermined error level that is set at 2 bits. Lower odd write pages (e.g., write page b1) may have a predetermined error level that is set at 2 bits. Upper odd write pages (e.g., write page d1) may have a predetermined error level that is set at 4 bits. The normal bit error ranges (and predetermined error levels) provided above are for explanatory purposes. Other normal bit error ranges (and predetermined error levels) may be acceptable depending on the technical specifications of the particular implementation.

Referring again to FIG. 19B, if the system determines that the page read does not cause the system to generate more bit errors than the predetermined error level, then, at process block 1930, the system does not assign a weak page status to the current page. Alternatively, the system may label the page read as not being a weak page.

However, if the system determines that the page read causes the system to generate more bit errors than a predetermined error level, then, at process block 1932, the system the system assigns a weak page status to the current page. For example, the system may label the page read as being a weak page. It is possible in some instances that multiple pages in a word line may be considered as being weak. After process block 1930 or 1932, the method 1921 concludes.

Figure 19C:
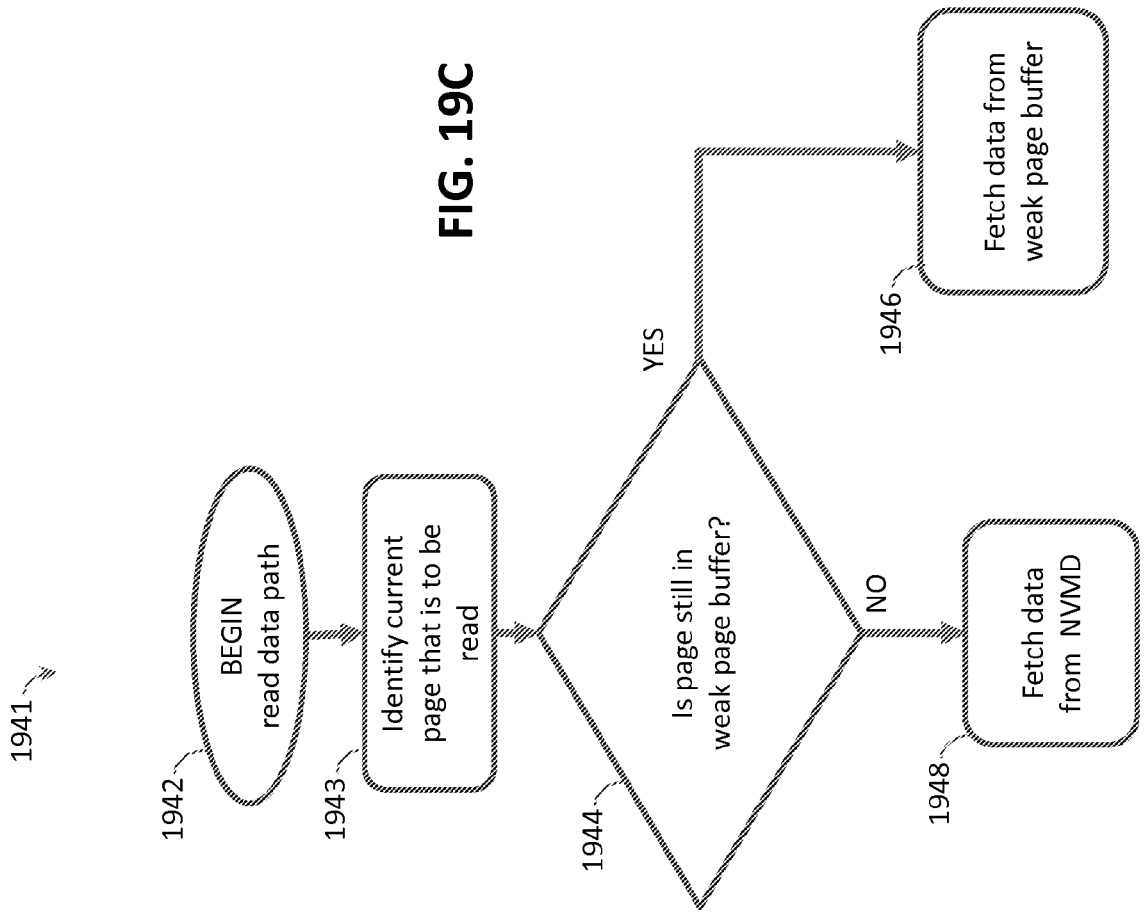
FIG. 19C is a flowchart of an example method for carrying out a read data path with a weak page buffer for reliability of a read-writable NVMD chip.

FIG. 19C is a flowchart of an example method 1941 for carrying out a read data path with a weak page buffer for reliability of a read-writable NVMD chip. As described above with respect to FIG. 17A, data written to a weak page in an NVMD is unreliable for read operations. Accordingly, the method 1941 provides a way to read to data associated with the weak page and to avoid reading the unreliable data from the NVMD. The method 1941 begins with process block 1942 after the system has received a read request. The method 1941 then goes to process block 1943.

At process block 1943, the system identifies a current write page of data that is to be read from a read-writable NVMD in response to an address.

At decision block 1944, the system determines if data associated with the current write page (e.g., weak page) is still duplicated in the weak page buffer. As described above with respect to FIG. 19A, at process block 1912, the system may have previously written data to the weak page buffer.

If the system determines that data associated with the current write page (e.g., weak page) is still in the weak page buffer, then, at process block 1946, the system fetches the data from the weak page buffer and prevents the read request from reaching the non-volatile memory device. Accordingly, the system serves the read request for data in the weak page from the duplicate weak page stored in the weak page buffer.

However, if the system determines that data associated with the current write page is not in the weak page buffer, then, at process block 1948, the system fetches data from the write page in the read-writable NVMD. For example, the system determines that a sufficient number of page writes have occurred along the word line in the NVMD such that the previously weak page is now a stabilized page such that the stabilized page can be read with substantially no read errors. Accordingly, the system serves the read request for data in the stabilized page from the NVMD. After process block 1946 or 1948, the method 1941 concludes.

Methods for Managing Weak Pages Associated with a Shutdown

Figure 20A:
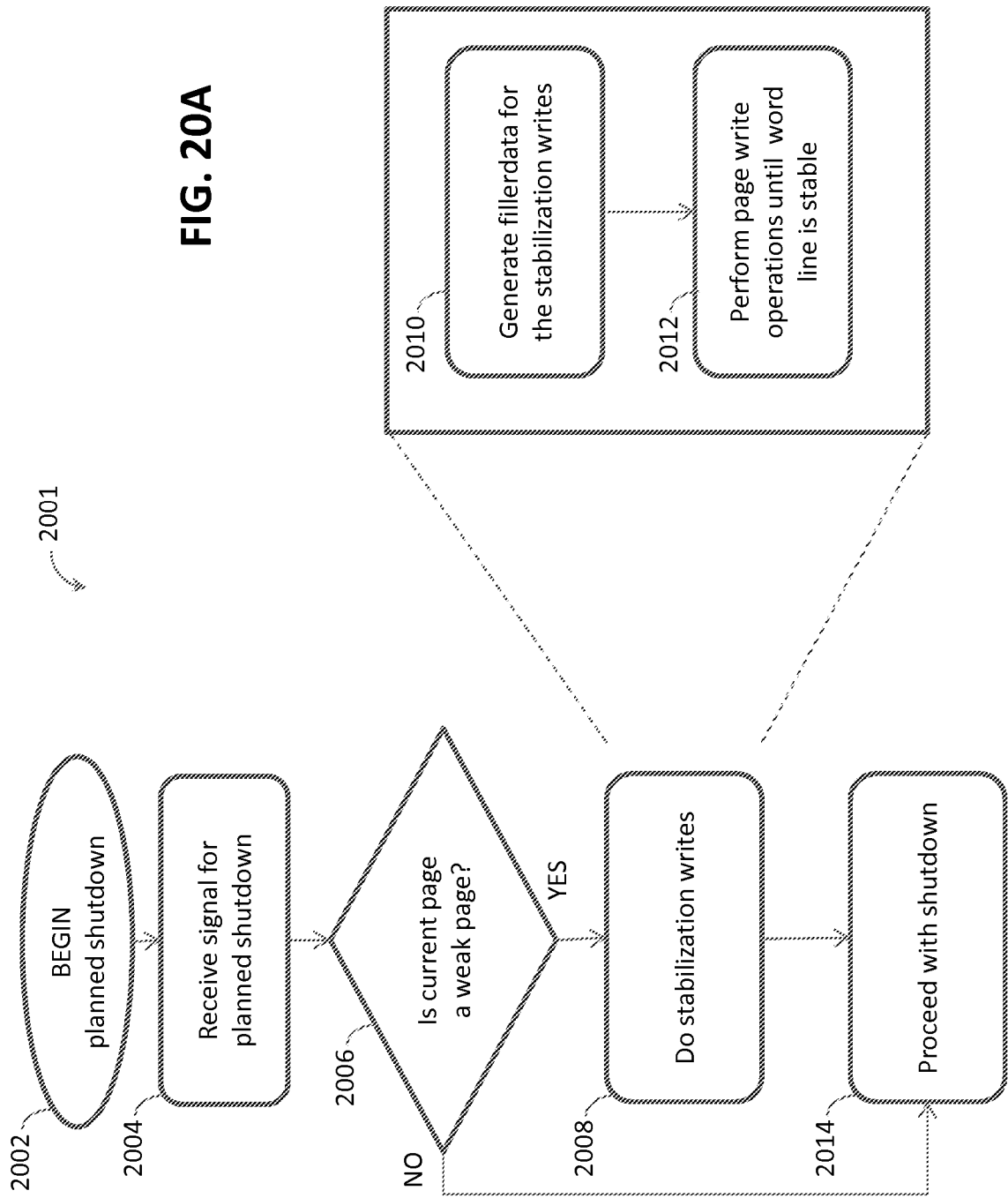
FIG. 20A is a flowchart of an example method for performing stabilization writes for a planned power shutdown.

FIG. 20A is a flowchart of an example method 2001 for performing stabilization writes for a planned power shutdown. In one implementation, the method 2001 may be carried out by the system of FIG. 18A or FIG. 18B. The method 2001 begins with process block 2002 and then goes to process block 2004.

At process block 2004, the system receives a signal (e.g., request) for a planned shutdown. For example, a user may request a shutdown of the computer system.

At decision block 2006, the system determines if the current page that is being written is a weak page. For example, FIG. 19B provides method 1921 for identifying a weak page. If the system determines the current page is not a weak page, then, in process block 2014, the system proceeds with shutdown operations.

However, if the system determines the current page is a weak page, then, in process block 2008, the system performs stabilization writes to subsequent vacant pages in the word line until the currently written page is stabilized. For example, in process block 2010, the system generates filler data for the stabilization writes. Filler data may include, for example, random 1-bits and 0-bits (e.g., 01000111101 . . . ). Then, in process block 2012, the system performs page write operations until the current word line is stable. The system performs stabilization writes into vacant pages along a single word line and/or multiple adjacent word lines until the weak page is stabilized. For example, the system writes filler data into vacant pages of the current word line until all four pages of the current word line are written. The stabilization writes may also include writing filler data into vacant pages of one or more next word lines in write order until the weak page is stabilized.

At process block 2014, the system can then proceed with shutdown operations. After process block 2014, the method 2001 concludes.

Figure 20B:
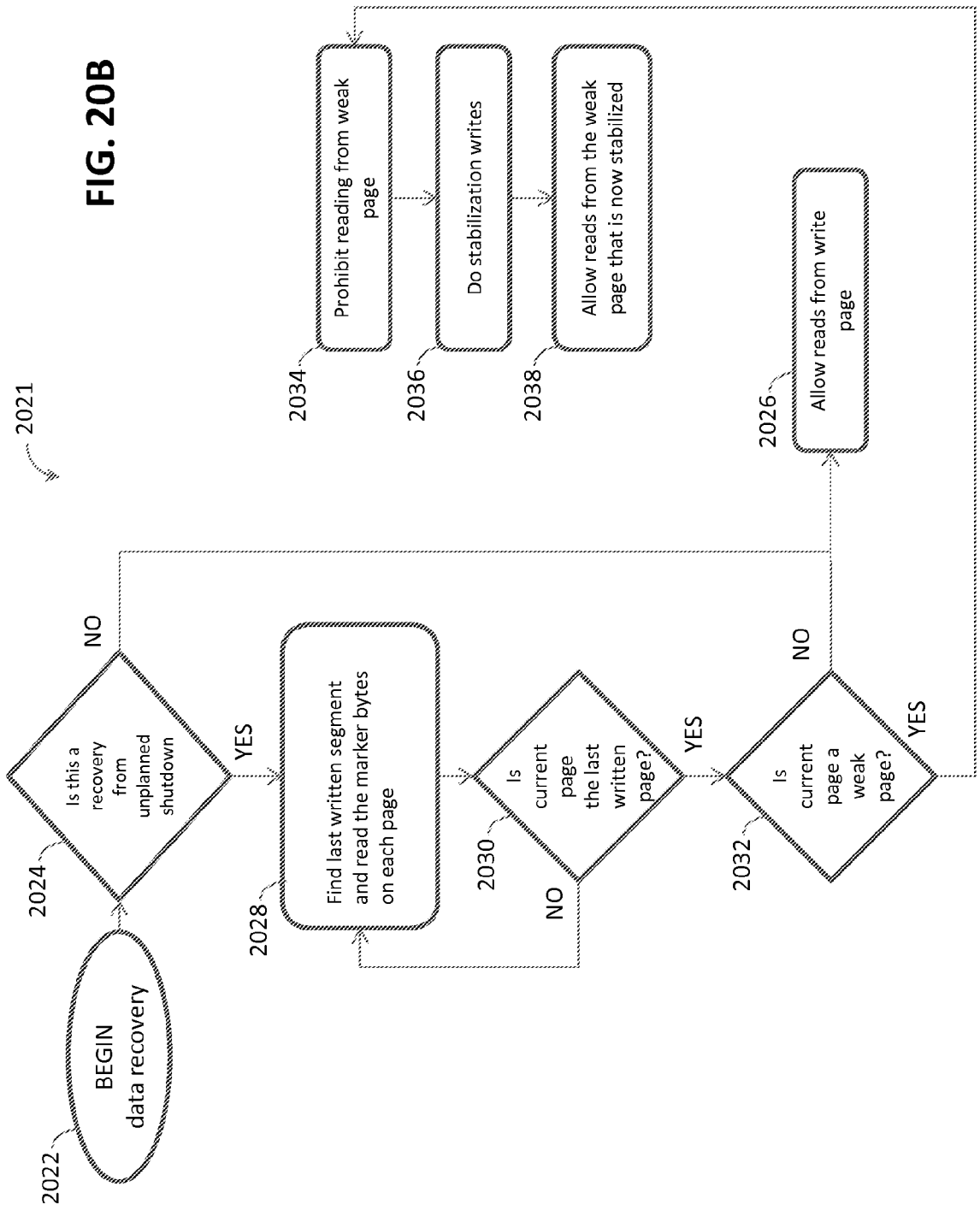
FIG. 20B is a flowchart of an example method for performing stabilization writes on a recovery from a power shutdown.

FIG. 20B is a flowchart of an example method 2021 for performing stabilization writes on a recovery from a power shutdown. In one implementation, the method 2021 may be carried out by the system of FIG. 18A or FIG. 18B. The method 2021 begins with process block 2022 and then goes to decision block 2024.

At decision block 2024, the system determines if a recovery from an unplanned shutdown is occurring. If the system determines that a recovery from an unplanned shutdown is not occurring (e.g., recovery from a planned shutdown is occurring), then, in process block 2026, the system allows reads from the current write page. For example, the current write page may include filler data, which stabilizes the write page, as discussed above with reference to FIG. 20A.

However, if the system determines that a recovery from an unplanned shutdown is occurring, then, in process block 2028, the system finds a last written segment and reads marker bytes on each page to identify the last written page in the segment.

At decision block 2030, the system determines if the current write page is the last page written based on the marker bytes read in process block 2028. If the system determines the current page is not the last written page based on the marker bytes, then the system returns to process block 2028. This iteration between process block 2028 and decision block 2030 may continue until the system determines the current write page is the last written page.

At decision block 2032, the system determines if the current write page (e.g., the last written page) is a weak page. If the system determines the current page is not a weak page, then, in process block 2026, the system allows reads from the current write page.

However, if the system determines the current page is a weak page, then, in process block 2034, the system prohibits reading from the weak page.

At process block 2036, the system performs stabilization writes. For example, as described with respect to FIG. 20A the system generates filler data and then performs page write operations until the word line is stable (e.g., until all four pages of the current word line are written). For instance, the system performs stabilization writes to one or more vacant pages along a word line that includes the last written page to stabilize data in the word line. The system may also perform stabilization writes to one or more vacant pages along adjacent word lines (e.g., one or more next word lines in write order) to stabilize the data stored in the last written page.

At process block 2038, the system allows reads from the weak page that has undergone stabilization writes. For example, the system reads data out from the last written page after completion of the stabilization writes. After process block 2038 or process block 2026, the method 2021 concludes.

Conclusion

Aspects of embodiments of the invention are thus described. Aspects of the invention may be implemented in a system using software and/or hardware. For example, a system may include one or more processors that execute instructions of software to implement an aspect of the invention. A process may be performed by instructions with a processor.

When implemented in software, the elements of the embodiments of the invention are essentially the code segments or instructions to perform the necessary tasks. The program or code segments can be stored in a processor readable medium. The processor readable medium may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, or other type of storage device. The code segments or instructions may be remotely stored and downloaded in a data signal via computer networks such as the Internet, Intranet, etc. over a fiber optic medium, a radio frequency (RF) link, or other transmission medium for execution by a processor.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. The embodiments of the invention should be construed according to the claims that follow below.

What is claimed is:

1. A method for accessing data in a non-volatile memory system, the method comprising:
   writing data into a page of a non-volatile memory device (NVMD) along a word line, wherein the word line is partially written with at least some data such that the page is a weak page;
   storing the write data associated with the weak page into a weak page buffer as a duplicate weak page; and
   serving a read request for data in the weak page from the duplicate weak page stored in the weak page buffer.

2. The method of claim 1, further comprising:
   determining that a sufficient number of page writes have occurred along the word line in the non-volatile memory device such that the weak page is a stabilized page such that the stabilized page can be substantially read without read errors; and
   serving a read request for data in the stabilized page from the non-volatile memory device.

3. The method of claim 2, further comprising:
   indicating the data of the duplicate weak page in the weak page buffer can be overwritten in response to the determining that a sufficient number of page writes have occurred along the word line.

4. The method of claim 2, further comprising:
   indicating the data of the duplicate weak page in the weak page buffer can be overwritten in response to the determining that a sufficient number of page writes have occurred along the word line and one or more next word lines in write order.

5. The method of claim 1, further comprising:
   characterizing the NVMD to identify one or more pages along each word line likely to be a weak page if the word line is partially written.

6. The method of claim 5, wherein the characterizing of the NVMD to identify one or more weak pages likely to be a weak page comprises:
   reading a current page that is written to the non-volatile memory device;
   determining that a number of bit errors associated with the current page is above a predetermined error level; and
   assigning a weak page status to the current page.

7. The method of claim 6, wherein the predetermined error level is between two and six bit errors per read from a write page, including at least one of:
   six bit errors per read from an upper even write page;
   four bit errors per read from an upper odd write page;
   two bit errors per read from a lower even write page; or
   two bit errors per read from a lower odd write page.

8. The method of claim 1, further comprising:
   identifying a current page of data that is to be read from a non-volatile memory device in response to an address;
   determining if data associated with the current page that is to be read is stored in the weak page buffer; and
   fetching the data associated with the current page that is to be read.

9. The method of claim 8, further comprising:
   determining that data associated with the current page that is to be read is not stored in the weak page buffer; and
   fetching the data associated with the current page that is to be read from the non-volatile memory device.

10. The method of claim 8, further comprising:
    determining that data associated with the current page that is to be read is stored in the weak page buffer; and
    fetching the data associated with the current page that is to be read from the weak page buffer.

11. The method of claim 10, further comprising:
    preventing the read request from reaching the non-volatile memory device.

12. The method of claim 1, wherein the word line includes a group of write pages within close proximity, including at least a lower even write page, a lower odd write page, an upper even write page, and a lower even write page.

13. The method of claim 12, wherein the likely weak page is the upper even write page, the upper odd page, the lower odd page, or a combination of the upper even write page, the upper odd page, and the lower odd page.

14. The method of claim 12, wherein memory cells of the group of write pages in the same word line or one or more next word lines in write order are coupled in such a manner that the memory cells electrically affect each other.

15. A method to read data out from a non-volatile memory system, the method comprising:
    identifying a current page of data that is to be read from a non-volatile memory device in response to an address;
    determining if data associated with the current page that is to be read is stored in a weak page buffer; and
    fetching the data associated with the current page that is to be read.

16. The method of claim 15, wherein
    it is determined that the data associated with the current page that is to be read is stored in the weak page buffer, then
    the data associated with the current page that is to be read is fetched from the weak page buffer.

17. The method of claim 16, the method further comprises:
    preventing the non-volatile memory device from receiving the read request.

18. The method of claim 15, wherein
    it is determined that the data associated with the current page that is to be read is not stored in the weak page buffer, then
    the data associated with the current page that is to be read is fetched from the non-volatile memory device.

19. A non-volatile memory system, comprising:
    a memory controller coupled to a non-volatile memory device (NVMD), wherein the memory controller is capable of,
        writing data into a page of the non-volatile memory device (NVMD) along a word line, wherein the word line is partially written with at least some data such that the page is a weak page;
        storing the write data associated with the weak page into a weak page buffer as a duplicate weak page; and
        serving a read request for data in the weak page from the duplicate weak page stored in the weak page buffer.

20. The non-volatile memory system of claim 19, wherein the memory controller is further capable of:
    determining that a sufficient number of page writes have occurred along the word line in the non-volatile memory device such that the weak page is a stabilized page such that the stabilized page can be substantially read without read errors; and
    serving a read request for data in the stabilized page from the non-volatile memory device.

21. The non-volatile memory system of claim 20, wherein the memory controller is further capable of:
    indicating the data of the duplicate weak page in the weak page buffer can be overwritten in response to the determining that a sufficient number of page writes have occurred along the word line.

22. The non-volatile memory system of claim 20, wherein the memory controller is further capable of:
    indicating the data of the duplicate weak page in the weak page buffer can be overwritten in response to the determining that a sufficient number of page writes have occurred along the word line and one or more next word lines in write order.

23. The non-volatile memory system of claim 19, wherein the memory controller is further capable of:
    characterizing the NVMD to identify one or more pages along each word line likely to be a weak page if the word line is partially written.

24. The non-volatile memory system of claim 23, wherein the characterizing of the NVMD to identify one or more weak pages likely to be a weak page comprises:
    reading a current page that is written to the non-volatile memory device;
    determining that a number of bit errors associated with the current page is above a predetermined error level; and
    assigning a weak page status to the current page.

25. The non-volatile memory system of claim 24, wherein the predetermined error level is between two and six bit errors per read from a write page, including at least one of:
    six bit errors per read from an upper even write page;
    four bit errors per read from an upper odd write page;
    two bit errors per read from a lower even write page; or
    two bit errors per read from a lower odd write page.

* * * * *